(12) United States Patent
Subrahmanyam et al.

(10) Patent No.: US 11,917,790 B2
(45) Date of Patent: Feb. 27, 2024

(54) THERMAL CONTROL FOR PROCESSOR-BASED DEVICES

(71) Applicant: Intel Corporation, Santa Clara, CA (US)

(72) Inventors: Prabhakar Subrahmanyam, San Jose, CA (US); Casey Winkel, Hillsboro, OR (US); Yingqiong Bu, Shanghai (CN); Ming Zhang, Shanghai (CN); Yuehong Fan, Shanghai (CN); Yi Xia, Campbell, CA (US); Ying-Feng Pang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 299 days.

(21) Appl. No.: 16/859,202

(22) Filed: Apr. 27, 2020

(65) Prior Publication Data
US 2020/0260613 A1    Aug. 13, 2020
US 2021/0289659 A2    Sep. 16, 2021

Related U.S. Application Data

(60) Provisional application No. 62/914,325, filed on Oct. 11, 2019, provisional application No. 62/839,515, filed on Apr. 26, 2019.

(51) Int. Cl.
    *H05K 7/20*          (2006.01)
(52) U.S. Cl.
    CPC ......... *H05K 7/20154* (2013.01); *H05K 7/209* (2013.01); *H05K 7/20209* (2013.01); *H05K 7/20927* (2013.01)

(58) Field of Classification Search
    CPC .............. H01L 23/473; H01L 23/4006; H01L 23/4093; H01L 23/36; H01L 23/3677;
    (Continued)

(56) References Cited

U.S. PATENT DOCUMENTS 5,978,223 A  * 11/1999  Hamilton ............ H01L 23/4093
                                                           174/16.3
7,474,532 B1 *  1/2009  Desrosiers .......... H01L 23/4006
                                                           165/185

(Continued)

FOREIGN PATENT DOCUMENTS

GB          2576032          4/2021
GB          2576030         12/2021
(Continued)

*Primary Examiner* — Adam B Dravininkas
(74) *Attorney, Agent, or Firm* — HANLEY, FLIGHT & ZIMMERMAN, LLC

(57) ABSTRACT

The present disclosure is directed to systems and methods of improving the thermal performance of processor-based devices. Such thermal performance improvement may include limiting the degree of tilt experienced by a semiconductor device as a thermal solution coupled to the semiconductor device is tightened to the substrate. Such thermal performance improvements may include increasing the available heat transfer area associated with a particular heat producing semiconductor device. Such thermal performance improvements may include thermally coupling one or more cool blocks thermally coupled to one or more remote heat-producing devices to a central cool block that may be cooled using a cooling medium or coupled to a central heat-producing semiconductor device.

22 Claims, 27 Drawing Sheets

(58) Field of Classification Search
CPC ............ H01L 23/3675; H01L 23/3672; H01L 23/367; H05K 7/20154; H05K 7/20209; H05K 7/209; H05K 7/20927; H05K 7/2049; H05K 7/20445
See application file for complete search history.

(56) References Cited

U.S. PATENT DOCUMENTS

| | | | |
|---|---|---|---|
| 10,616,993 B1* | 4/2020 | Gawlowski | H05K 1/0203 |
| 2004/0041255 A1* | 3/2004 | Lindgren | H01L 23/367 |
| | | | 257/E23.102 |
| 2004/0212963 A1* | 10/2004 | Unrein | H01L 23/4006 |
| | | | 257/E23.084 |
| 2005/0207115 A1* | 9/2005 | Barsun | G06F 1/20 |
| | | | 257/E23.102 |
| 2005/0241808 A1* | 11/2005 | Lee | F28D 15/0275 |
| | | | 165/104.33 |
| 2006/0086481 A1* | 4/2006 | Curtis | H05K 7/20418 |
| | | | 165/80.3 |
| 2007/0091578 A1* | 4/2007 | Chang | H01L 23/3677 |
| | | | 257/E23.105 |
| 2007/0127162 A1* | 6/2007 | Nishiyama | G11B 5/3912 |
| 2007/0217162 A1* | 9/2007 | Zhou | H01L 23/4006 |
| | | | 257/E23.084 |
| 2009/0034198 A1* | 2/2009 | Colbert | H01L 23/4006 |
| | | | 361/704 |
| 2012/0092826 A1* | 4/2012 | Heidepriem | H01L 23/4006 |
| | | | 361/679.54 |
| 2014/0368992 A1* | 12/2014 | Strader | H01L 23/42 |
| | | | 156/60 |
| 2016/0242312 A1* | 8/2016 | Singh | H05K 1/181 |
| 2018/0331015 A1* | 11/2018 | Heymann | H01L 23/433 |
| 2019/0150319 A1* | 5/2019 | Leigh | H01L 23/467 |
| | | | 361/690 |
| 2019/0170457 A1* | 6/2019 | Zhai | H05K 7/20809 |
| 2021/0320050 A1 | 10/2021 | Robinson et al. | |

FOREIGN PATENT DOCUMENTS

| | | |
|---|---|---|
| GB | 2597525 | 2/2022 |
| GB | 2601357 | 6/2022 |

* cited by examiner

THERMAL CONTROL FOR PROCESSOR-BASED DEVICES

BACKGROUND

There is market pressure for processor-based device manufacturers to reduce the size of portable devices while at the same time improving system performance and responsiveness. Such system performance and responsiveness may be improved through the use of single- or multi-core microprocessors having extremely high component density. Such microprocessors, however, produce considerable thermal output that, when combined with a small form factor electronic device, lead to heating that can compromise the performance and/or life expectancy of the processor-based device.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
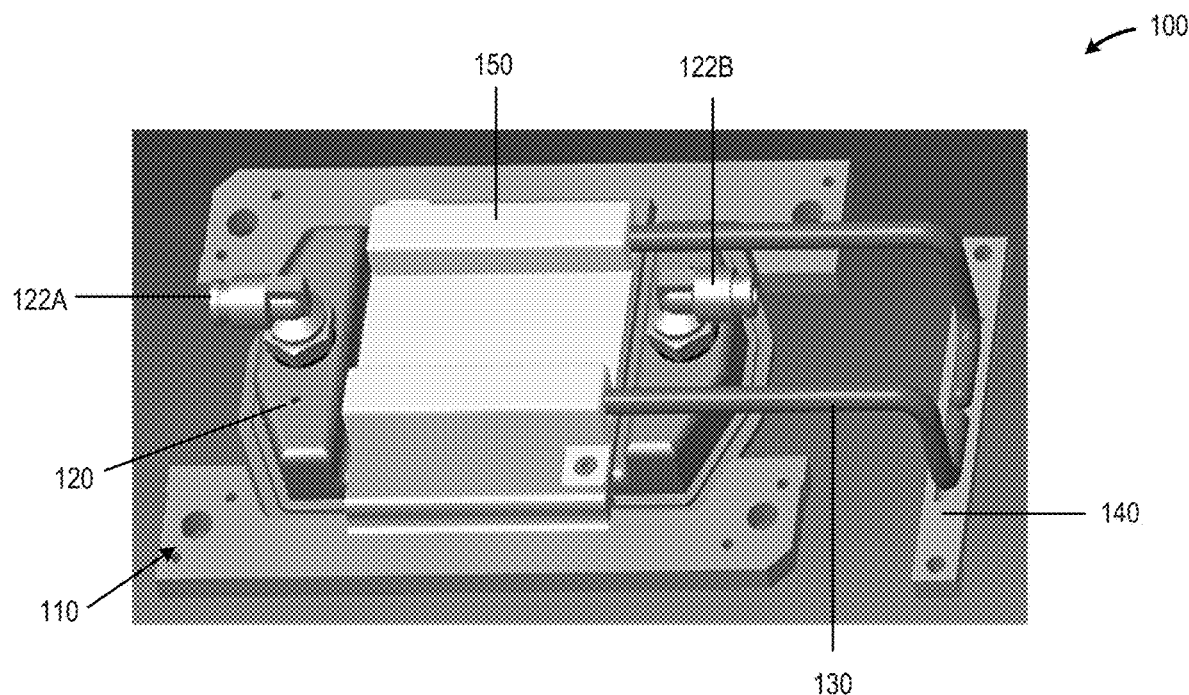
FIG. 1A is a perspective view of an illustrative system that depicts a thermal solution including cold plate bracket coupled to a cold plate and a voltage regulator (VR) thermal solution that includes thermal channels fluidly coupling a VR cooler block to a VR cooler retention block thermally coupled to the cold plate, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein improve the thermal performance of heat-producing devices disposed within processor-based devices, such as data servers. Such thermal performance improvements may include increasing the thermal performance of a system by adding a heat transfer area. Such thermal performance improvements may include providing dedicated thermal solutions for voltage regulation circuitry used by processor-based devices. Such thermal performance improvements may include improving the flow of cooling media around components in a direct-contact or immersed cooling environment.

An electronic device cooling system is provided. The cooling system may include: a cold plate thermally and physically couplable to a first heat-producing semiconductor device; a thermal retention block member thermally and physically couplable to the cold plate; a remote device cooler block thermally and physically couplable to a second heat-producing device, the second heat-producing device disposed remote from the first heat-producing semiconductor device; and one or more thermal channels, each of the one or more thermal channels having a first end and a second end, the first end of each of the one or more thermal channels thermally coupled to the remote device cooler block and the second end of each of the one or more thermal channels thermally coupled to the thermal retention block member.

A semiconductor device carrier apparatus is provided. The apparatus may include: a frame member having an upper surface couplable to a thermal solution and a lower surface couplable to a heat-producing semiconductor device; where the frame member includes a plurality of apertures, each of the plurality of apertures to accommodate the passage of at least one fastener to couple the frame member to a substrate that includes the heat-producing semiconductor device; a plurality of short stopper members disposed on the lower surface of the frame member and about the periphery of the frame member; where each of the plurality of short stopper members includes a first material having a first durometer value; and a plurality of long stopper members disposed on the lower surface of the frame member and about the periphery of the frame member; wherein each of the plurality of long stopper members includes a second material having a second durometer value, the second durometer value less than the first durometer value.

A thermal solution spring cell is provided. The spring cell may include: a fastener head; a fastener body coupled to the fastener head that includes: an upper portion coupled to the fastener head, the upper portion including a cylindrical member having a first diameter; a lower portion coupled to the upper portion, the lower portion including: a cylindrical portion having a second diameter greater than the first diameter, to form a shoulder between the upper portion and the lower portion; and a groove to receive a clip member, the groove formed at least partially about the periphery of the lower cylindrical portion, the groove disposed proximate an end of the lower portion of the fastener body distal from the upper portion of the fastener body; a compressible element disposed proximate at least a portion of the upper portion of the fastener body; and a retaining ring to at least partially compress the compressible element about the upper portion of the fastener body and physically engage the shoulder between the upper portion of the fastener body and the lower portion of the fastener body.

A central processing unit (CPU) backplate apparatus is provided. The apparatus may include: a backplate to couple to a first surface of a printed circuit board opposite a CPU disposed on a second surface of the printed circuit board, the first surface transversely opposed across a thickness of the printed circuit board from the second surface; an extended heat transfer surface physically and thermally coupled to a first surface of the backplate, the first surface of the backplate transversely opposed across a thickness of the backplate from a second surface of the backplate, the second surface of the backplate proximate the first surface of the printed circuit board.

A semiconductor device extended surface heat transfer apparatus is provided. The heat transfer apparatus may include: a first extended surface heat transfer device that includes a baseplate having an upper surface and a lower surface and a plurality of fins physically and thermally coupled to the upper surface of the baseplate, the first extended surface heat transfer device having a first longitudinal axis; a thermally conductive rotatable mount having a first end and a second end, wherein the first end of the thermally conductive rotatable mount attaches to the upper surface of the baseplate of the first extended surface heat transfer device; and a second extended surface heat transfer device that includes a baseplate having an upper surface and a lower surface and a plurality of fins physically and thermally coupled to the upper surface of the baseplate, the second extended surface heat transfer device having a second longitudinal axis; wherein the second end of the thermally conductive rotatable mount attaches to the lower surface of the baseplate of the second extended surface heat transfer device; and wherein the thermally conductive rotatable mount permits the second longitudinal axis of the second extended surface heat transfer device to rotate through an angle of at least 90 degrees with respect to the first longitudinal axis of the first extended surface heat transfer device.

A thermal transfer system is provided. The thermal transfer system may include: a distribution block including at least one cooling medium inlet to receive a cooling medium and at least one cooling medium outlet; a cold block physically and thermally couplable to a first heat-producing, board-mounted device, the cold block including at least one cooling medium inlet fluidly coupled to the at least one cooling medium outlet of the distribution block to receive the cooling medium from the distribution block; at least one remote cold block physically and thermally couplable to at least one heat producing board mounted device; and at least one thermal conduit having a first end and a second end, the first end thermally couplable to the distribution block and the second end thermally couplable to the remote cold block.

A two-part, detachable heat sink system is provided. The system may include: a first extended surface heat transfer device having a first heat transfer area, an upper surface, and a lower surface, the lower surface disposed proximate a heat-producing device coupled to a substrate; a thermal interface member thermally coupled to the upper surface of the first extended surface heat transfer device; a second extended surface heat transfer device having a second heat transfer area, an upper surface, and a lower surface, the lower surface, the second extended surface heat transfer device disposed proximate and thermally coupled to the thermal interface member; and one or more fasteners to detachably attach the second extended surface heat transfer device to the thermal interface member and to the first extended surface heat transfer device A semiconductor die insertion system is provided. The system may include: a pedestal member having a thickness, an upper surface, and a lower surface; at least one pin array that includes a plurality of pin members extending from the lower surface of the pedestal member, the at least one pin array disposed across at least a portion of the lower surface of the pedestal member; wherein each of the plurality of pin members extend a first distance from the lower surface of the pedestal member; and a pusher member having a upper surface and a lower surface, the pusher member including at least one extension member that projects a second distance from the lower surface of the pusher member; wherein the second distance is greater than the sum of the pedestal member thickness and the first distance.

A thermal solution fastener is provided. The fastener may include: a fastener member having a head portion and a body portion; a fastener housing disposed about at least a portion of the body portion of the fastener member, the fastener slidably displaceable through an aperture formed in the fastener housing; and a rotatable member rotatably coupled to the fastener housing, the rotatable member including: an upper portion that in a first position is disposed proximate the head portion of the fastener member and in a second position is disposed remote from the head portion of the fastener member; and a lower portion that in the first position disengages from a surface feature coupled to an upper surface of a substrate and in the second position engages the surface feature coupled to the upper surface of the substrate.

A thermal solution is provided. The thermal solution may include: an enclosed chamber that includes: a thermally conductive lower surface to dispose proximate at least a portion of a surface of a heat-producing electronic component; at least one coolant inlet to receive a coolant flow; and at least one coolant outlet to discharge the received coolant flow; and a plurality of turbulence elements to cause a coolant flowing through the enclosed chamber to flow in a turbulent flow regime across at least a portion of the thermally conductive lower surface.

A thermal solution system is provided. The system may include: at least one sensor to measure a thermal output of at least one heat-producing electronic component; a variable flow output fluid mover to discharge a coolant; an enclosed chamber that includes: a thermally conductive lower surface to dispose proximate at least a portion of a surface of a heat-producing electronic component; at least one coolant inlet to receive a coolant flow; and at least one coolant outlet to discharge the received coolant flow; and a plurality of turbulence elements to cause a coolant flowing through the enclosed chamber to flow in a turbulent flow regime across at least a portion of the thermally conductive lower surface; and control circuitry communicatively coupled to the at least one sensor and the variable flow output fluid mover, the control circuitry to: adjust the coolant flow provided by the variable flow output fluid mover based on the thermal output of the at least one heat-producing electronic component.

A method for cooling a heat producing electronic device is provided. The method may include: receiving, from at least one sensor by control circuitry, data representative of a thermal output of at least one heat-producing electronic component; distributing via one or more nozzles a coolant flow through an enclosed chamber thermally coupled to the heat-producing electronic device; adjusting, by control circuitry, a coolant flow rate through the enclosed chamber; and causing the coolant flow through the enclosed chamber to flow in a turbulent flow regime.

A controller is provided. The controller may include: an input/output interface; and control circuitry to: receive, from at least one sensor, data representative of a thermal output of at least one heat-producing electronic component; receive, via the I/O interface, data representative of a future expected computational load on the at least one heat-producing electronic component; and adjust, using a variable output fluid mover, a turbulent coolant flow rate through an enclosed chamber thermally coupled to a heat-producing electronic device based at least in part the received data representative of a thermal output of at least one heat-producing electronic component and the received data representative of a future expected computational load on the at least one heat-producing electronic component.

Figure 1B:
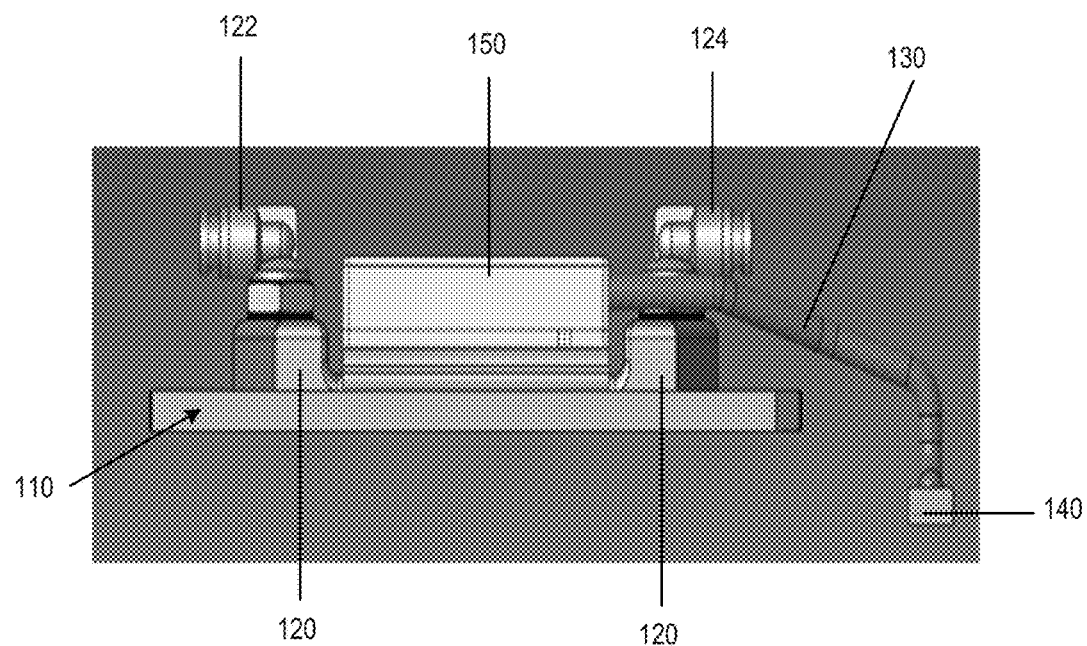
FIG. 1B is a side elevation of the illustrative system depicted in FIG. 1A, in accordance with at least one embodiment described herein.
Figure 1C:
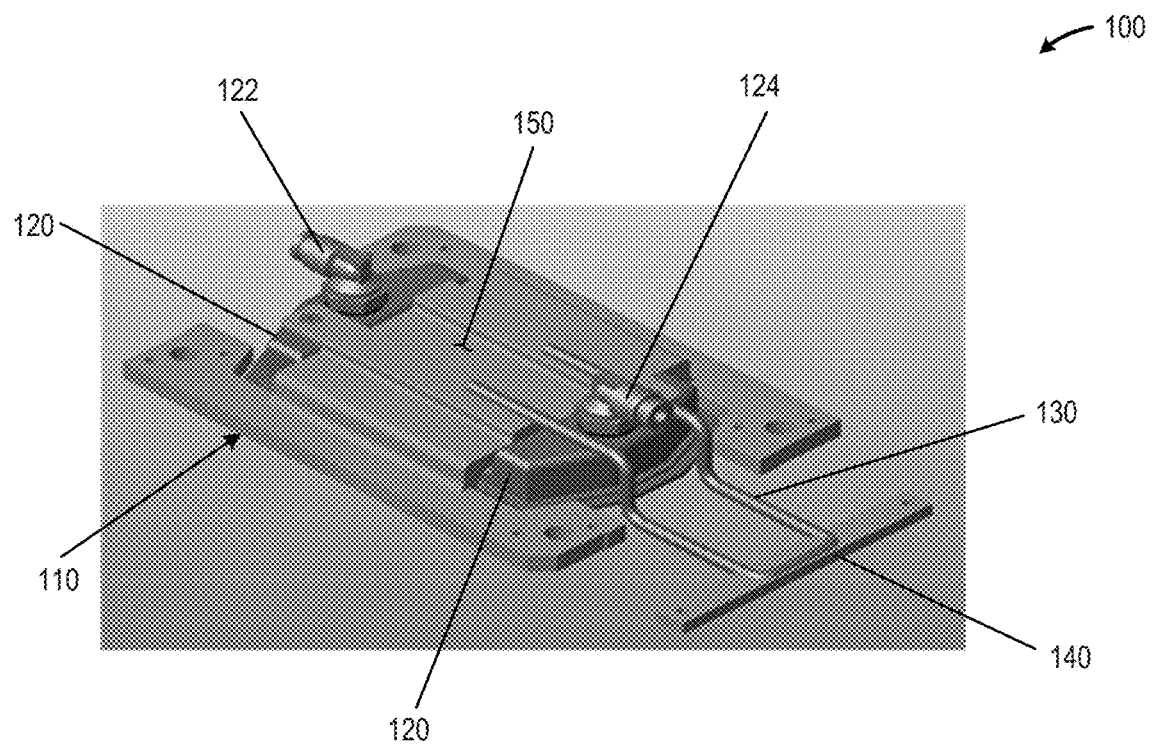
FIG. 1C is another perspective view of an example embodiment of the illustrative system depicted in FIG. 1A, in accordance with at least one embodiment described herein.
Figure 1D:
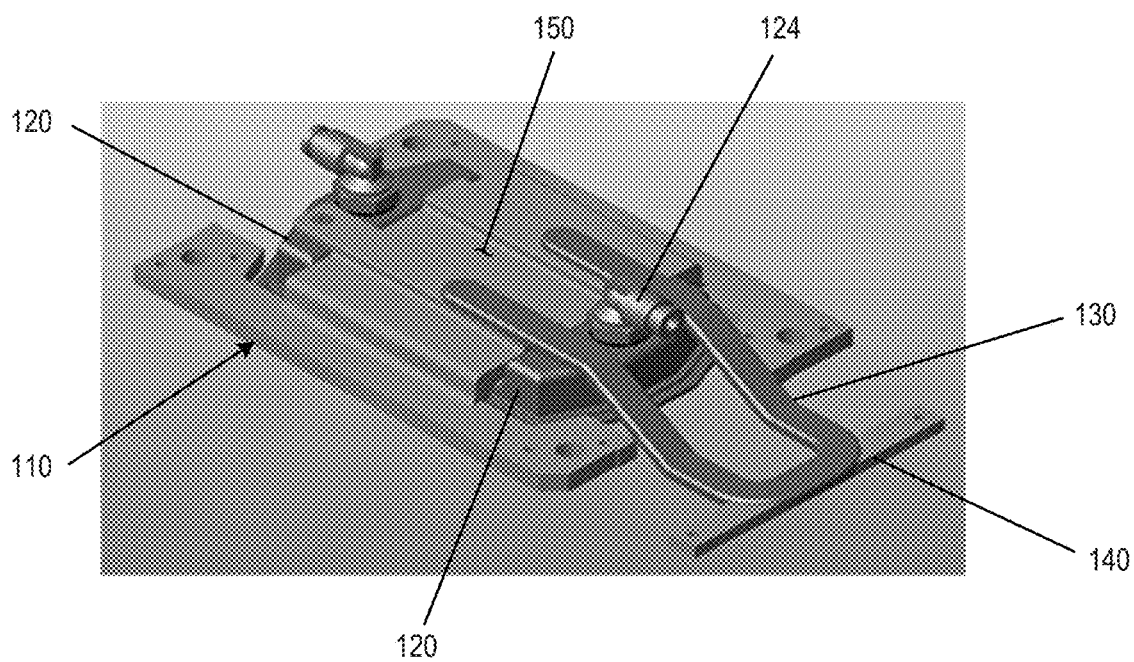
FIG. 1D is another perspective view of another example embodiment of the illustrative system 100 depicted in FIG. 1A, in accordance with at least one embodiment described herein.

FIG. 1A is a perspective view of an illustrative system 100 that depicts a thermal solution including cold plate bracket 110 coupled to a cold plate 120 and a voltage regulator (VR) thermal solution that includes thermal channels 130 fluidly coupling a VR cooler block 140 to a VR cooler retention block 150 thermally coupled to the cold plate 120, in accordance with at least one embodiment described herein. FIG. 1B is a side elevation of the illustrative system 100 depicted in FIG. 1A, in accordance with at least one embodiment described herein. FIG. 1C is another perspective view of an example embodiment of the illustrative system 100 depicted in FIG. 1A, in accordance with at least one embodiment described herein. FIG. 1D is another perspective view of another example embodiment of the illustrative system 100 depicted in FIG. 1A, in accordance with at least one embodiment described herein.

In embodiments, the cold plate 120 may be physically and/or thermally affixed to the cold plate bracket 110 to form a cold plate assembly. Similarly, the VR cooler block 140, VR retention block 150 and the thermal channels 130 form a VR cooling solution. The VR retention block 150 physically and/or thermally couples to the cold plate 120. Thus, as depicted in FIGS. 1A-1D, the cold plate 120 receives thermal energy from one or more components disposed proximate the cold plate 120 as well as thermal energy from one or more voltage regulators disposed remote from the cold plate 120. Beneficially, the VR cooler block 140 may be positioned in any location relative to the cold plate 120 simply by lengthening, shortening, or otherwise reconfiguring the thermal channels 130 that fluidly couple the VR cooler block 140 to the VR cooler retention block 150. In embodiments, the thermal channels 130 may include one or more heat pipes or similar thermally conductive structures. In embodiments, one or more thermal transfer or phase change fluids may flow between the VR cooler block 140 and the VR cooler retention block via the thermal channels 130.

In embodiments, the cold plate 120 may include a structure fabricated using any material having a high thermal conductivity—such as copper, stainless steel, aluminum, graphene, or combinations thereof. In embodiments, the cold plate may have a thermal conductivity of: about 50 BTU/hr-ft-° F. or greater; about 100 BTU/hr-ft-° F. or greater; about 150 BTU/hr-ft-° F. or greater; about 200 BTU/hr-ft-° F. or greater; about 250 BTU/hr-ft-° F. or greater; about 300 BTU/hr-ft-° F. or greater. In embodiments, the cold plate 120 may include one or more fluid connections 122A-122n, for example one or more fluid inlet connections 122A and one or more fluid outlet connections 122B. In embodiments, the cold plate 120 may include one or more structures or surface features to increase the thermal transfer area. In embodiments, the cold plate bracket 110 may be beneficially modified, adjusted, or altered to correspond to a wide variety of processor and/or system layouts. In embodiments, all or a portion of the VR retention block 150 may be integrally formed with the cold plate 120. In other embodiments, the VR retention block 150 may be formed separate from the cold plate 120 and thermally and/or physically coupled to the cold plate 120 during system assembly.

In embodiments, the thermal solution may include a copper cold plate 120 having an extended thermal transfer surface (e.g., fin area covering the die area) of all package types. The rigidity of the copper cold plate may be increased using a cold plate bracket 110 fabricated from a structurally stiffer material, such as stainless steel. A cooling media may be introduced to the copper cold plate 120 via one or more fluid inlets 122A and removed from the copper cold plate via one or more fluid outlets 122B. In embodiments, the one or more fluid connections 122A-122n may be directly brazed to the cold plate 120 or may be attached to the cold plate 120 using connectors with seal mechanisms such as NPT threads or O-rings.

The system 100 beneficially provides a modular solution that permits independent modification of the CPU cooling solution (via the cold plate 120) and the VR cooler block 140. As depicted in FIGS. 1A-1D, the system 100 includes a separate VR cooler block 140 in which the heat pipes are embedded in a thermally conductive material, such as an aluminum, stainless steel, or copper member, disposed proximate the power consuming components forming the voltage regulator circuitry. In embodiments, the VR cooler block 140 may be thermally coupled to the voltage regulators. For example, the VR cooler block 140 may be thermally coupled to the voltage regulators using a phase change thermal interface material or gap pad. The fluid channels 130 that thermally couple the VR cooler block 140 to the VR cooler retention block 150 may exit the upper surface of the VR cooler block 140.

The thermal channels 130 physically and thermally couple to corresponding apertures formed in the VR cooler retention block 150. For example, as depicted in FIGS. 1A-1D, the VR cooler retention block 150 may include two separate apertures to receive thermal channels 130. In embodiments, a thermally conductive material, such as a thermal grease, may be used to thermally couple the thermal channels 130 to the VR cooler retention block 150.

Figure 2A:
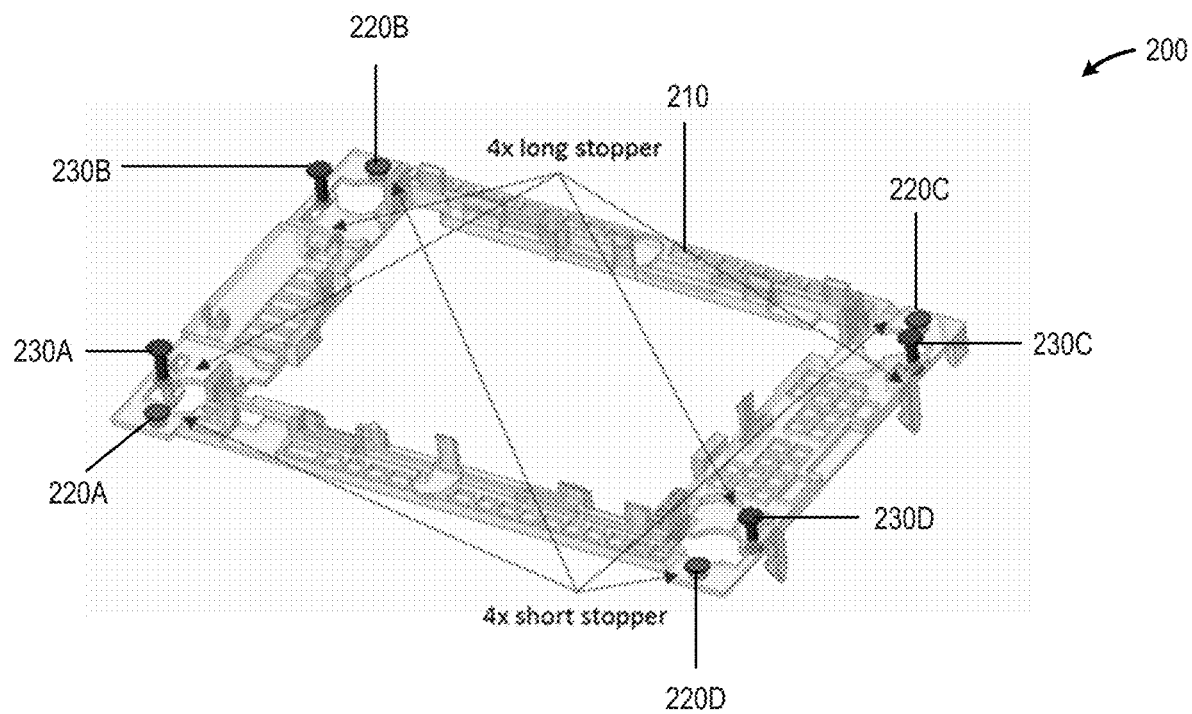
FIG. 2A is an illustrative CPU carrier that includes a frame member having a plurality of short stopper members and a plurality of long stopper members, in accordance with at least one embodiment described herein.
Figure 2B:
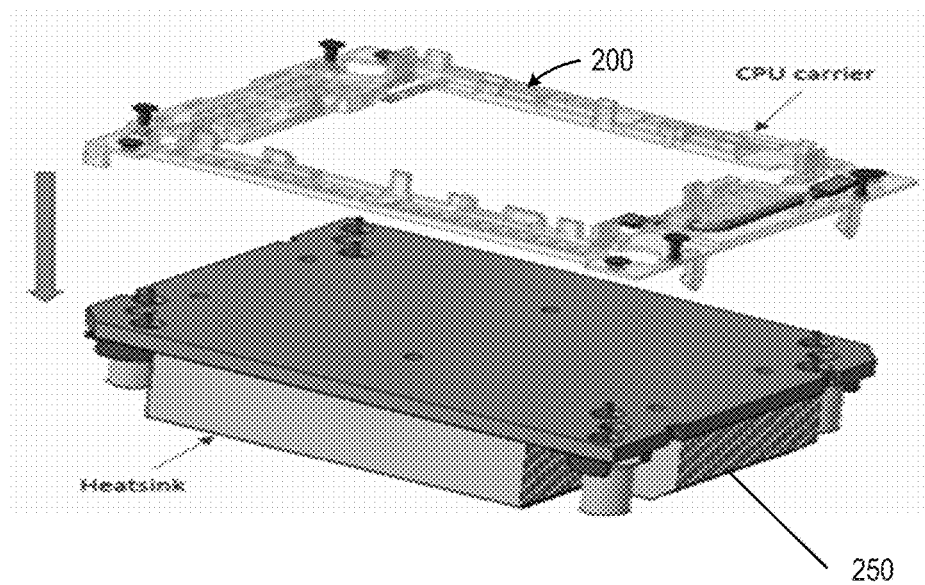
FIG. 2B is a perspective view of the CPU carrier from FIG. 2A being physically coupled to a heatsink, in accordance with at least one embodiment described herein.
Figure 2C:
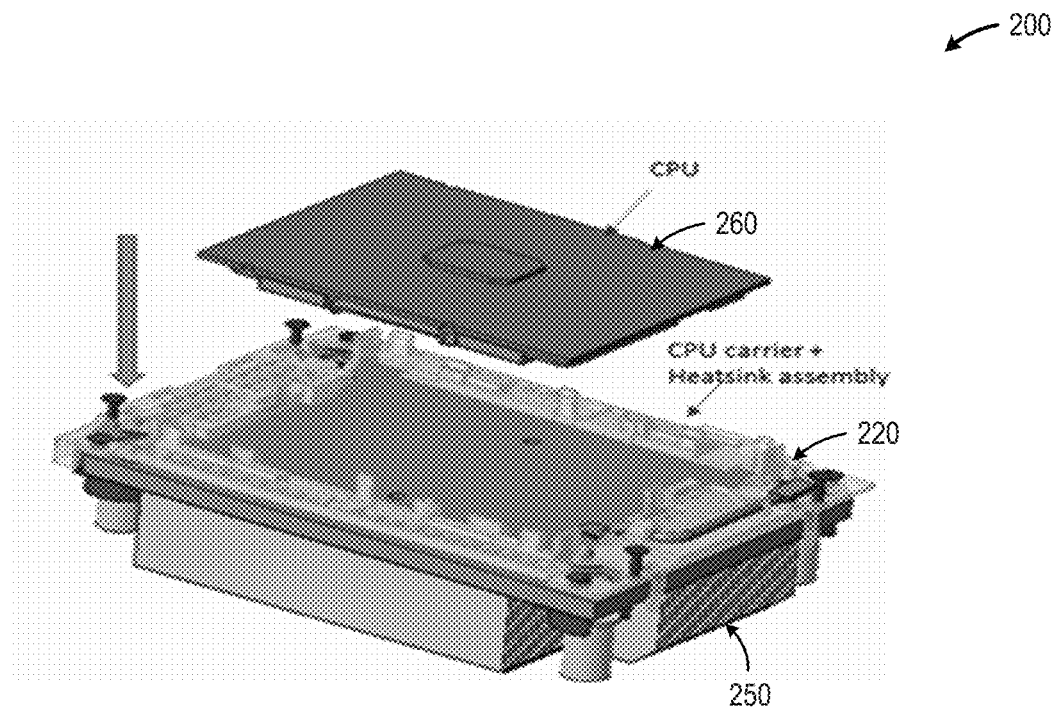
FIG. 2C is a perspective view of a central processing unit (CPU) being physically coupled to the assembled CPU carrier and heatsink depicted in FIG. 2B, in accordance with at least one embodiment described herein.
Figure 2D:
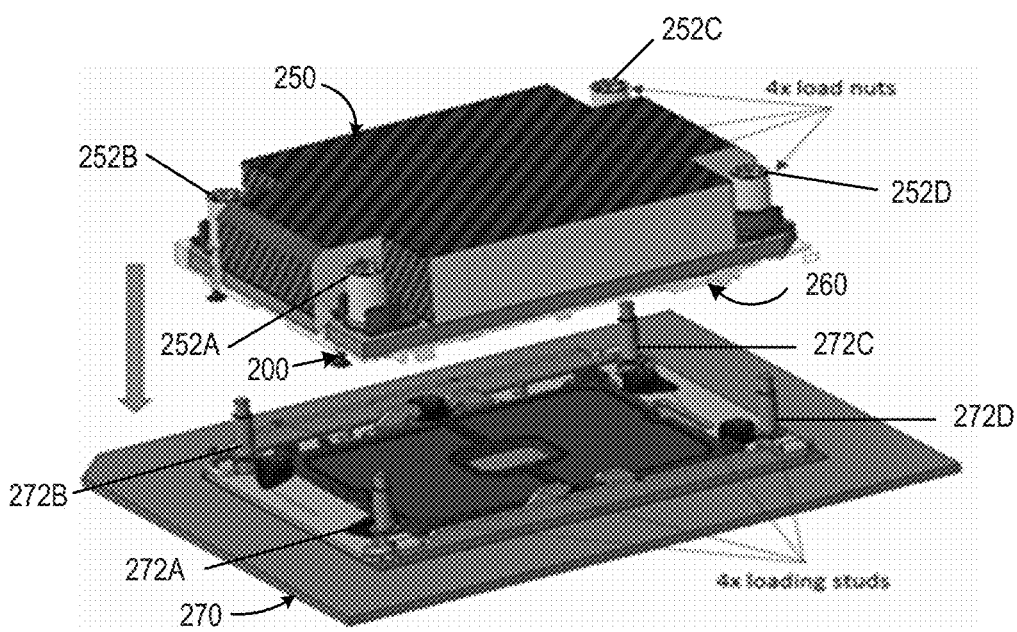
FIG. 2D is a perspective view of the assembled CPU, CPU carrier and heatsink being coupled to a board via a plurality of loading studs, in accordance with at least one embodiment described herein.
Figure 2E:
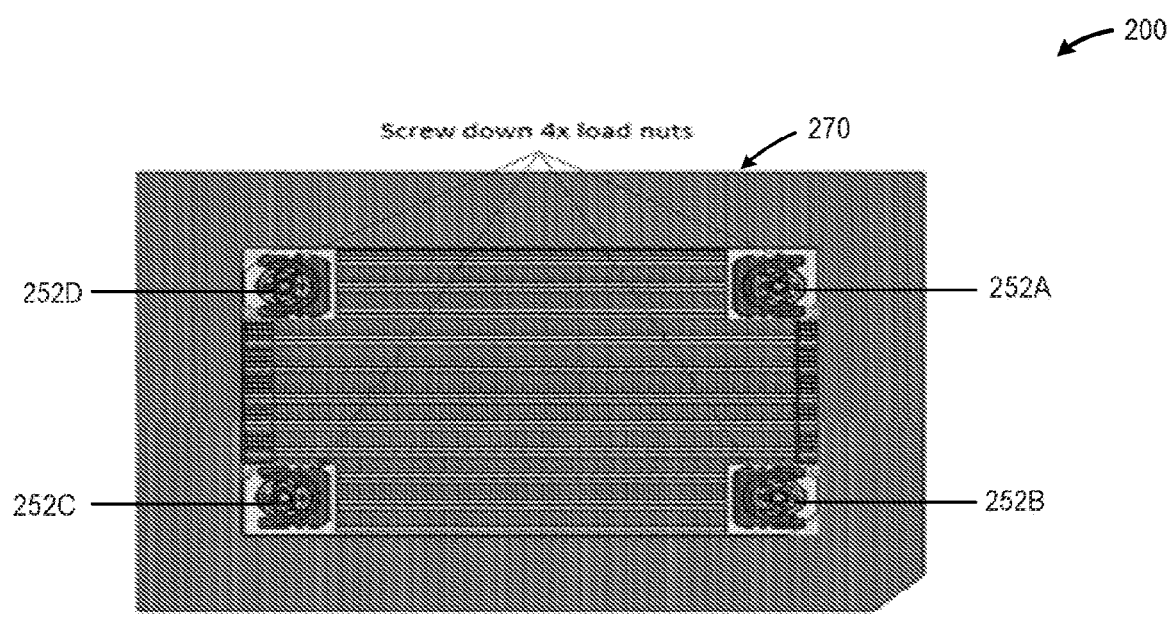
FIG. 2E is a plan view of the heat sink and CPU coupled to the board via the CPU carrier, in accordance with at least one embodiment described herein.

FIG. 2A is an illustrative CPU carrier 200 that includes a frame member 210 having a plurality of short stopper members 220A-210n (four shown, collectively "short stopper members 220") and a plurality of long stopper members 230A-220n (four shown, collectively, "long stopper members 230"), in accordance with at least one embodiment described herein. FIG. 2B is a perspective view of the CPU carrier 200 from FIG. 2A being physically coupled to a heatsink 250, in accordance with at least one embodiment described herein. FIG. 2C is a perspective view of a central processing unit (CPU) 260 being physically coupled to the assembled CPU carrier 200 and heatsink 250 depicted in FIG. 2B, in accordance with at least one embodiment described herein. FIG. 2D is a perspective view of the assembled CPU 260, CPU carrier 200 and heatsink 250 being coupled to a board 270 via a plurality of loading studs 272A-272n (four shown, collectively, "loading studs 272"), in accordance with at least one embodiment described herein. FIG. 2E is a plan view of the heat sink 250 and CPU 260 coupled to the board 270 via the CPU carrier 200, in accordance with at least one embodiment described herein.

The frame member 210 has an upper surface and a lower surface. The upper surface of the frame member 210 may be disposed proximate a thermal solution, such as an extended surface heat sink 250 and the lower surface of the frame member 210 may be disposed proximate a semiconductor package or similar heat-producing semiconductor device. In embodiments, a plurality of thermal solution attachment features 212A-212n may extend from the upper surface of the frame member 210. The thermal solution attachment features 212 permit the detachable attachment of the thermal solution 250 to the upper surface of the frame member 210.

Referring to FIGS. 2A-2D, the CPU carrier 200 beneficially provides a carrier for the CPU 260 that limits the tilt and load placed upon the CPU 260 when the heat sink 250/CPU 260/CPU carrier 200 assembly is inserted into a socket on a board 270. As depicted in FIG. 2A, for a four corner loading heat sink/loading mechanism, the degree of tilt experienced by the CPU 260 as the heat sink 250/CPU 260/CPU carrier 200 assembly is inserted into the socket may be controlled to minimize the likelihood of socket damage. The short stoppers 220 and the long stoppers 230 beneficially limit the amount of tilt experienced by the CPU 260 during insertion to effectively prevent socket damage. For example, when loading one corner of the heat sink 250/CPU 260/CPU carrier 200 assembly, the long stopper 230 may contact the board 270 and limit the amount of tilt experienced by the CPU 260. Referring to FIG. 2D, by limiting the amount of tilt experienced by the CPU 260, the assembler may beneficially attach each of a plurality of load nuts 252A-252n (four shown, collectively, "load nuts 252") to a respective one of a plurality of loading studs 272A-272n (four shown, collectively, "loading studs 272") in any sequence. In embodiments, the CPU carrier Adding the short stoppers 220 and the long stoppers 230 to the CPU carrier 200, eliminates the need for anti-tilt nut on heatsink 250. Elimination of the anti-tilt nut on the heatsink 250 beneficially permits the region of the heatsink occupied by the anti-tilt nut to receive additional extended surface area improving the performance and/or thermal efficiency of the heatsink 250. In embodiments, the short stoppers 220 and the long stoppers 230 may be fabricated from a compressible material, such as an elastomeric or polymeric material. In embodiments, the length of the short stoppers 220 may be about: 10% or less; 20% or less; 30% or less; 40% or less; 50% or less; 60% or less; 70% or less; 80% or less; or 90% or less of the length of the long stoppers 230. In embodiments, each of the long stoppers 230 may have a length of about: 0.5 millimeter (mm) or less; 1 mm or less; 2 mm or less; 3 mm or less; 4 mm or less; 5 mm or less; 7 mm or less; 9 mm or less; 12 mm or less; or 15 mm or less.

After installation of the heat sink 250/CPU 260/CPU carrier 200 assembly, the short stoppers 220 and the long stoppers 230 contact the board 270 and absorb any excess load that is above the load limit of the socket caused by tightening the load nuts 252. The short stoppers 220 and the long stoppers 230 provide a compressible members positioned parallel to the socket on the board 270 to absorb only the excess load created by tightening the load nuts 252 on the loading studs 272. Because of this inherent flexibility, the CPU carrier 200 is beneficially able to accommodate a wide range of CPU heights.

As depicted in FIG. 2B, the CPU carrier 200 is first physically coupled and/or bonded to the heatsink 250 using one or more fasteners, one or more chemical bonding agent or adhesives, or one or more thermal bonding agents or adhesives. In embodiments, the CPU carrier 200 may be detachably attached to the heatsink 250. In embodiments, the CPU carrier 200 may be permanently affixed or attached to the heatsink 250.

As depicted in FIG. 2C, the CPU 260 is physically coupled to the CPU carrier 200 on the side of the CPU carrier 200 opposite the heatsink 250. In embodiments, one or more thermally conductive materials may be disposed between the CPU 260 and the heatsink 250 to facilitate the transfer of thermal energy from the CPU 260 to the heatsink 250. In embodiments, the CPU 260 may be physically bonded to the CPU carrier 200 using one or more fasteners, one or more chemical bonding agent or adhesives, or one or more thermal bonding agents or adhesives. In embodiments, the CPU 260 may be detachably attached to the CPU carrier 200. In other embodiments, the CPU 260 may be may be permanently affixed or attached to the CPU carrier 200.

As depicted in FIG. 2D, the completed heat sink 250/CPU 260/CPU carrier 200 assembly may be affixed to a board 270 such that the CPU 260 is seated in a socket or similar attachment feature(s) disposed on a surface of the board 270. In embodiments, to secure the heat sink 250/CPU 260/CPU carrier 200 assembly, a plurality of load nuts 252 may be threadedly coupled to a corresponding plurality of loading studs 272 physically coupled to the board 270. The short stoppers 220 and the long stoppers 230 beneficially compress as the load nuts are tightened to absorb any excess load placed on the completed heat sink 250/CPU 260/CPU carrier 200 assembly and to minimize the likelihood of damage to the socket. The attachment of the completed heat sink 250/CPU 260/CPU carrier 200 assembly to the board 270 and socket is depicted in FIG. 2E. As depicted in FIG. 2E each of the plurality of load nuts 252 threadedly engages a corresponding one of the plurality of loading studs 272. Although other fixing mechanisms are also possible to affix the load nuts 252 to the load studs 272.

Figure 3B:
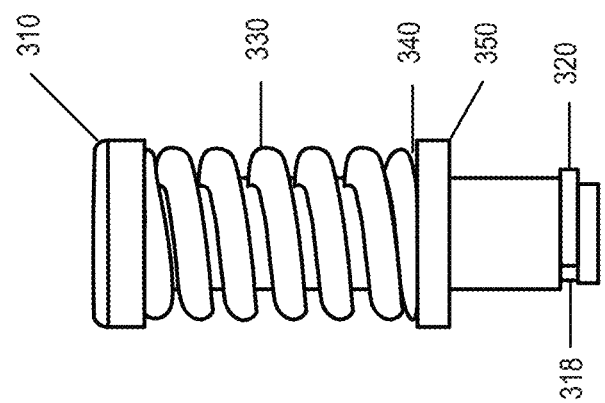
FIG. 3B is an elevation view of an illustrative assembled spring cell such as depicted in FIG. 3A, in accordance with at least one embodiment described herein.
Figure 3A:
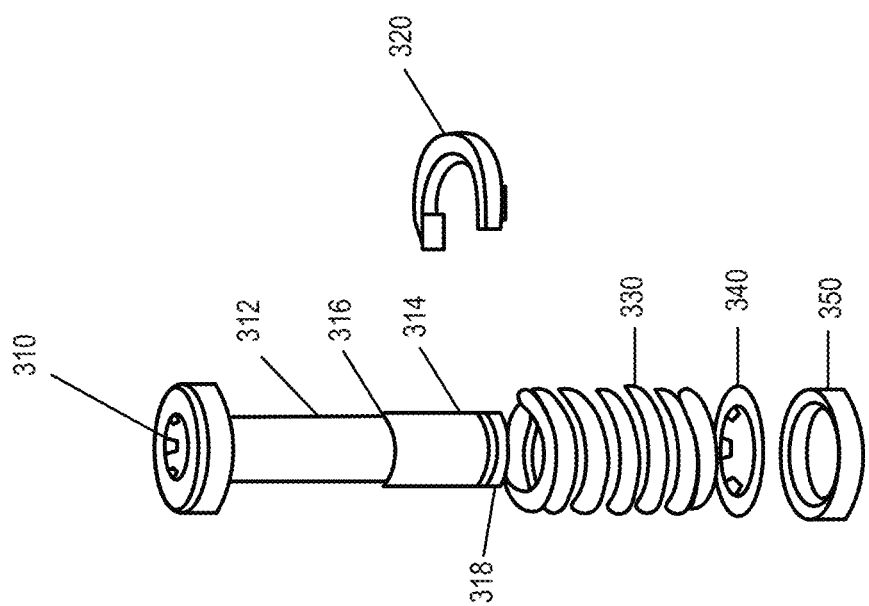
FIG. 3A is an exploded view of an illustrative spring cell, in accordance with at least one embodiment described herein.
Figure 3C:
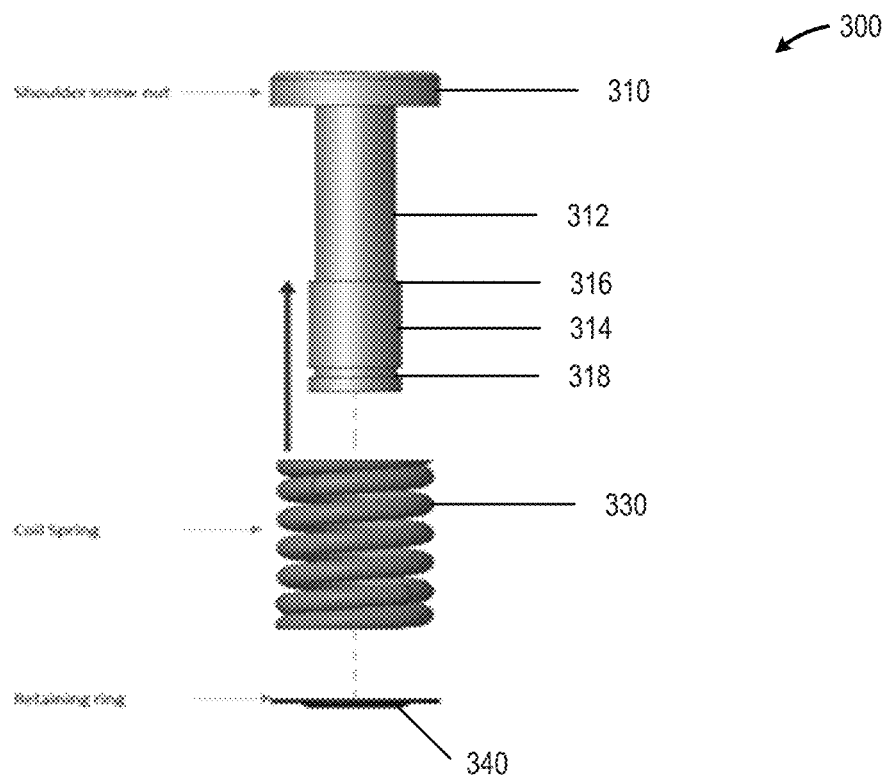
FIG. 3C is an elevation view depicting assembly of the illustrative spring cell, in accordance with at least one embodiment described herein.
Figure 3D:
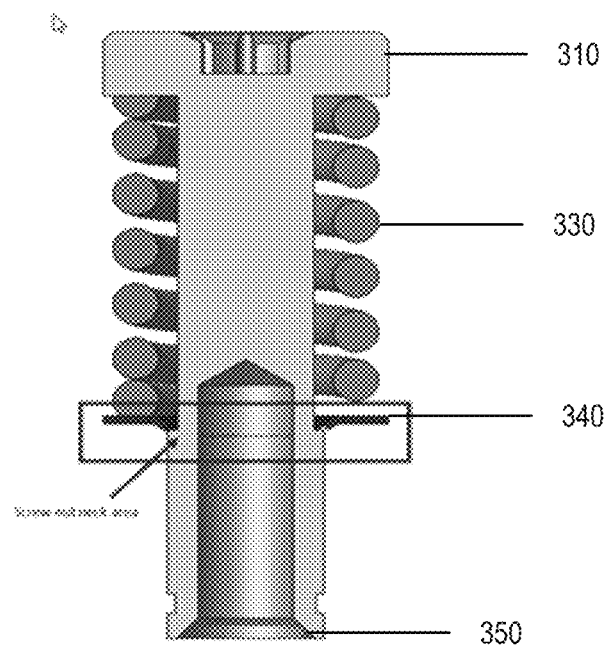
FIG. 3D is a cut-away elevation depicting the assembly of the illustrative spring cell depicted in FIG. 3A, in accordance with at least one embodiment described herein.
Figure 3E:
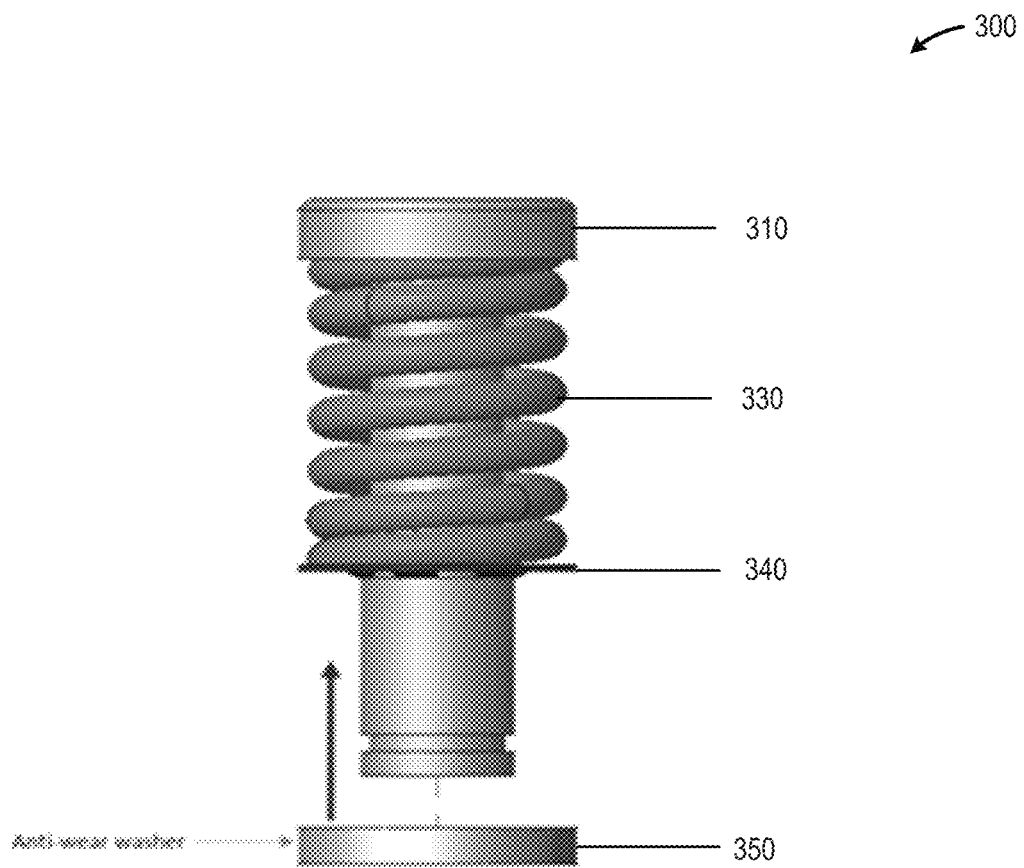
FIG. 3E is an elevation view depicting further assembly of the illustrative spring cell, in accordance with at least one embodiment described herein.
Figure 3F:
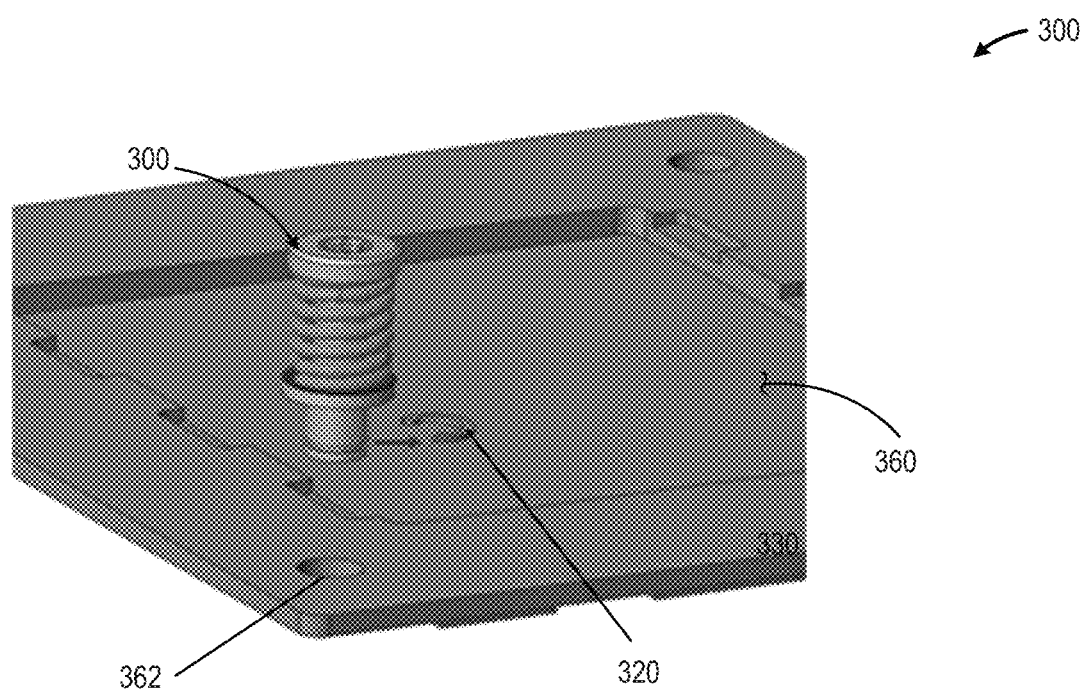
FIG. 3F is a perspective view of insertion of the illustrative spring cell into the base of a heat sink or similar thermal solution, in accordance with at least one embodiment described herein.
Figure 3G:
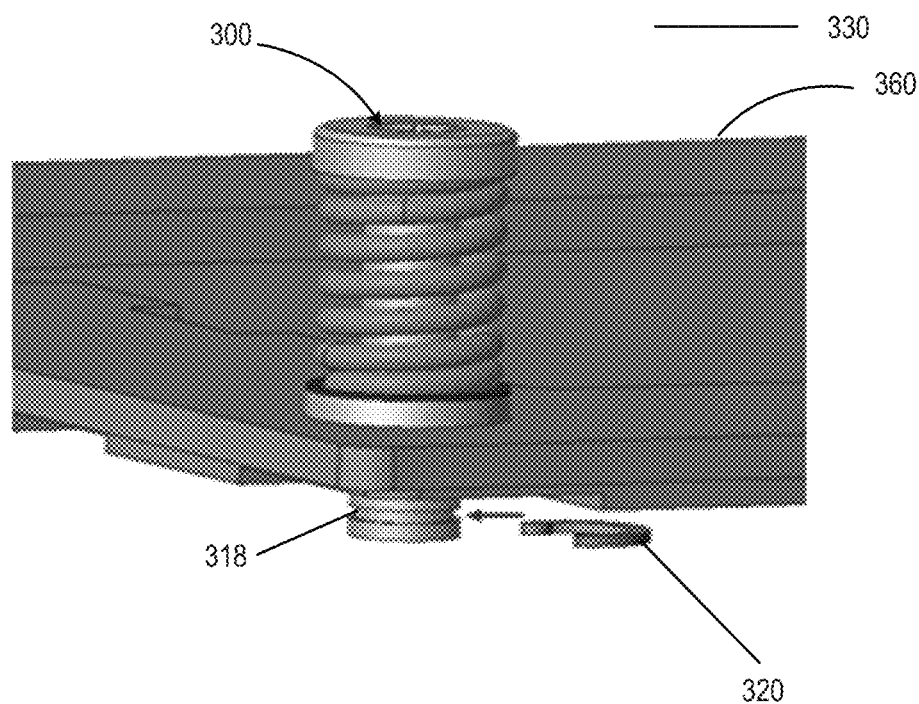
FIG. 3G is a perspective view of the final position of the illustrative spring cell within the base of a heat sink or similar thermal solution, in accordance with at least one embodiment described herein.

FIG. 3A is an exploded view of an illustrative spring cell 300, in accordance with at least one embodiment described herein. FIG. 3B is an elevation view of an illustrative assembled spring cell 300 such as depicted in FIG. 3A, in accordance with at least one embodiment described herein. FIG. 3C is an elevation view depicting assembly of the illustrative spring cell 300, in accordance with at least one embodiment described herein. FIG. 3D is a cut-away elevation view depicting the assembly of the illustrative spring cell 300 depicted in FIG. 3A, in accordance with at least one embodiment described herein. FIG. 3E is an elevation view depicting further assembly of the illustrative spring cell 300, in accordance with at least one embodiment described herein. FIG. 3F is a perspective view of insertion of the illustrative spring cell 300 into the base of a heat sink or similar thermal solution, in accordance with at least one embodiment described herein. FIG. 3G is a perspective view of the final position of the illustrative spring cell 300 within the base of a heat sink or similar thermal solution, in accordance with at least one embodiment described herein. The spring cell 300 depicted in FIGS. 3A-3F may be used to physically couple a thermal solution, such as a heat sink, to a printed circuit board, such as a CPU motherboard. The spring cell 300 maintains a defined pressure on the thermal solution, thereby improving the transfer of thermal energy from one or more components mounted on the printed circuit board to the ambient environment.

As depicted in FIG. 3A, the spring cell 300 includes a fastener body 310 having a relatively smaller diameter upper portion 312 and a relatively larger diameter lower portion 314, forming a shoulder, ridge or similar surface feature 316 therebetween. The fastener body 310 also includes a grooved portion 318 to receive an e-ring/C-clip 320 used to retain the spring cell 300 on the printed circuit board. The spring cell 300 also includes a compressible element 330, a retaining ring 340 to retain and compress the compressible element 330, and a spacer element 350. The retaining ring 340 may include one or more metallic (e.g., spring steel, stainless steel, aluminum), non-metallic (e.g., carbon fiber), or combinations of materials. The compressible element 330 may include a helical coil spring as depicted in FIG. 3A. The compressible element 330 may include any number, type, or composition capable of providing a tensile biasing force along the axis of the fastener body. Other types of compressible elements include but are not limited to: leaf springs, conical springs, barrel springs, hourglass springs, constant pitch springs, variable pitch springs, and similar. In embodiments, the helical coil spring may have a spring constant selected based, at least in part, on the desired pressure to apply to the thermal solution. In embodiments, the compressible element 330 may have a spring constant of: 0.01 Newtons per meter (N/m) or less; 0.1 N/m or less; 0.25 N/m or less; 0.5 N/m or less; 0.75 N/m or less; 1 N/m or less; 5 N/m or less; 10 N/m or less; 25 N/m or less; 50 N/m or less; 75 N/m or less; or 100 N/m or less.

FIG. 3B depicts an assembled spring cell 300. As depicted in FIG. 3B, the compressible element 330 is positioned proximate the relatively smaller diameter portion 312 of the fastener body 310. The retaining ring 340 slides over the relatively larger diameter portion 314 of the fastener body 310, compresses the compressible element 330 and "catches" on the shoulder 316, maintaining the compressible element 330 in a partially compressed state. The spacer element 350 slides over the relatively larger diameter portion 314 of the fastener body 310 and is disposed proximate the retaining ring 340. The e-ring/C-clip 320 is disposed in the groove 318 and retains the spring cell 300 on the printed circuit board. During assembly, the e-ring/C-clip 320 is removed and the spring cell 300 passed through aligned apertures in the thermal solution and the printed circuit board. Pressure is applied to the spring cell 300 to compress the compressible member 330 to apply the desired pressure to the thermal solution/printed circuit board assembly and the e-ring/C-clip 320 is slipped over the grove 318 to retain the spring cell 300 and maintain the pressure on thermal solution. In embodiments the relatively smaller diameter portion 312 of the fastener body 310 may have a diameter of: 10% or less; 20% or less; 30% or less; 40% or less; 50% or less; 60% or less; 70% or less; 80% or less; 90% or less; or 95% or less of the diameter of the relatively larger diameter portion 314 of the fastener body 310. In embodiments, the relatively larger diameter portion 314 of the fastener body 310 may have a diameter of about: 1 millimeter (mm) or less; 2 mm or less; 3 mm or less; 4 mm or less; 5 mm or less; 6 mm or less; 7 mm or less; 8 mm or less; 9 mm or less; 10 mm or less; 11 mm or less; or 12 mm or less. In embodiments, the fastener body 310 may have a length of about: 5 millimeters (mm) or less; 7.5 mm or less; 10 mm or less; 12.5 mm or less; 15 mm or less; 17.5 mm or less; 20 mm or less; 25 mm or less; or 50 mm or less.

FIG. 3C depicts the initial assembly step for an illustrative spring cell 300. As depicted in FIG. 3C, the compressible element 300 is slipped over the relatively larger diameter lower portion 314 of the fastener body 310 and is positioned proximate the relatively smaller diameter upper portion 312 of the fastener body 310. The retaining ring 340 passes over the relatively larger diameter lower portion 314 of the fastener body 310 and compresses the compressible element 330.

FIG. 3D depicts a subsequent assembly step for an illustrative spring cell 300. As depicted in FIG. 3D, the retaining ring 340 passes over the relatively larger diameter lower portion 314 of the fastener body 310 and catches on the shoulder 316 that separates the relatively smaller diameter upper portion 312 and the relatively larger diameter lower portion 314, maintaining the compressible element in a partially compressed state.

FIG. 3E depicts a subsequent assembly step for an illustrative spring cell 300. As depicted in FIG. 3E, the spacer element 350 slides over the relatively larger diameter lower portion 314 of the fastener body 310 and is disposed proximate the retaining ring 340.

FIG. 3F depicts the insertion of an illustrative spring cell 300 through a printed circuit board 360. As depicted in FIG. 3F, the relatively larger diameter lower portion 314 of the fastener body 310 passes through an aperture 362 in the printed circuit board 360.

FIG. 3G depicts the completed assembly of an illustrative spring cell 300 with a printed circuit board 360. As depicted in FIG. 3G, after passing the relatively larger diameter lower portion 314 of the fastener body 310 through the aperture 362 in the printed circuit board 360, the retaining ring 340 slips over the groove 318 in the fastener body 310.

Figure 4A:
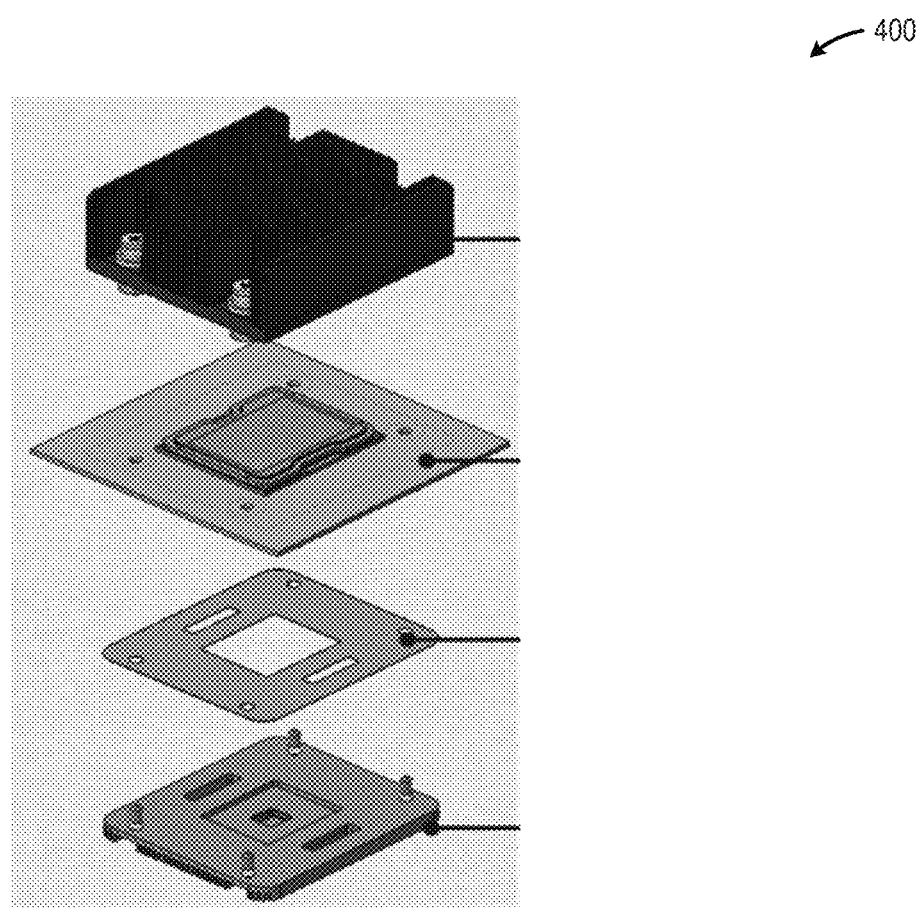
FIG. 4A is an exploded view of an illustrative system that includes a heatsink integrated backplate thermally coupled to all or a portion of a lower surface of a semiconductor package using a thermally conductive material and a thermal solution thermally coupled to all or a portion of an upper surface of the semiconductor package, in accordance with at least one embodiment described herein.
Figure 4B:
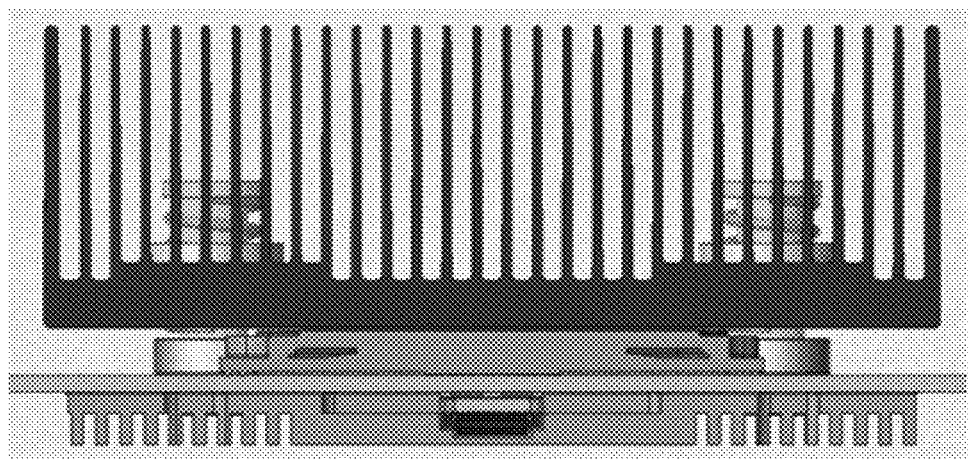
FIG. 4B is a side elevation of the illustrative system depicted in FIG. 4A in an assembled state in which the heatsink integrated backplate is thermally coupled to a voltage regulator module (VRM) disposed beneath the semiconductor package and the thermal solution is disposed proximate the upper surface of the semiconductor package, in accordance with at least one embodiment described herein.
Figure 4C:
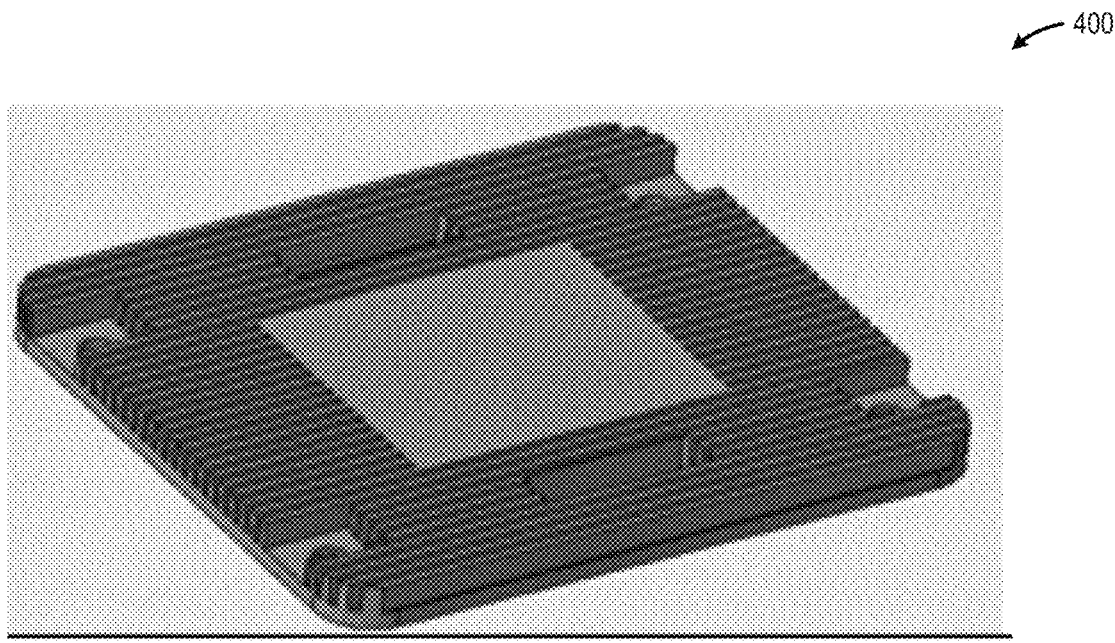
FIG. 4C is a perspective view of an illustrative heatsink integrated backplate, in accordance with at least one embodiment described herein.
Figure 4D:
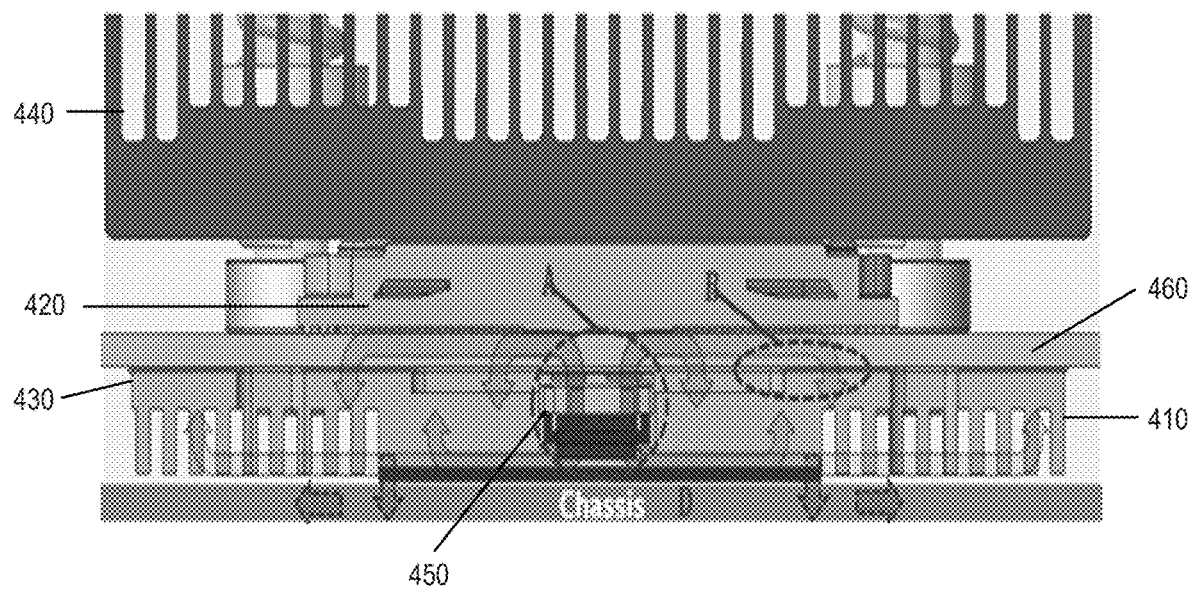
FIG. 4D is an enlarged cross-sectional elevation of the illustrative system depicted in FIGS. 4A and 4B, in accordance with at least one embodiment described herein.

FIG. 4A is an exploded view of an illustrative system 400 that includes a heatsink integrated backplate 410 thermally coupled to all or a portion of a lower surface of a semiconductor package 420 using a thermally conductive material 430 and a thermal solution 440 thermally coupled to all or a portion of an upper surface of the semiconductor package 420, in accordance with at least one embodiment described herein. FIG. 4B is a side elevation of the illustrative system 400 depicted in FIG. 4A in an assembled state in which the heatsink integrated backplate 410 is thermally coupled to a voltage regulator module (VRM) 450 disposed beneath the semiconductor package 420 and the thermal solution 440 is disposed proximate the upper surface of the semiconductor package 420, in accordance with at least one embodiment described herein. FIG. 4C is a perspective view of an illustrative heatsink integrated backplate 410, in accordance with at least one embodiment described herein. FIG. 4D is an enlarged cross-sectional elevation of the illustrative system 400 depicted in FIGS. 4A and 4B, in accordance with at least one embodiment described herein.

As depicted in FIGS. 4A, 4B, and 4D, the system 400 includes an upper thermal solution 440, such as an extended surface heatsink, thermally coupled to a semiconductor package 420, such as a central processing unit (CPU). The semiconductor package 420 is physically coupled to the upper surface of a substrate 460, such as a printed circuit board. A relatively high power consumption voltage regulator module (VRM) 460 provides power to the semiconductor package 420 and is physically coupled to the lower surface of the substrate 460 in a location that may be proximate the semiconductor package 420. The heatsink integrated backplate 410 is disposed proximate the lower surface of the substrate 460 and may be physically coupled to the lower surface of the substrate 460 using a thermally conductive material 430, such as a thermally conductive tape or adhesive material. The heatsink integrated backplate 410 beneficially performs at least two functions; first, securely mounting the semiconductor package 420, and second, transferring at least a portion of the thermal energy (i.g., heat) generated by the VRM 450 away from the semiconductor package 420.

FIG. 4A illustrates the basic assembly of the system 400. Note the substrate 460 does not appear in FIG. 4A. The system 400 includes a backplate 410 disposed proximate the lower surface of the substrate 460, proximate one or more voltage regulator modules 450. The backplate 410 may include an extended surface heatsink, such as a finned heatsink, sufficiently shallow to meet backside Keep-in-Zone requirements (i.e., the distance the heatsink extends from the back side of the substrate 460, such as <0.1 mm, <0.2 mm, <0.5 mm, <1 mm, <1.5 mm, <2 mm, or <5 mm). Although typical backplates may be fabricated using a relatively rigid material such as steel, in system 400 may include a heatsink integrated backplate 410 fabricated using a material such as copper, aluminum, or alloys thereof that provide sufficient rigidity to serve as a backplate and sufficient thermal conductivity to provide an effective thermal solution/heatsink. In embodiments, one or more thermal interface materials may be disposed between the VRM 450 and the heatsink integrated backplate 410 to isolate and/or protect the VRM 450 from damage caused by dynamic shock and/or vibration.

The semiconductor package 420 may include any type of system or device. In at least some embodiments, the semiconductor package 420 may include a central processing unit (CPU), graphics processing unit (GPU); vector processing unit; or tensor processing unit. The upper thermal solution 440 may include an extended surface heatsink. The upper thermal solution may be disposed proximate all or a portion of the upper surface of the semiconductor package 420.

In embodiments, a thermally conductive material 430 is disposed between at least a portion of the heatsink integrated backplate 410 and the lower surface of the substrate 460. The thermally conductive material 430 may include one or more dielectric materials having a relatively high thermal conductivity to thermally couple and electrically isolate the heatsink integrated backplate 410 from the substrate. In at least some embodiments, the thermally conductive material may include a material such as 3M 8805 thermally conductive adhesive tape manufactured by 3M Corporation (Maplewood, MN).

FIGS. 4B and 4D are cross-sectional elevations of an illustrative system 400 that includes a heatsink integrated backplate 410. As depicted in FIGS. 4B and 4D, in embodiments a thermal interface material may be disposed between the heatsink integrated backplate 410 and the VRM 450 to isolate the VRM 450 from shock and/or vibration. In at least some embodiments, a two-part thermal interface material may be disposed between the VRM 450 and the heatsink integrated backplate 410. An example two-part thermal interface material is Bergquist 3500S35 manufactured by Henkel Corporation (Dusseldorf, Germany), or any similar, thermally conductive, shock absorbing material may be used.

FIG. 4C is an illustrative heatsink integrated backplate 410 that includes an extended surface heatsink portion. In embodiments, the heatsink integrated backplate 410 may include one or more materials having a thermal conductivity of at least 200 Watts/meter-Kelvin (W/m-K). Example materials include but are not limited to copper, copper containing alloys, aluminum, and aluminum containing alloys. In embodiments, where the heatsink integrated backplate 410 includes an extended surface heatsink, the extended surfaces may project a distance beneath the substrate 460. In such embodiments, the extended surfaces may project a distance less than backside Keep-in-Zone requirements between the substrate and the device chassis as depicted in FIG. 4D.

Figure 5A:
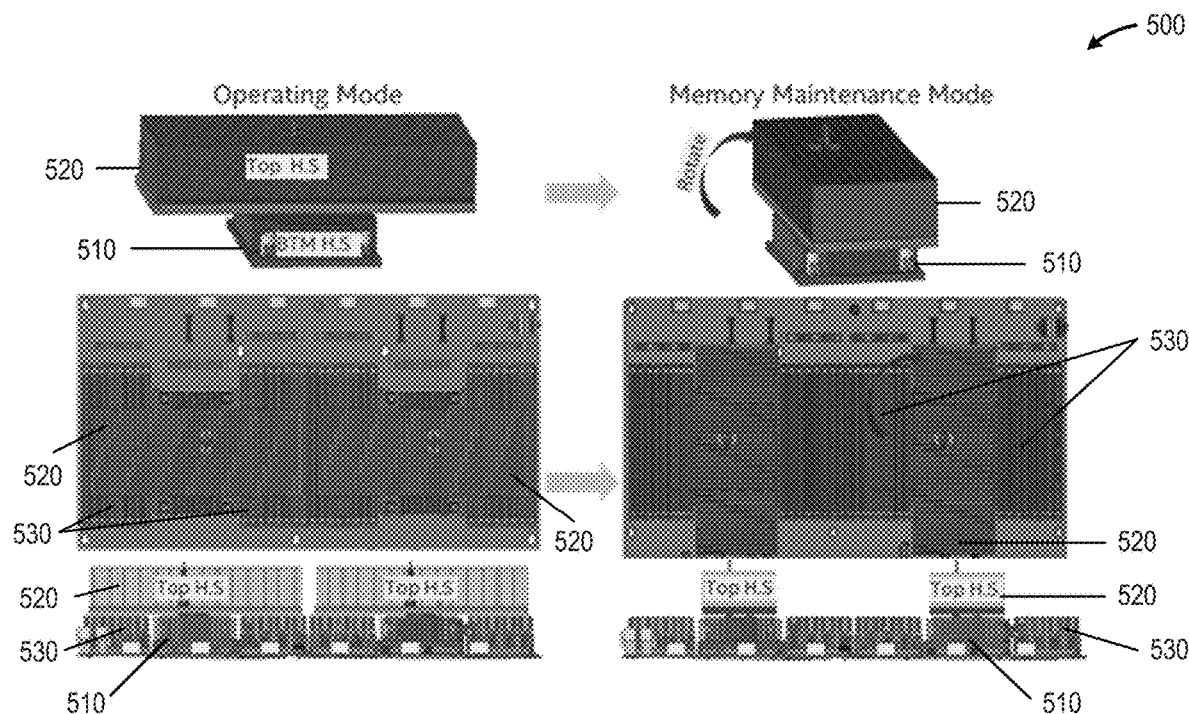
FIG. 5A includes perspective, plan, and elevation views of an illustrative two part, rotatable heat sink system that includes a relatively small, lower, fixed position, heat sink and a relatively large, upper, heat sink that is rotatable with respect to the lower heat sink, in accordance with at least one embodiment described herein.
Figure 5B:
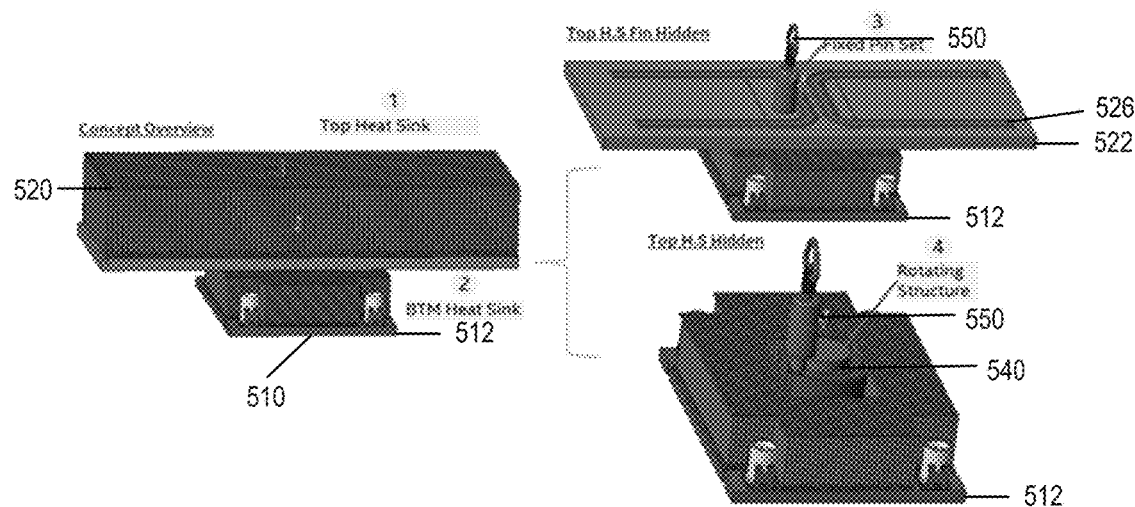
FIG. 5B is a perspective view of the illustrative two-part, rotatable heat sink system, including a rotatable mount and locking mechanism, in accordance with at least one embodiment described herein.
Figure 5C:
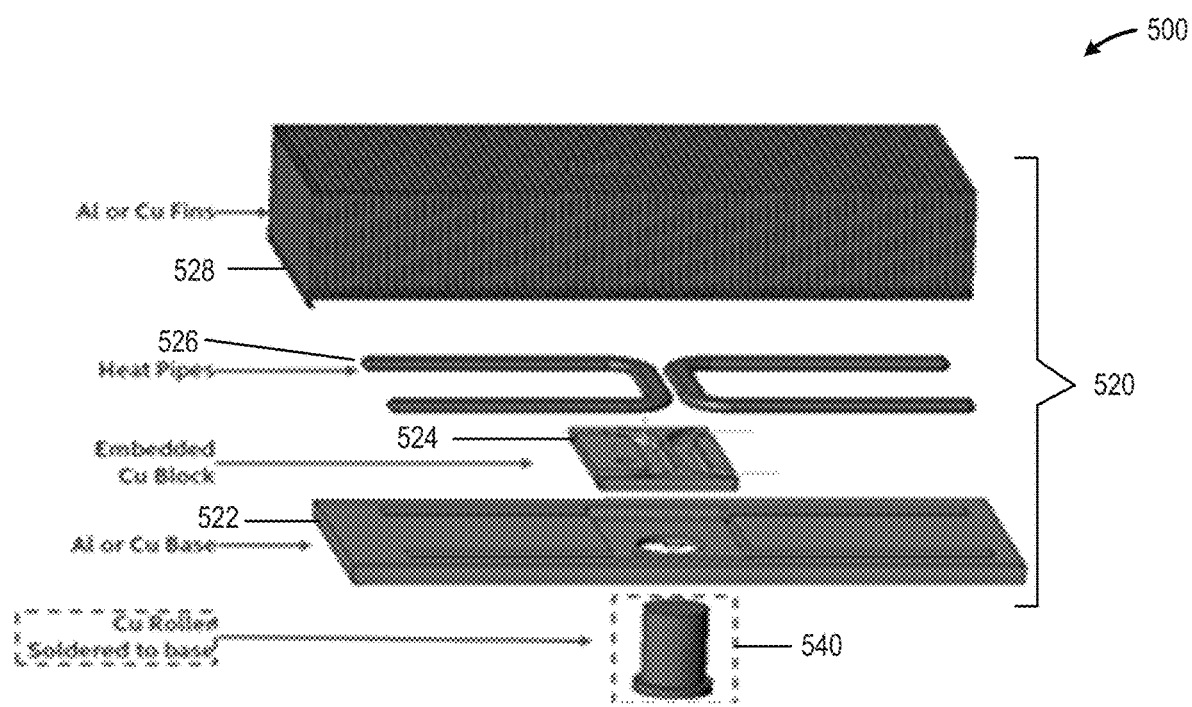
FIG. 5C is an exploded view of an illustrative upper heat sink, in accordance with at least one embodiment described herein.
Figure 5D:
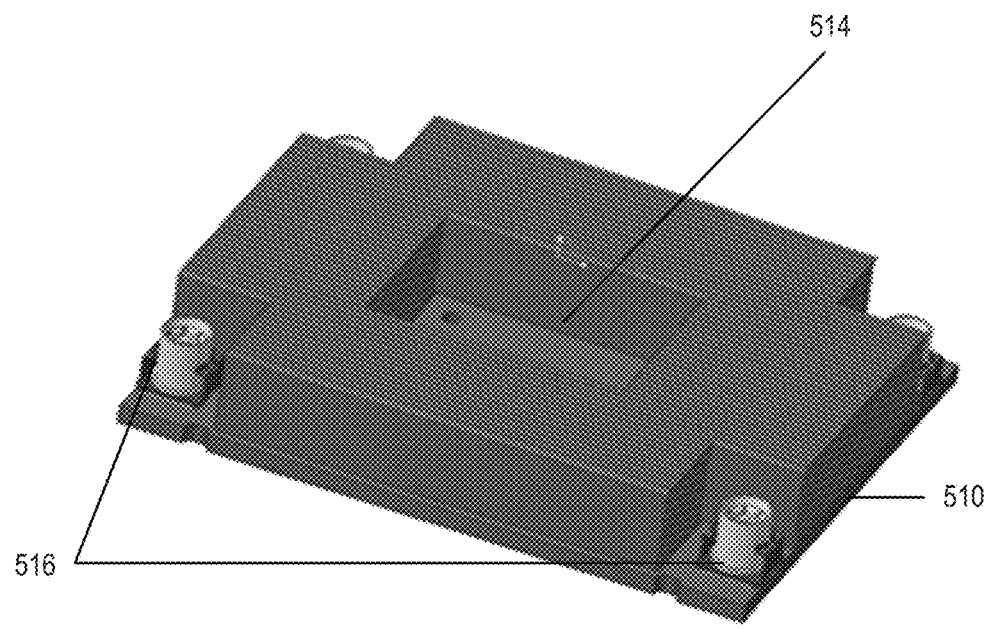
FIG. 5D is a perspective view of an illustrative lower heat sink, in accordance with at least one embodiment described herein.
Figure 5E:
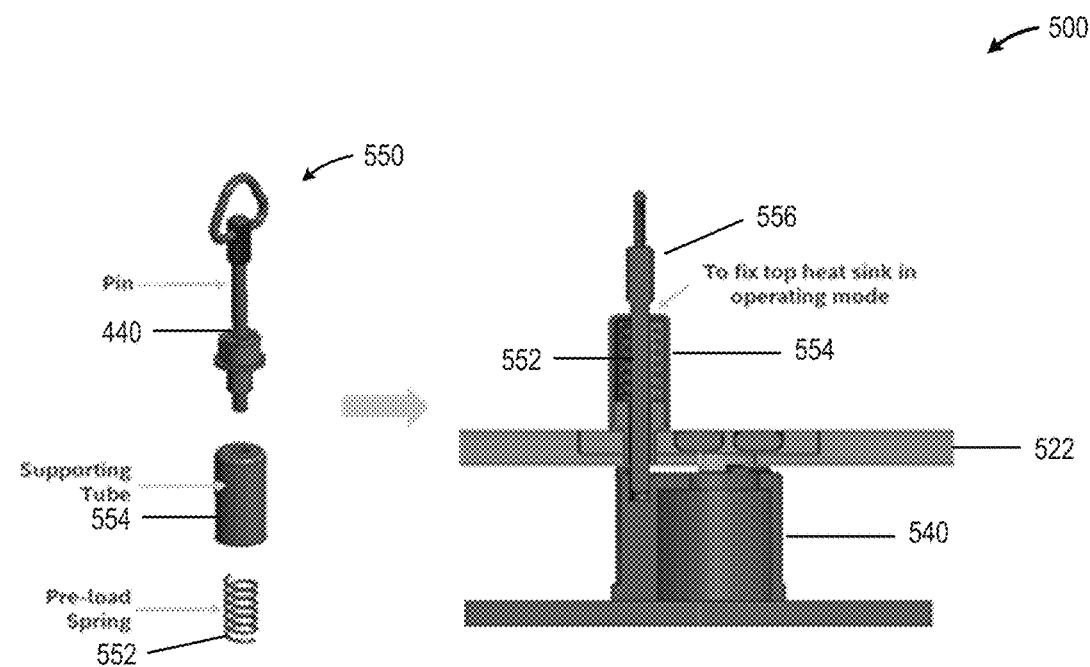
FIG. 5E includes an exploded view and a cross-sectional view of an illustrative fixed pin set, in accordance with at least one embodiment described herein.
Figure 5F:
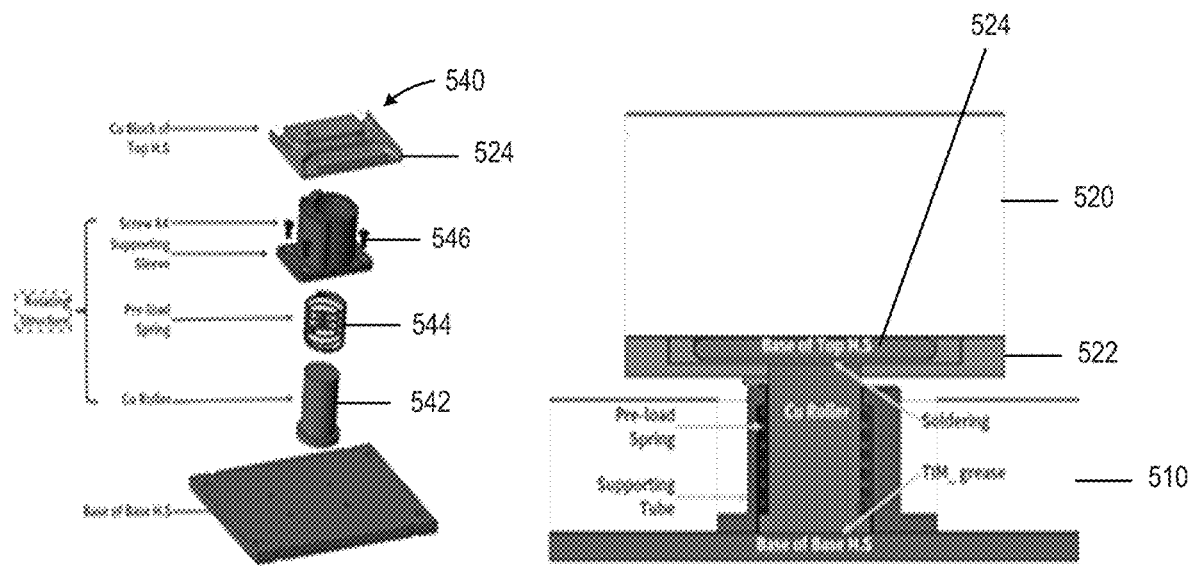
FIG. 5F includes an exploded view and a cross-sectional view of an illustrative rotatable mount 540, in accordance with at least one embodiment described herein.

FIG. 5A includes perspective, plan, and elevation views of an illustrative two part, rotatable heat sink system 500 that includes a relatively small, lower, fixed position, heat sink 510 and a relatively large, upper, heat sink 520 that is rotatable with respect to the lower heat sink 510, in accordance with at least one embodiment described herein. FIG. 5B is a perspective view of the illustrative two part, rotatable heat sink system 500, including a rotatable mount 540 and locking mechanism 550, in accordance with at least one embodiment described herein. FIG. 5C is an exploded view of an illustrative upper heat sink 520, in accordance with at least one embodiment described herein. FIG. 5D is a perspective view of an illustrative lower heat sink 510, in accordance with at least one embodiment described herein. FIG. 5E includes an exploded view and a cross-sectional view of an illustrative fixed pin set 550, in accordance with at least one embodiment described herein. FIG. 5F includes an exploded view and a cross-sectional view of an illustrative rotatable mount 540, in accordance with at least one embodiment described herein.

As depicted in FIG. 5A, when in an operating mode, the upper heat sink 520 may be disposed in a position overhanging the memory circuitry 530. In the memory maintenance mode, the upper heat sink 520 may be rotated about 90 degrees, exposing the memory circuitry 530. Thus, the rotatable heat sink system 500 beneficially increases the available extended surface area for heat transfer by extending above other components co-located on a substrate with one or more heat producing devices. For example, the lower heat sink 510 of the rotatable heat sink system 500 may be thermally coupled to a central processing unit (CPU) and the upper heat sink 520 may be rotated to occupy space above memory circuitry 530 disposed adjacent to the CPU. To maintain the memory circuitry 530, the upper heat sink 520 may be pivoted on the rotatable mount 540.

As depicted in FIG. 5B, a rotatable mount 540 physically, thermally, and rotatably couples the lower heat sink 510 with the upper heat sink. The fixed pin set 550 locks and/or detachably attaches the upper heat sink in position and, when the upper heat sink 520 is disposed in the operating mode, compresses the upper heat sink against the rotatable mount 540 to improve conductive heat transfer from the base 512 of the lower heat sink 510 to the heat pipes 526 disposed in, on, or about the base 522 of the upper heat sink 520.

FIG. 5C is an exploded view of an illustrative upper heat sink 520. As depicted in FIG. 5C, the upper heat sink 520 may include a base member 522, a thermal transfer block 524 fabricated using a material having a thermal conductivity greater than about: 50 Watts/meter-Kelvin (W/m-K); 100 W/m-K; 150 W/m-K; 200 W/m-K; 250 W/m-K; or 300 W/m-K may be thermally coupled to the base member 522, one or more heat pipes 526 thermally coupled to the thermal transfer block 524 and/or the base member 522, and an extended surface portion 528 that may include a plurality of fins or similar structures. As depicted in FIG. 5C, a portion of the rotatable mount 540 may be fabricated using a thermally conductive material to conductively transfer heat from the base 512 of the lower heat sink 510 to the base 522 of the upper heat sink 520.

FIG. 5D depicts an illustrative lower heat sink 510. The lower heat sink 510 includes a void space 514 where the rotatable mount 540 physically and thermally couples to the base member 512 of the lower heat sink 510. The lower heat sink 510 includes one or more attachment devices 516A-516n (four depicted, collectively "attachment devices 516") used to physically couple the rotatable heat sink system 500 to a substrate.

FIG. 5E depicts an illustrative fixed pin set 550 that includes a compression element 552, a support member 554, and a pin 556. As depicted in FIG. 5E, the pin 556 is vertically displaceable to permit the withdrawal of the pin 556 from a receiver in the rotatable mount 540. The compression element 552 may bias the pin 556 toward the rotatable mount 540 such that when the upper heat sink 520 is disposed transverse to the lower heat sink 510, the compression element 552 biases the pin 556 into a corresponding hole, void, or aperture on the rotatable member 540, thereby locking the upper heat sink 520 into a transverse or orthogonal position relative to the lower heat sink 510. Conversely, when the pin 556 is vertically withdrawn from the hole, void, or aperture on the rotatable member 540, the upper heat sink 520 may be rotated to access the circuitry positioned beneath the send heat sink 520 when the second heat sink 520 is disposed in the operating mode.

FIG. 5F depicts an illustrative rotatable member 540 that includes a thermally conductive roller member 542, a biasing element 544, and a support sleeve 546. As depicted in FIG. 5F, the biasing element 544 is disposed about all or a portion of the roller member 542. The support sleeve 546 is rigidly anchored to the base member 512 of the lower heat sink 510 and is disposed about the biasing element 544. Trapped by the support sleeve 546, the biasing member 544 exerts a downward force on the roller member 542 causing the roller member to physically contact and thermally coupled to the base member 512 of the lower heat sink 510. In embodiments, the roller member 542 may be physically and thermally affixed to the thermal transfer block 524 coupled to the base member 522 of the upper heat sink 520. Thus, as the upper heat sink 520 is manually or autonomously rotated, the roller member 542 is rotating on the upper surface of the base member 512 of the lower heat sink 510. In embodiments, a thermally conductive grease or similar lubricant may be disposed between the roller member 542 and the upper surface of the base member 512 of the lower heat sink 510.

Figure 6A:
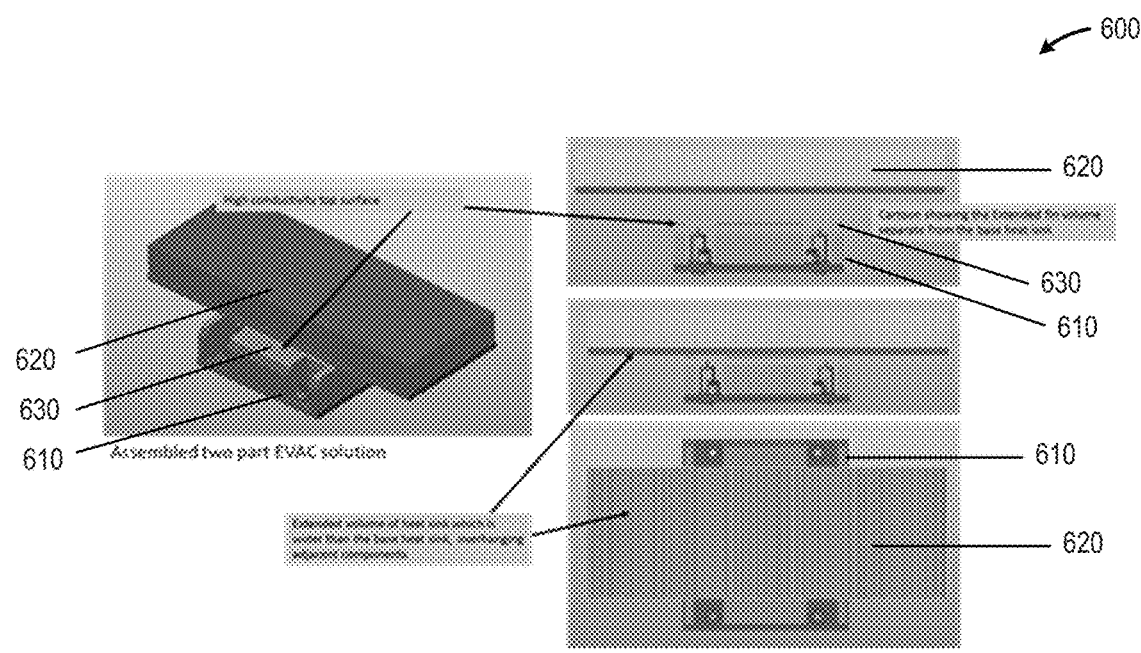
FIG. 6A includes perspective, plan, and elevation views of an illustrative two part, detachable, heat sink system that includes a relatively small, lower, fixed position, heat sink thermally coupled to a relatively large, upper, heat sink that is removable from the lower heat sink, in accordance with at least one embodiment described herein.
Figure 6B:
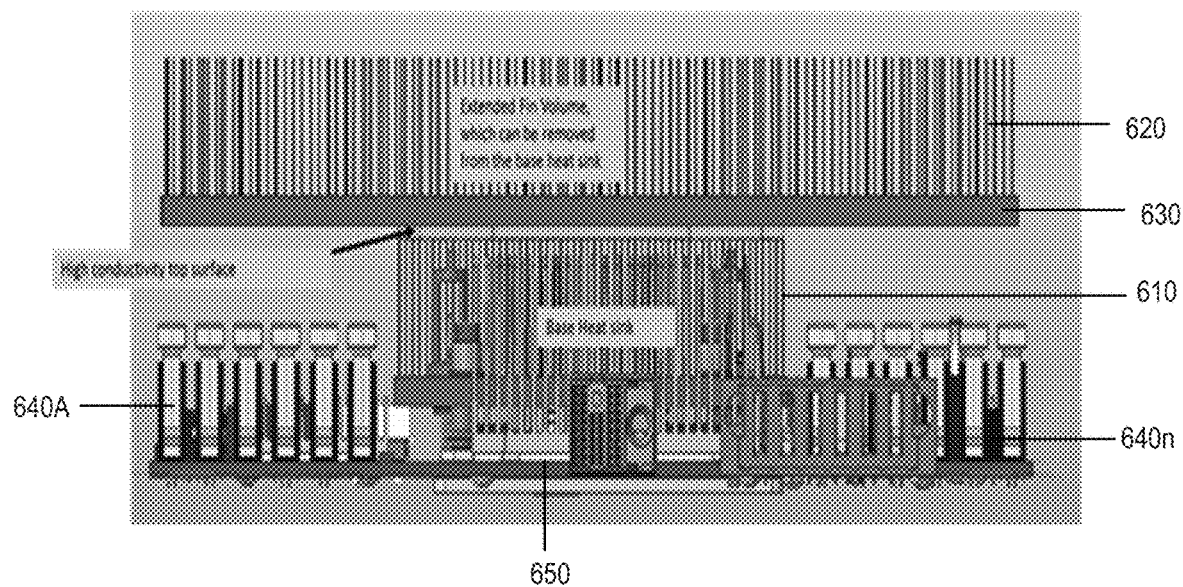
FIG. 6B is a side elevation of the detachable heat sink system depicted in FIG. 6A demonstrating the overhang of the upper heat sink over components mounted on a substrate, in accordance with at least one embodiment described herein.
Figure 6C:
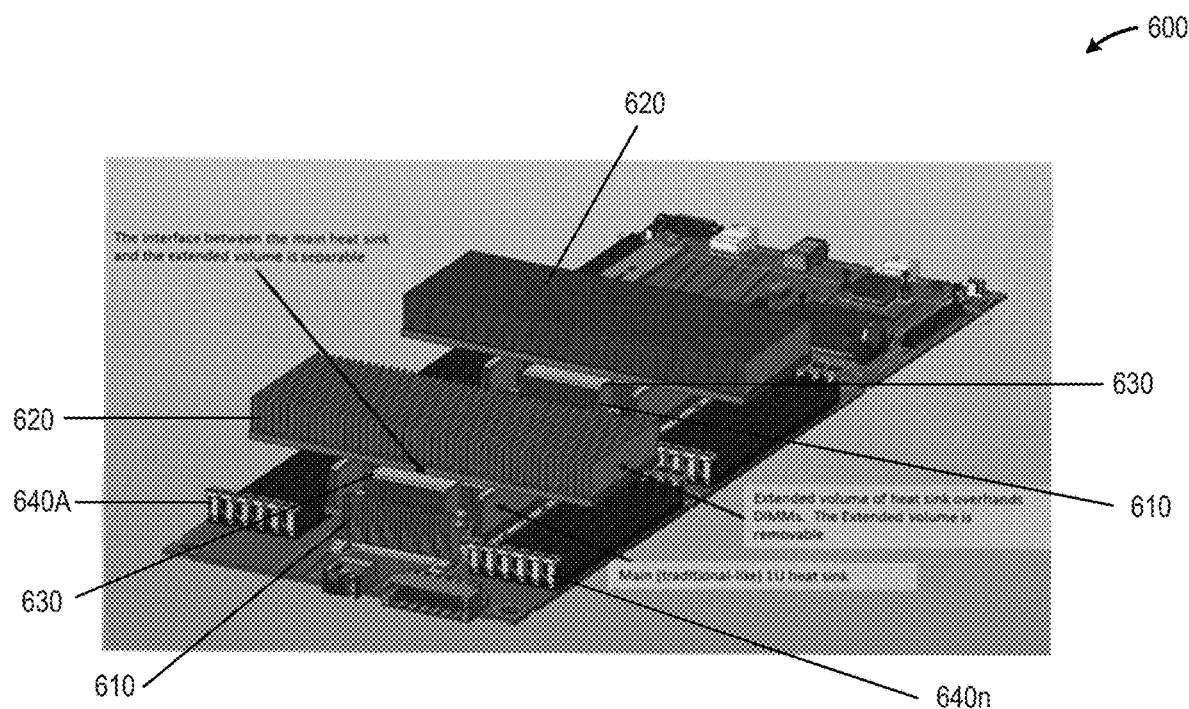
FIG. 6C is a perspective view of the detachable heat sink system depicted in FIG. 6A demonstrating the overhang of the upper heat sink over components mounted on a substrate, in accordance with at least one embodiment described herein.
Figure 6D:
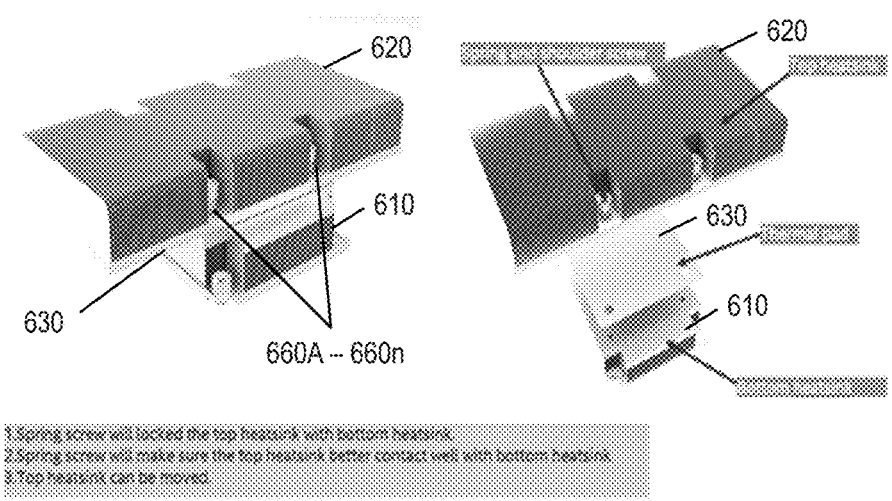
FIG. 6D includes perspective and exploded views of an illustrative embodiment of the detachable heat sink system using a plurality of fasteners to physically and thermally couple the upper heat sink to the lower heat sink, in accordance with at least one embodiment described herein.
Figure 6E:
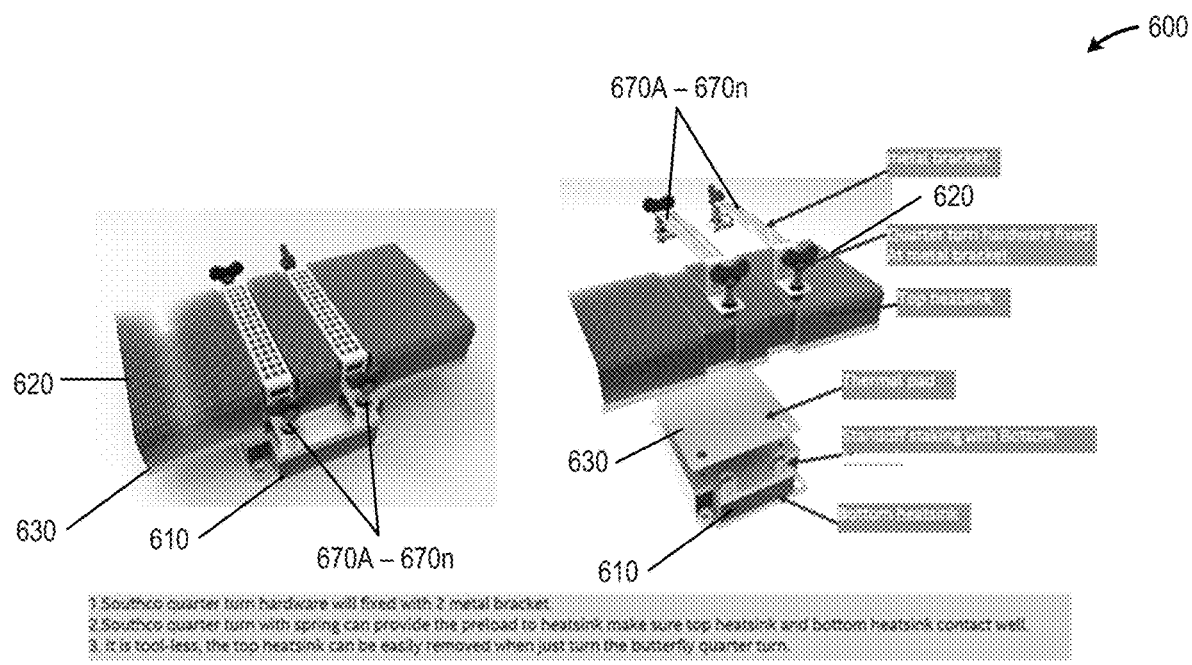
FIG. 6E includes perspective and exploded views of an illustrative embodiment of the detachable heat sink system using a plurality of clamps to physically and thermally couple the upper heat sink to the lower heat sink, in accordance with at least one embodiment described herein.
Figure 6F:
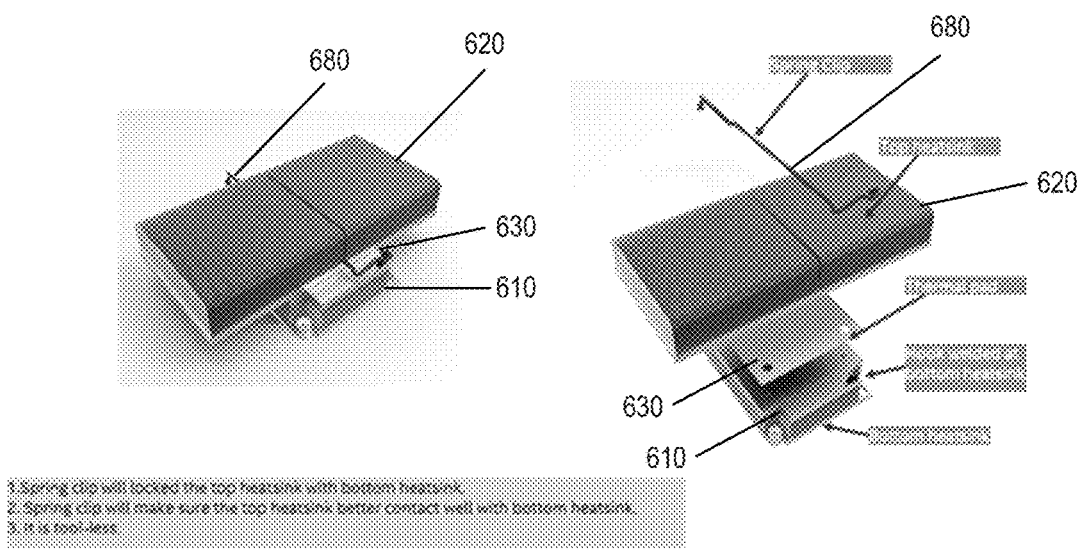
FIG. 6F includes perspective and exploded views of an illustrative embodiment of the detachable heat sink system using a a spring clip to physically and thermally couple the upper heat sink to the lower heat sink, in accordance with at least one embodiment described herein.

FIG. 6A includes perspective, plan, and elevation views of an illustrative two part, detachable, heat sink system 600 that includes a relatively small, lower, fixed position, heat sink 610 thermally coupled to a relatively large, upper, heat sink 620 that is removable from the lower heat sink 610, in accordance with at least one embodiment described herein. The detachable heatsink system 600 beneficially permits the removal of the upper heat sink portion 620 to access components disposed proximate the lower, fixed, heat sink portion 610. FIG. 6B is a side elevation of the detachable heat sink system 600 depicted in FIG. 6A demonstrating the overhang of the upper heat sink 620 over components mounted on a substrate, in accordance with at least one embodiment described herein. FIG. 6C is a perspective view of the detachable heat sink system 600 depicted in FIG. 6A demonstrating the overhang of the upper heat sink 620 over components mounted on a substrate, in accordance with at least one embodiment described herein. FIG. 6D includes perspective and exploded views of an illustrative embodiment of the detachable heat sink system 600 using a plurality of fasteners 640A-640n (four shown, collectively, "fasteners 640") to physically and thermally couple the upper heat sink 620 to the lower heat sink 610, in accordance with at least one embodiment described herein. FIG. 6E includes perspective and exploded views of an illustrative embodiment of the detachable heat sink system 600 using a plurality of clamping systems 650A-650n (two shown, collectively, "clamping systems 650") to physically and thermally couple the upper heat sink 620 to the lower heat sink 610, in accordance with at least one embodiment described herein. FIG. 6F includes perspective and exploded views of an illustrative embodiment of the detachable heat sink system 600 using a spring clip 660 to physically and thermally couple the upper heat sink 620 to the lower heat sink 610, in accordance with at least one embodiment described herein.

Referring first to FIG. 6A, the lower heat sink 610 may have a first heat transfer area and the upper heat sink 620 may have a second heat transfer area. In embodiments, the second heat transfer area may be greater than or equal to the first heat transfer area. A longitudinal axis of the lower heat sink 610 is disposed at an angle to the longitudinal axis of the upper heat sink 620. In embodiments, the longitudinal axis of the lower heat sink 610 may be disposed orthogonal to the longitudinal axis of the upper heat sink 620. A thermal interface member 630 thermally couples the lower heat sink 610 to the upper heat sink 620. In embodiments, the thermal interface member 630 detachably attach and/or physically couple the upper heat sink 620 to the lower heat sink 610. Beneficially, since the upper heat sink 620 is spaced a distance above the upper surface of the substrate to which the lower heat sink 610 is mounted, the upper heat sink 620 may overhang one or more components disposed on the upper surface of the substrate that are positioned proximate the lower heat sink 610. In embodiments, the height of one or more extended thermal transfer surfaces (e.g., fins) on the lower heat sink 610 may be determined based, at least in part, upon the projection from the upper surface of the substrate of one or more components positioned adjacent to the lower heat sink 610. For example, the height of the fins on the lower heat sink 610 may be selected or based, at least in part, on the height of one or more Dual-Inline Memory Modules (DIMMs) disposed proximate the lower heat sink 610. The thermal interface member 630 may be fabricated using one or more materials having a high thermal conductivity. For example, the thermal interface member 630 may be fabricated using copper, a copper containing alloy, aluminum, or an aluminum containing alloy—each having a thermal conductivity in excess of 200 Watts/meter-Kelvin (W/m-K).

FIG. 6B is an elevation view depicting the lower heat sink 610, the upper heat sink 620 and the thermal interface member 630 that thermally couples the lower heat sink 610 to the upper heat sink 620 to beneficially increase the available thermal transfer area of the assembled dual-layer heat sink system 600. As depicted in FIG. 6B, one or more DIMMs 640A-640n may be disposed proximate the lower heat sink 610 and may be positioned, in whole or in part, beneath the upper heat sink 620. In embodiments, the lower heat sink 610 may be physically and/or thermally coupled to one or more heat producing components 650. For example, the lower heat sink 610 may be positioned proximate one or more central processing units (CPUs), one or more graphical processing units (GPUs), or combinations thereof.

FIG. 6C is a perspective view depicting two dual-layer heat sink systems 600, each including a lower heat sink 610, a detachably attached upper heat sink 620, and a thermal interface member 630 thermally coupling the lower heat sink 610 and upper heat sink 620. As depicted in FIG. 6C, the longitudinal axis of the upper heat sink 620 arranged orthogonal to the longitudinal axis of the lower heat sink 610 and the upper heat sink extends over one or more DIMMs 640A-640n.

FIG. 6D includes perspective views of an assembled and an exploded dual-layer heat sink system 600 in which a plurality of fasteners 660A-660n (four shown, collectively, "fasteners 660") detachably attach the upper heat sink 620 to the thermal interface member 630 and to the lower heat sink 610. In embodiments, the fasteners 660 may include fasteners such as spring and shoulder screws that include a biasing device to increase the pressure on the upper heat sink 620 such that the contact with the thermal interface member 630 is increased, thereby increasing the transfer of thermal energy from the lower heat sink 610 to the upper heat sink 620. Other fasteners may also be used. In embodiments, the fasteners 660 may engage or pass through one or more complimentary receivers physically coupled to the lower heat sink 610.

FIG. 6E includes perspective views of an assembled and an exploded dual-layer heat sink system 600 in which a plurality of clamp members 670A-670n (two shown, collectively, "clamp members 670") detachably attach the upper heat sink 620 to the thermal interface member 630 and to the lower heat sink 610. In embodiments, the retaining members 670 may include bars or similar structures, each having one or more fasteners or similar devices to couple to the lower heats sink 610 and increase the pressure on the upper heat sink 620 such that the contact with the thermal interface member 630 is increased. Increasing the pressure and contact between the upper heat sink 620 and the thermal interface member 630 increases the transfer of thermal energy from the lower heat sink 610 to the upper heat sink 620. In embodiments, the fasteners 660 may engage or pass through one or more complimentary receivers physically coupled to the lower heat sink 610.

FIG. 6F includes perspective views of an assembled and an exploded dual-layer heat sink system 600 in which a spring clip 680 detachably attaches the upper heat sink 620 to the thermal interface member 630 and to the lower heat sink 610. Increasing the pressure and contact between the upper heat sink 620 and the thermal interface member 630 increases the transfer of thermal energy from the lower heat sink 610 to the upper heat sink 620. In embodiments, the spring clip 680 may engage or pass through one or more complimentary receivers (e.g., one or more apertures) physically coupled to the thermal interface member 630 and/or the lower heat sink 610.

Figure 7A:
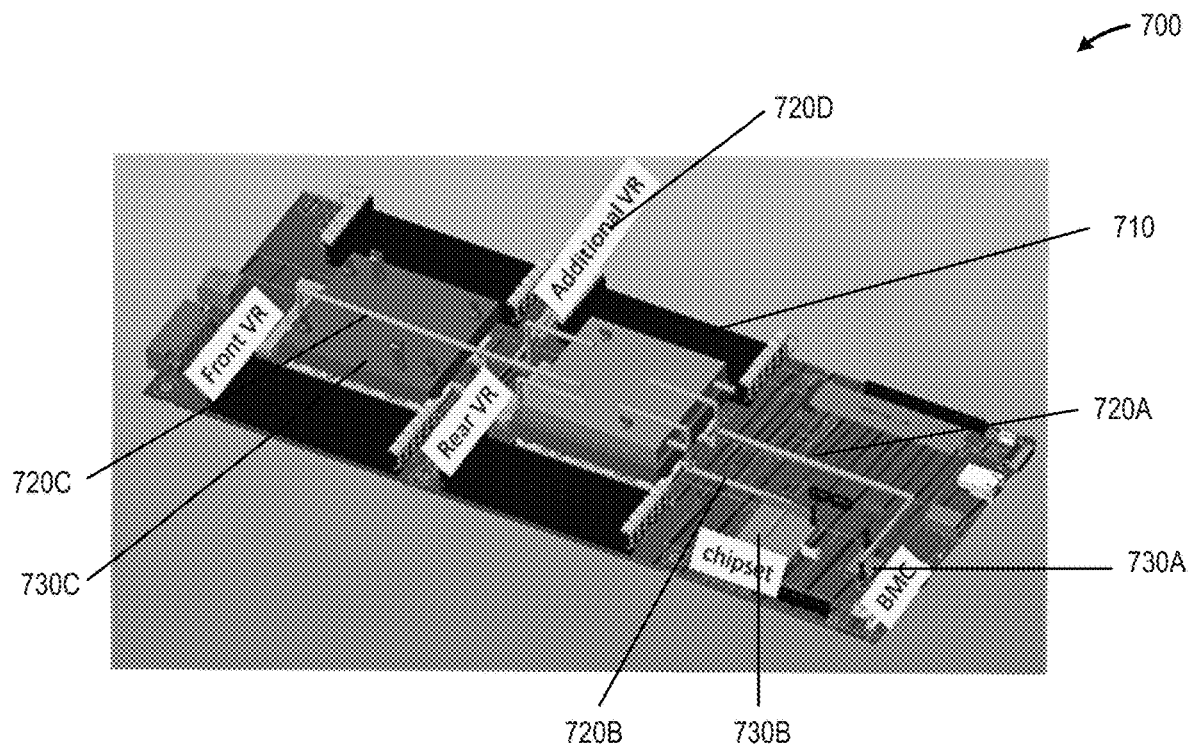
FIG. 7A is a perspective view of an illustrative distributed thermal control system that includes a chilled distribution block coupled to a plurality of geographically distributed heat producing components by a plurality of thermal conduits, in accordance with at least one embodiment described herein.
Figure 7B:
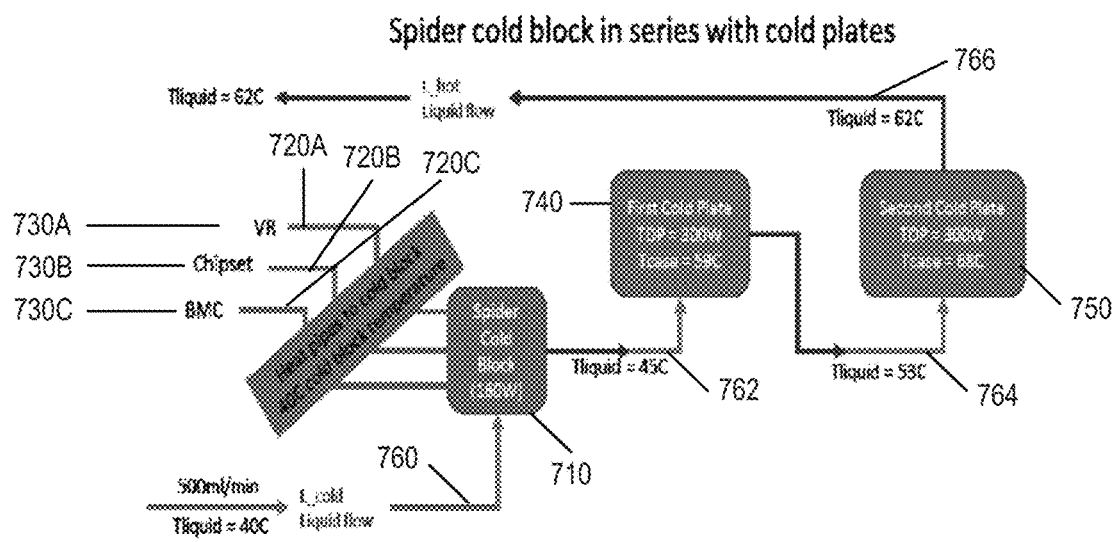
FIG. 7B is a schematic diagram that includes the distributed thermal control system depicted in FIG. 7A, in accordance with at least one embodiment described herein.

FIG. 7A is a perspective view of an illustrative distributed thermal control system 700 that includes a chilled distribution block 710 coupled to a plurality of geographically distributed heat producing components 730A-730n (collectively, "heat producing components 730") by a plurality of thermal conduits 720A-720n (collectively, "thermal conduits 720"), in accordance with at least one embodiment described herein. FIG. 7B is a schematic diagram that includes the distributed thermal control system 700 depicted in FIG. 7A, in accordance with at least one embodiment described herein. In embodiments, the distribution block 710 may be chilled using any number or combination of gaseous, liquid, and/or phase change materials.

Referring first to FIG. 7A, in at least some embodiments, the chilled distribution block 710 may include a liquid cooled block. (e.g., a water, glycol, or similar thermal transfer fluid cooled block) As depicted in FIG. 7A, in some embodiments, the chilled distribution block 710 may be positioned proximate one or more cold plates or similar control devices. In embodiments, each of a plurality of heat producing components 730 may be thermally coupled to the chilled distribution block 710 via one or more thermal conduits 720. In some embodiments, the one or more thermal conduits 720 may include one or more heat pipes or similar thermally conductive structures. In operation, a flow of coolant media through the chilled distribution block 710 maintains the block at a defined temperature or within a defined temperature range.

The one or more heat producing components 730 may include but are not limited to: voltage regulator circuitry, processor circuitry, microprocessor circuitry, or combinations thereof. In embodiments, the number of thermal conduits 720 thermally coupled to a particular heat producing component 730 may be based, at least in part, on the thermal load (e.g., 1 Watt per square centimeter ($W/cm^2$) or less; 2 $W/cm^2$ or less; 5 $W/cm^2$ or less; 10 $W/cm^2$ or less; 15 $W/cm^2$ or less; 20 $W/cm^2$ or less; 25 $W/cm^2$ or less; 30 $W/cm^2$ or less) presented by the respective heat producing component 730, the desired temperature range (e.g., 5° C. to 100° C.; 10° C. to 90° C.; 15° C. to 80° C.; 20° C. to 75° C.; 25° C. to 65° C.; or 30° C. to 50° C.) for the respective heat producing component 730, the distance between the chilled distribution block 710 and the respective component, or combinations thereof.

Referring next to FIG. 7B, the chilled distribution block 710 is maintained at a defined temperature using a flow 760 of cooling media maintained at the defined temperature. Heat generated by heat producing components 730A-730C is conveyed, via thermal conduits 720A-720C to the chilled distribution block 710. The temperature of the cooling media flowing through the chilled distribution block 710 increases due to the heat received from the heat producing components 730A-730C. For example, as depicted in FIG. 7B, the cooling media may be provided 760 to the chilled distribution block 710 at a temperature of 40° C. and may exit 762 the chilled distribution block 710 at a temperature of 45° C. The 45° C. cooling media may be provided to a first cold plate 740 thermally coupled to a heat producing component, such as a voltage regulator, and may exit 764 the first cold plate 740 at an elevated temperature. For example, as depicted in FIG. 7B, the cooling media may exit 764 the first cold plate 740 at a temperature of 53° C. The 53° C. cooling media may be provided to a second cold plate 750 thermally coupled to a second heat producing component, such as a second voltage regulator, and may exit 766 the second cold plate 750 at an elevated temperature. For example, as depicted in FIG. 7B, the cooling media may exit 766 the second cold plate 750 at a temperature of 62° C.

In embodiments, the cooling media may be provided 760 to the chilled distribution block 710 at any temperature. For example, the cooling media may be provided 760 to the chilled distribution block 710 at a temperature of about: 5° C. or less; 10° C. or less; 15° C. or less; 20° C. or less; 25° C. or less; 30° C. or less; 35° C. or less; 40° C. or less; 45° C. or less; or 50° C. or less. In embodiments, the cooling media may exit 764 the first cold plate 740 at any temperature. For example, the cooling media may exit 764 the first cold plate 740 at a temperature of about: 10° C. or greater; 20° C. or greater; 30° C. or greater; 40° C. or greater; 50° C. or greater; 60° C. or greater; 70° C. or greater; or 80° C. or greater.

Figure 8A:
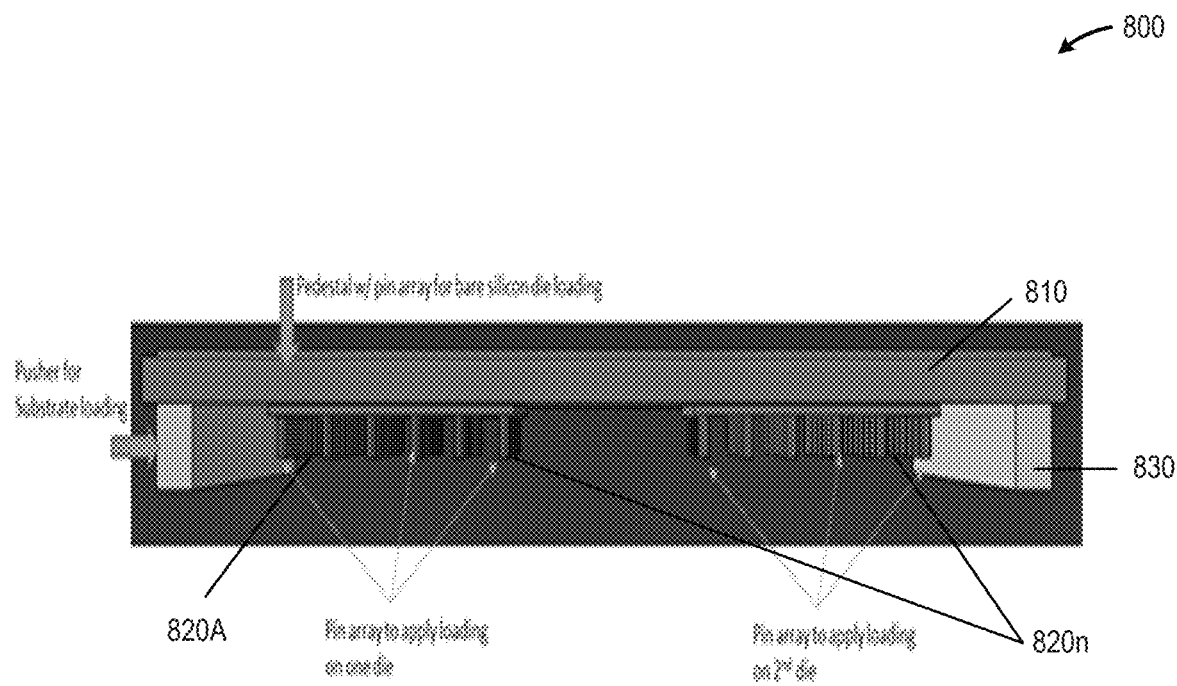
FIG. 8A is an elevation view of an illustrative die loading apparatus for use with multiple semiconductor dies, the loading apparatus including a pedestal member, one or more pin arrays coupled to the pedestal member, and one or more pusher members, in accordance with at least one embodiment described herein.
Figure 8B:
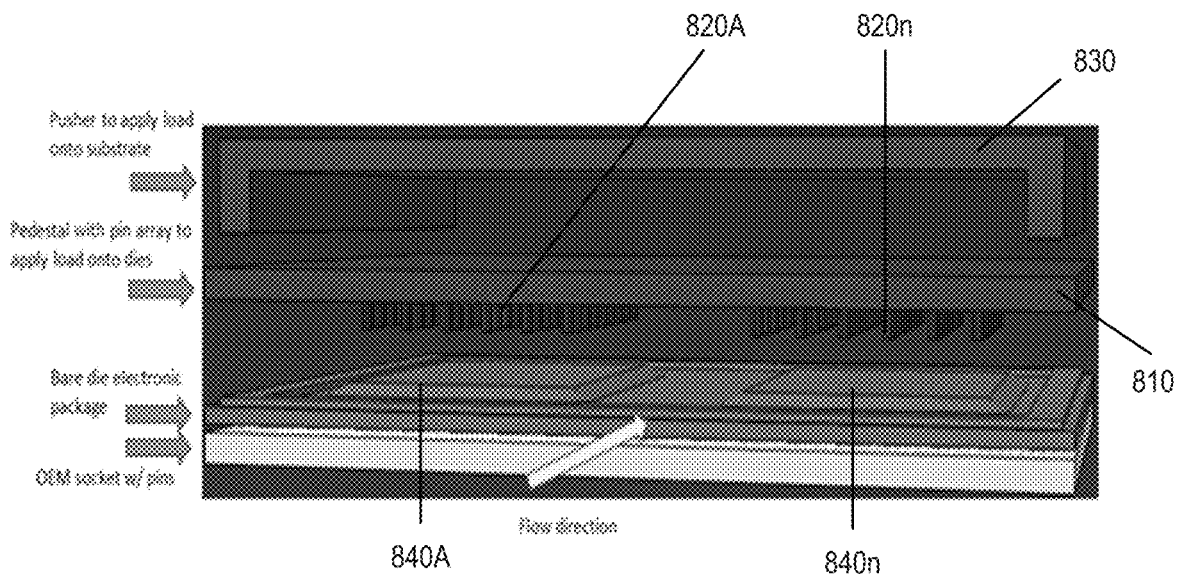
FIG. 8B is a perspective view of an illustrative system that includes a plurality of semiconductor dies that are seated to a socket disposed on a substrate using a die loading apparatus such as depicted in FIG. 8A and in which, after installation, the pin arrays create a fluid channel between the upper surface of the semiconductor dies and the lower surface of the pedestal member, in accordance with at least one embodiment described herein.
Figure 8C:
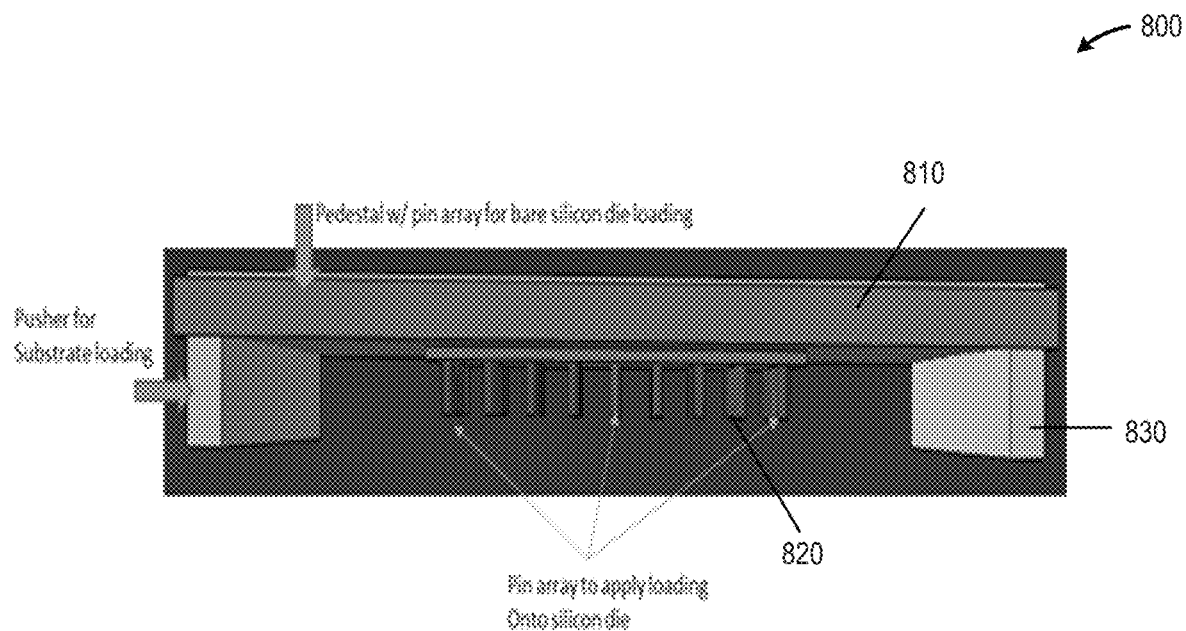
FIG. 8C is an elevation view of an illustrative single die loading apparatus 800 that includes a pedestal member, a single pin array coupled to the pedestal member 810, and one or more pusher members, in accordance with at least one embodiment described herein.
Figure 8D:
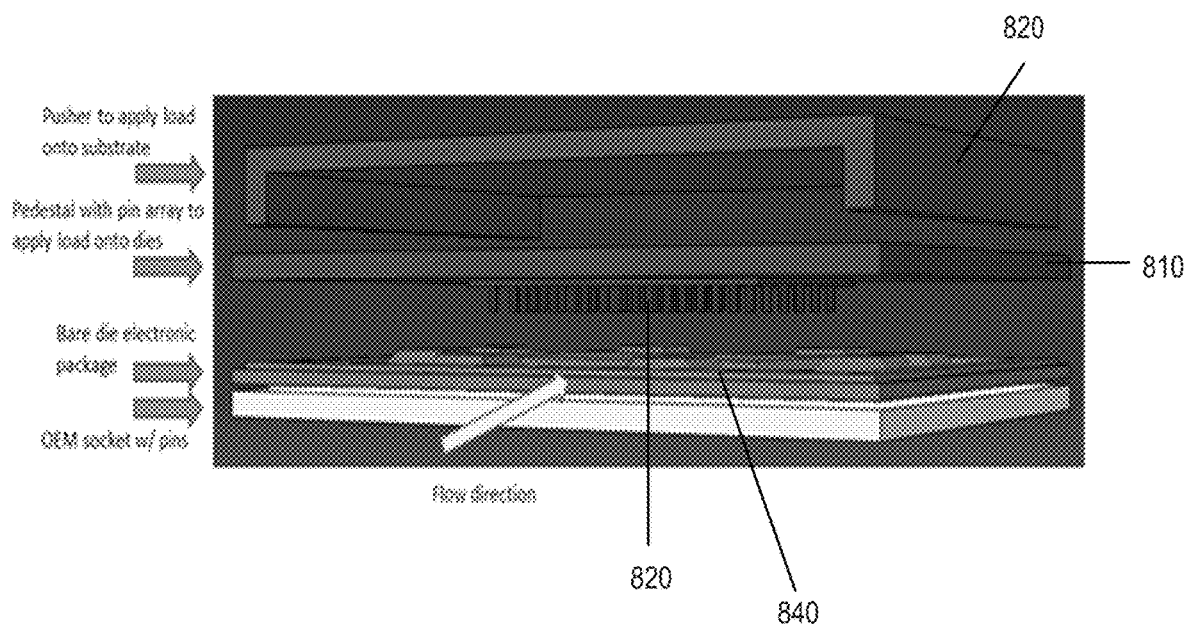
FIG. 8D is a perspective view of an illustrative system that includes a single semiconductor die that is seated using a single loading apparatus such as depicted in FIG. 8C and in which the pin array creates a fluid channel between the upper surface of the semiconductor die and the lower surface of the pedestal member, in accordance with at least one embodiment described herein.

FIG. 8A is an elevation view of an illustrative die loading apparatus 800 for use with multiple semiconductor dies, the loading apparatus 800 including a pedestal member 810, one or more pin arrays 820A-820*n* (two shown, collectively "pin arrays 820") coupled to the pedestal member 810, and one or more pusher members 830, in accordance with at least one embodiment described herein. FIG. 8B is a perspective view of an illustrative system that includes a plurality of semiconductor dies 840A-840*n* (two shown, collectively, "silicon dies 840") that are seated to a socket disposed on a substrate 850 using a die loading apparatus 800 such as depicted in FIG. 8A and in which, after installation, the pin arrays 820 create a fluid channel between the upper surface of the semiconductor dies 840 and the lower surface of the pedestal member 810, in accordance with at least one embodiment described herein. FIG. 8C is an elevation view of an illustrative single die loading apparatus 800 that includes a pedestal member 810, a single pin array 820 coupled to the pedestal member 810, and one or more pusher members 830, in accordance with at least one embodiment described herein. FIG. 8D is a perspective view of an illustrative system that includes a single semiconductor die 840 that is seated using a single loading apparatus 800 such as depicted in FIG. 8C and in which the pin array 820 creates a fluid channel between the upper surface of the semiconductor die 840 and the lower surface of the pedestal member 810, in accordance with at least one embodiment described herein.

In immersion cooling systems, the cooling medium directly contacts the heat producing elements in the system, in other words, the heat producing elements are immersed in the cooling medium. Semiconductor dies are typically pressed into complimentary sockets that are conductively and physically coupled to a substrate. A cool plate or cover is then disposed over or about at least a portion of the semiconductor die to hold the semiconductor die in place within the socket. However, covering the semiconductor die in an immersion cooled system adversely impacts the thermal performance of the system. Peripheral clamping of the semiconductor die causes stresses in the semiconductor die that can damage the die or, on larger multi-chip modules (MCMs), can cause "bowing" of the die to the point that some pins do not make electrical contact with the socket. The die loading apparatus 800 includes a pin array 820 that beneficially applies pressure across all or a portion of a semiconductor die or MCM while providing a fluid channel adjacent to the upper surface of the semiconductor die or MCM.

Referring first to FIGS. 8A and 8B, the die loading apparatus 800 includes a plurality of pin arrays 820. Each of the pin arrays 820 applies pressure to one or more semiconductor dies 840 to properly seat each of the semiconductor dies 840 in a respective socket. The pin arrays 820 beneficially permit cooling medium flow across the upper surface of the semiconductor die 840 and also maintain pressure on the semiconductor dies 840. In some embodiments, the semiconductor dies 840 may be mounted on a common substrate to form a multi-chip module (MCM). The pin array 820 may be fabricated using a rigid, dielectric or electrically non-conductive, material. The pedestal member 810 and the pusher member 830 may be fabricated using one or more rigid, dielectric, electrically non-conductive, or electrically conductive materials. In some embodiments, the pedestal member 810 and/or the pusher member 830 may include one or more attachment features to permit the attachment of the die loading apparatus to the substrate 850. The pins forming the pin array 820 may have the same or different lengths.

For example, the pin length of some of the pins may differ to accommodate a semiconductor die having a non-planar upper surface or an irregular contour. In embodiments, the pin length for each pin array 820 may differ to accommodate semiconductor dies 840 having different thicknesses. By varying the pin length based on semiconductor die thicknesses and/or to accommodate semiconductor dies 840 having irregular contours, the die loading apparatus 800 beneficially maintains a defined pressure across each of the semiconductor dies 840.

Referring next to FIGS. 8C and 8D, the die loading apparatus 800 includes a single pin array 820. The pin array 820 beneficially permits cooling medium flow across all or a portion of the upper surface of the semiconductor die 840 and also maintains a defined seating pressure on the semiconductor die 840. The pins forming the pin array 820 may have the same or different lengths. For example, the pin length of some of the pins forming the pin array 820 may differ to accommodate a semiconductor die having a non-planar upper surface or an irregular contour. In embodiments, the pin length for each pin array 820 may differ to accommodate semiconductor dies 840 having different thicknesses. By varying the pin length based on semiconductor die thicknesses and/or to accommodate a semiconductor die 840 having irregular contours, the die loading apparatus 800 beneficially maintains a defined seating or insertion pressure across the semiconductor die 840.

Figure 9A:
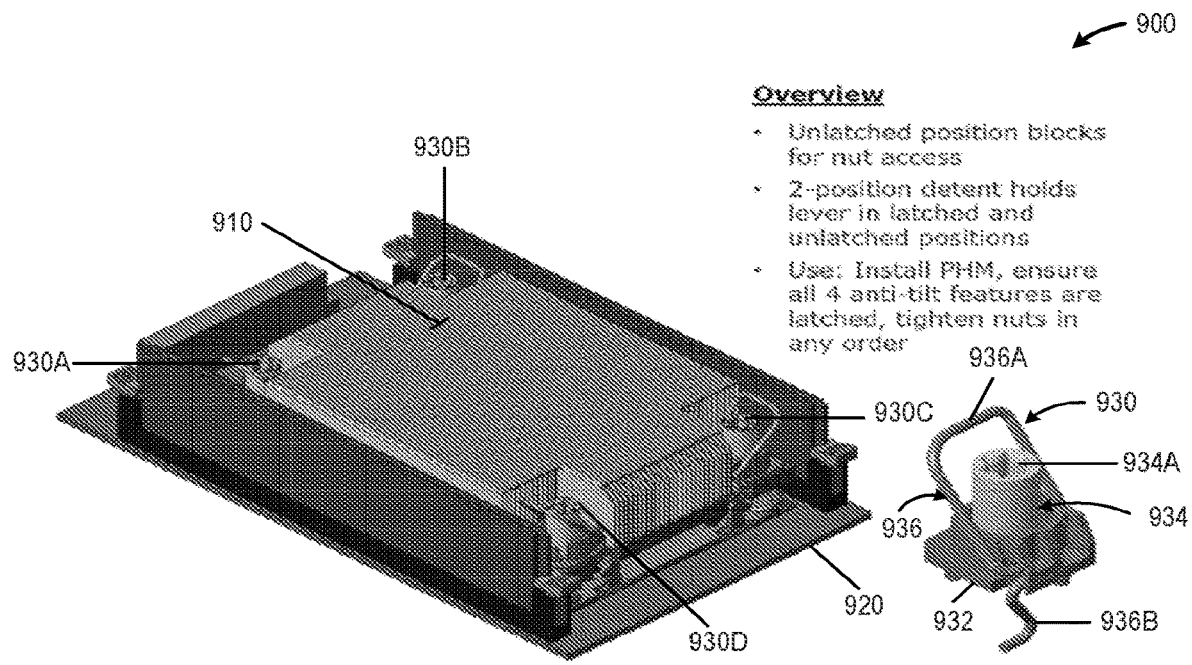
FIG. 9A is a perspective view of a system that includes a thermal solution secured to a substrate using a plurality of detent fasteners rotatably positionable between an UNLATCHED position in which the detent fastener does not engage a surface feature coupled to the substrate and a LATCHED position in which the detent fastener engages a surface feature coupled to the substrate, in accordance with at least one embodiment described herein.
Figure 9B:
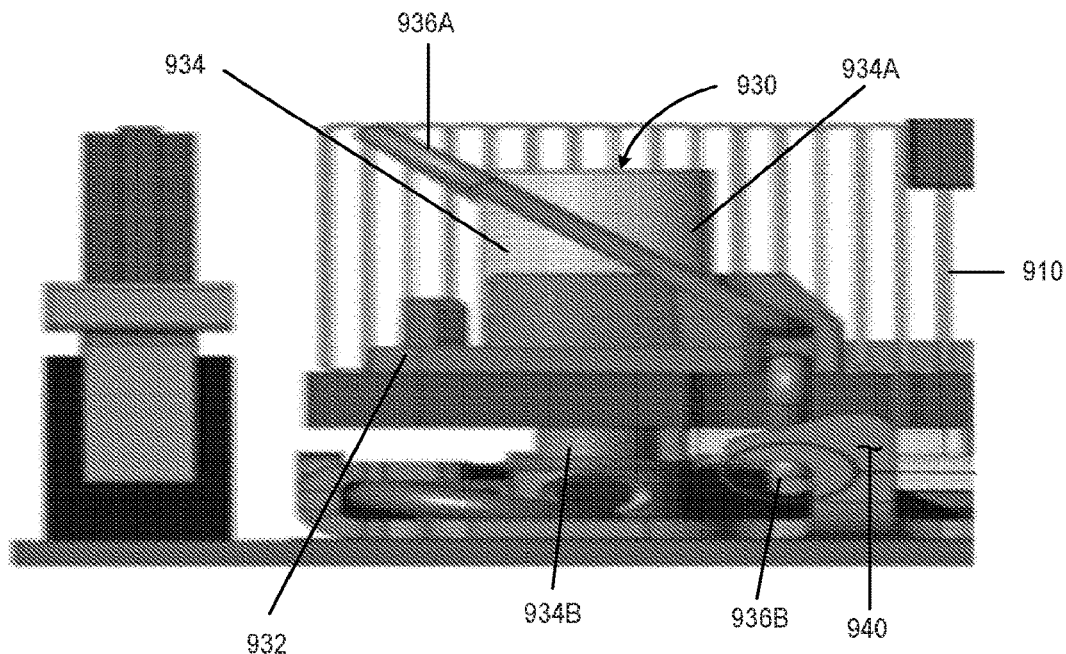
FIG. 9B is a cross-sectional view of an illustrative system in which the detent fastener is disposed in the LATCHED position in which the rotating member coupled to the detent fastener engages a surface feature coupled to the substrate, in accordance with at least one embodiment described herein.
Figures 9C, 9D:
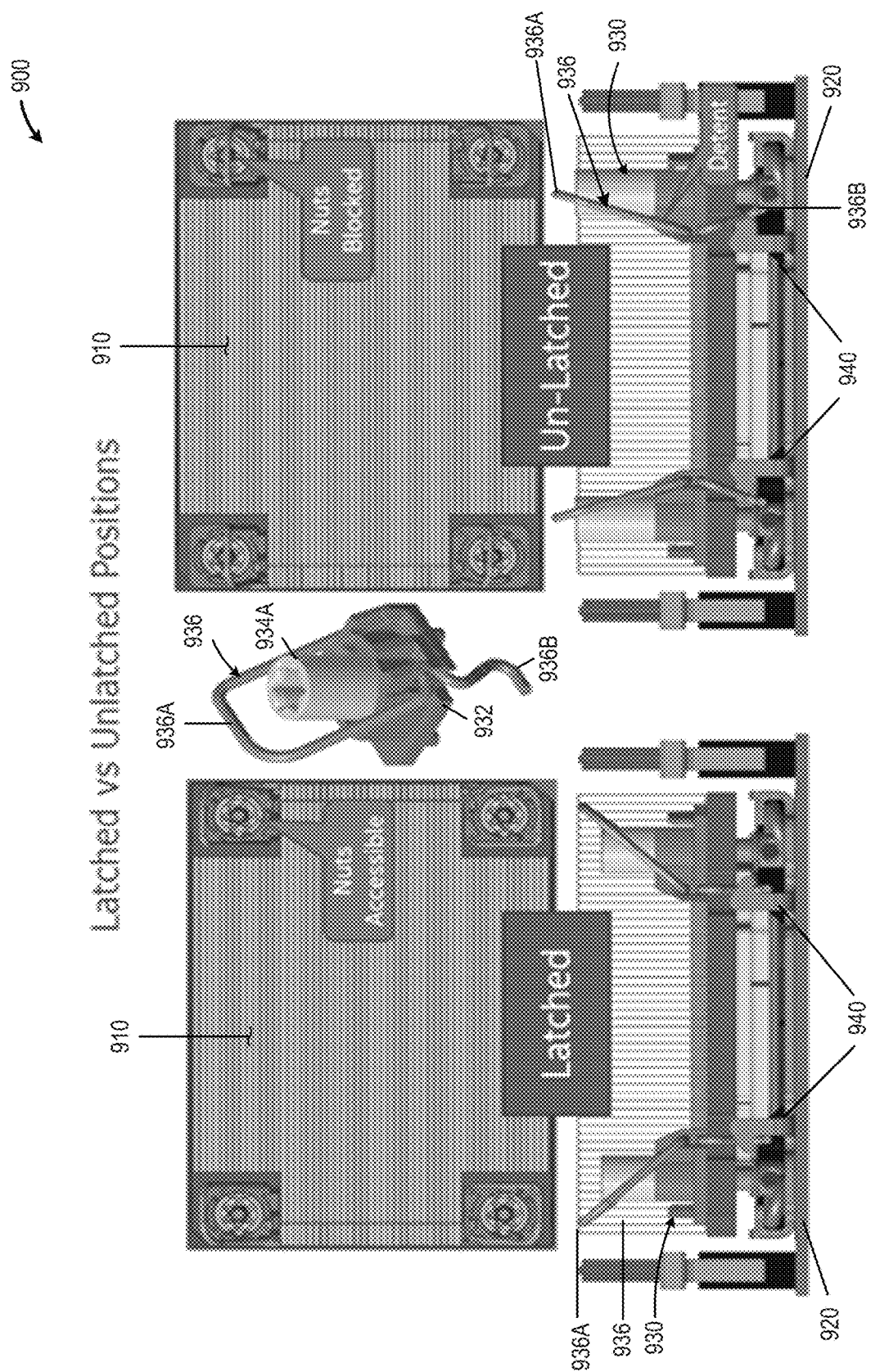
FIG. 9C includes a plan view and a cross-sectional view of an illustrative system in which the detent fastener is disposed in the LATCHED position in which the rotating member coupled to the detent fastener engages a surface feature coupled to the substrate, in accordance with at least one embodiment described herein.
FIG. 9D is a cross-sectional view of an illustrative system in which the detent fastener is disposed in the UNLATCHED position in which the rotating member coupled to the detent fastener does not engage the surface feature coupled to the substrate, in accordance with at least one embodiment described herein.

FIG. 9A is a perspective view of a system 900 that includes a thermal solution 910 secured to a substrate 920 using a plurality of detent fasteners 930A-930$n$ (four shown, collectively, "detent fasteners 930") rotatably positionable between an UNLATCHED position in which the detent fastener does not engage a surface feature coupled to the substrate 920 and a LATCHED position in which the detent fastener engages a surface feature coupled to the substrate 920, in accordance with at least one embodiment described herein. FIG. 9B is a cross-sectional view of an illustrative system 900 in which the detent fastener 930 is disposed in the LATCHED position in which the rotating member 936 coupled to the detent fastener 930 engages a surface feature 940 coupled to the substrate 920, in accordance with at least one embodiment described herein. FIG. 9C includes a plan view and a cross-sectional view of an illustrative system 900 in which the detent fastener 930 is disposed in the LATCHED position in which the rotating member 936 coupled to the detent fastener 930 engages a surface feature 940 coupled to the substrate 920, in accordance with at least one embodiment described herein. FIG. 9D is a cross-sectional view of an illustrative system 900 in which the detent fastener 930 is disposed in the UNLATCHED position in which the rotating member 936 coupled to the detent fastener 930 does not engage the surface feature 940 coupled to the substrate 920, in accordance with at least one embodiment described herein.

Turning first to FIG. 9A, each of the detent fasteners 930 includes a fastener housing 932 disposed about at least a portion of a fastener member 934, and a rotating member 936 pivotably coupled to the fastener housing 932. The fastener member 934 may include a head portion 934A and a body portion 934B that extends from the head portion 934A. In such embodiments, the fastener housing 932 may be disposed about at least a portion of the body portion 934B of the fastener member 934. The fastener housing 932 may have one or more apertures formed therethrough and at least a portion of the body portion 934B the fastener member 934 may be slidably displaceable through the aperture formed in the fastener housing 932. The rotatable member 936 may include an upper portion 936A that in the UNLATCHED position is disposed proximate the head portion 936A of the fastener member 934 and in the LATCHED position is disposed remote from the head portion of the fastener member 934.

The rotating member 936 rotates from a first "UNLATCHED" position in which the rotating member 936 blocks access to the head of the fastener member 934 to a second "LATCHED" position in which the rotating member 936 does not block the head of the fastener member 934 and engages one or more surface features coupled to the substrate 920 to pre-load the thermal solution 910 and one or more semiconductor devices (not visible in FIG. 9A) disposed beneath the thermal solution 910. Thus, the detent fastener 930 provides a dual benefit: first, by preloading the thermal solution 910, the detent fastener 930 limits the unequal forces or tilt imposed on the thermal solution 910 and semiconductor device, protecting the semiconductor device; second, the detent fastener 930 operates in a virtually foolproof manner by blocking access to the fastener member 934 when UNLATCHED (i.e., not engaged to the substrate surface feature) and permitting access to the fastener member 934 when LATCHED (i.e., engaged with the substrate surface feature).

In embodiments, the detent fastener 930 provides an eccentric or "cam" action that displaces the thermal solution 910 (and the attached semiconductor device) downward into a mating device such as socket coupled to the substrate 920. In embodiments, the dimensions and/or geometry of the rotating member 930 may be altered or adjusted to compensate for different thermal solution thicknesses, different semiconductor device standoff distances, different substrate surface feature designs or combinations thereof.

Turning next to FIG. 9B, the rotating member 936 coupled to the detent fastener 930 is rotated to the LATCHED position in which a portion of the rotating member 936 engages a surface feature 940 coupled to the substrate 920. As depicted in FIG. 9B, when the rotating member 936 is rotated to the LATCHED position, the upper portion of the rotating member 936 does not obstruct access to the head of the fastener member 934, thereby permitting the tightening of the fastener member 934 to the substrate 920.

Turning next to FIG. 9C, the rotating member 936 coupled to the detent fastener 930 is again rotated to the LATCHED position in which a portion of the rotating member 936 engages a surface feature 940 coupled to the substrate 920. As depicted in the FIG. 9C plan view, when the rotating member 936 is rotated to the LATCHED position, access to the head of the fastener member 934 is unimpeded, permitting the manual or autonomous tightening of the fastener member 934 to the substrate 920.

Turning to FIG. 9D, the rotating member 936 coupled to the detent fastener 930 is rotated to the UNLATCHED position in which the rotating member 936 does not engage a surface feature 940 coupled to the substrate 920. As depicted in the FIG. 9D plan view, when the rotating member 936 is rotated to the UNLATCHED position, access to the head of the fastener member 934 is blocked, thereby providing a visual indicator of the UNLATCHED condition of the respective detent fastener 930.

Figure 10A:
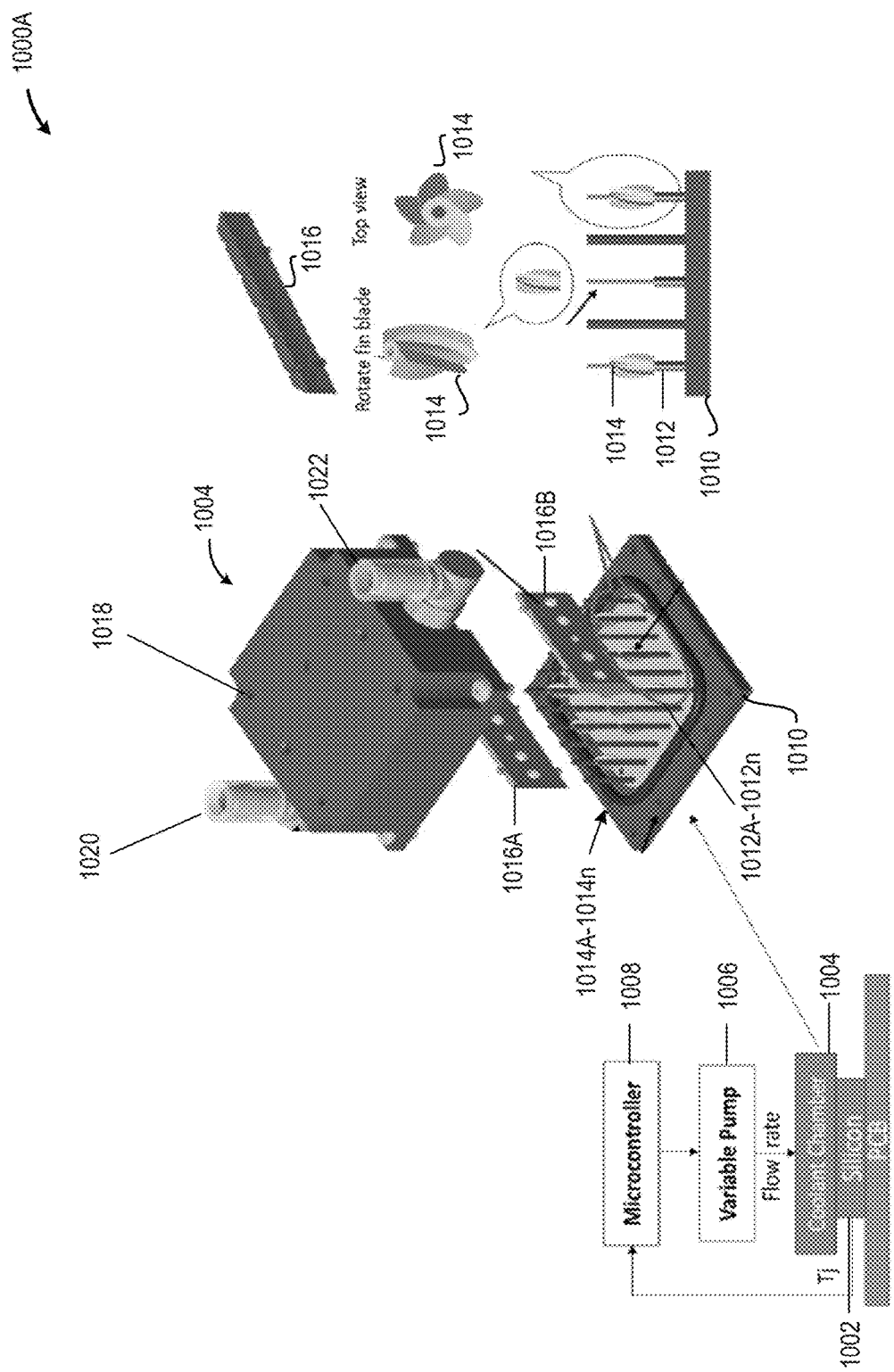
FIG. 10A is a perspective view of a thermal solution that includes a flow-through coolant chamber incorporating an internal distribution header, an internal collection header 1, a plurality of extended thermal members, and a plurality of turbulence elements disposed about at least a portion of the thermal members and, in which, the thermal solution thermally couples to one or more heat producing devices 1002, in accordance with at least one embodiment described herein.

FIG. 10A is a perspective view of a thermal solution 1000 that includes a flow-through coolant chamber 1004,which allows coolant to flow through the coolant chamber, incorporating an internal distribution header 1016A, an internal collection header 1016B, a plurality of extended thermal members 1012A-1012$n$ (collectively, "thermal members 1012"), and a plurality of turbulence elements 1014A-1014$n$ (collectively, "turbulence elements 1014") disposed about at least a portion of the thermal members 1012 and, in which, the thermal solution thermally couples to one or more heat-producing electronic devices 1002, in accordance with at least one embodiment described herein. As depicted in FIG. 10A, a microcontroller 1008 measures the temperature of the heat producing device 1002 and, using feedback control, adjusts the output of a variable flow device 1006 to provide a flow of coolant through the coolant chamber 1004 based, at least in part on the thermal output of the heat producing device 1002. IN other words, each of the turbulence elements or combinations thereof can be activated by the controller based on an optimal flow determined by the controller. In embodiments, control circuitry 1008 may receive one or more inputs that enable the control circuitry 1008 to predict the future thermal output of the heat producing device, thereby enabling feed forward control of the variable flow device 1006.

The coolant chamber 1004 includes a base member 1010 having a plurality of thermal members 1012 physically and thermally coupled thereto. Turbulence elements 1014 are coupled to each of at least some of the plurality of thermal members 1012. In embodiments, the turbulence elements 1014 may be rotatably coupled to each of at least some of the plurality of thermal members 1012. In operation, as coolant flows through the coolant chamber 1004, the turbulence elements 1014 promote the generation of a turbulent flow regime (i.g., Reynolds number greater than 4,000) across the base member 1010 and around the thermal members 1012, increasing the heat transfer coefficient of the thermal solution 1000 and improving the heat transfer between the heat-producing device 1002 and the coolant flowing through the coolant chamber 1004.

Generally, heat transfer within the thermal solution 1000 is given by the following equation:

$$q = UA\Delta T \qquad (1)$$

Where:
  q=Thermal energy transferred (e.g., BTU)
  U=Overall heat transfer coefficient (e.g., BTU/ft$^2$-° F.)
  A=Effective heat transfer area (e.g., ft$^2$)
  $\Delta$T=Logarithmic mean temperature difference (e.g., ° F.)

Thus, by placing the coolant flowing through the coolant chamber 1004 in the turbulent flow regime, the overall heat transfer coefficient (U) is effectively increased, particularly when compared to the overall heat transfer coefficient achievable using a laminar or transitional flow regime. The presence of turbulence elements 1014 disposed about the thermal members 1012 in the coolant chamber 1004 beneficially and advantageously improves the performance of the thermal solution.

The coolant may include one or more liquid coolants or one or more gaseous coolant. The variable output flow device 1006 may therefore include one or more pumps or similar devices when a liquid coolant is used and one or more positive displacement blowers or similar device s when a gaseous coolant is used. The control circuitry 1008 varies or adjusts the mass flow rate of coolant through the coolant chamber 1004 to maintain the temperature of the heat-producing electronic device 1002 a temperature setpoint or within a defined temperature range. In embodiments, the control circuitry 1008 may receive one or more signals that include information indicative of the thermal output of the heat-producing electronic device 1002 (e.g., temperature data) and may employ a feedback control regime to control or otherwise adjust the temperature of the heat-producing electronic device 1002 at a defined value or within a defined range. In embodiments, the control circuitry 1008 may receive one or more signals that include information indicative of an expected further thermal output of the heat-producing electronic device 1002 (processor load data, GPU load data, etc.) and may employ an adaptive or feedforward control regime to control or otherwise adjust the temperature of the heat-producing electronic device 1002 at a defined value or within a defined range. In embodiments, the control circuitry 1008 alters or adjusts the coolant discharge mass flow rate provided by the variable output flow device 1006 to the coolant chamber 1004 using feedback control, feedforward control, or any combination thereof. Generally, the ability for the coolant to remove thermal energy from a system is given by the following equation:

$$q = \dot{m} C_p \Delta T \qquad (2)$$

Where:
  q=Thermal energy transferred (e.g., BTU)
  $\dot{m}$=Coolant mass flow rate (e.g., lb/min)
  $C_p$=Heat capacity of coolant (e.g., BTU/lb-° F.)
  $\Delta$T=Temperature change of coolant (e.g., ° F.)

Thus, by varying the coolant flow rate through the coolant chamber 1004, the control circuitry 1008 is able to increase or decrease the thermal energy removed from the coolant chamber 1004.

One or more coolant inlets 1020 receive the flow of coolant to the coolant chamber 1004. An internal distribution header 1016A distributes the coolant flow across the width of the coolant chamber 1004, thereby increasing the effective available heat transfer area of the thermal solution 1000, further improving the thermal performance of the thermal solution 1000. An internal collection header 1016B disposed within the chamber 1018 collects the coolant flowing across the base member and directs the cooling to one or more coolant outlets 1022. The coolant chamber 1004 includes a housing 1018 affixable to the base member 1010. One or more sealing devices, such as a gasket or "O"-ring provides a fluid tight seal between the base member 1010 and the housing 1018.

The base member 1010 and the plurality of thermal members 1012 may be fabricated using one or more thermally conductive materials, such as copper, a copper containing alloy, aluminum, an aluminum containing alloy, or combinations thereof. In embodiments, at least a portion of the thermal members 1012 may include a generally cylindrical member to receive a respective turbulence element 1014. In embodiments, at least a portion of the thermal members 1012 may include an extended heat transfer surface (e.g., a fin or similar structure).

In embodiments, each of the plurality of turbulence elements 1014A-1014n may include an aperture having a first diameter and each of the thermal members 1012 includes a shaft portion having a second diameter slightly smaller than the first diameter such that one or more turbulence elements may be disposed about the shaft portion of the thermal member 1012. In such embodiments, the one or more turbulence elements 1014 may rotate about the shaft portion of the thermal member 1012. In other embodiments, some or all of the turbulence elements 1014A-1014n may include one or more fins, vanes, or similar static elements to cause a turbulent coolant flow across the surface of the base member 1010.

The turbulence elements 1014A-1014n may be fabricated using one or more materials, such as one or more metallic materials and/or one or more polymeric materials. In at least some embodiments, the turbulence elements 1014 may be fabricated using one or more self-lubricating materials. In at least some embodiments, the turbulence elements 1014 may include polycarbonate turbulence elements 1014. In some embodiments, the turbulence elements 1014A-1014n may include impeller-type turbulence elements that include one or more blades, fins, or pitched elements coupled to a hub having an aperture formed therethrough.

The distribution header 1016A includes an inlet fluidly coupled to the one or more coolant inlets 1020 and one or more fluid outlets to disperse the flow of coolant across the surface of the base member 1010 and about the thermal members 1012. The collection header 1016B includes a plurality of fluid inlets to receive the flow of coolant from across the base member 1010 and thermal members 1012 and one or more outlets fluidly coupled to the one or more coolant outlets 1022.

Figure 10B:
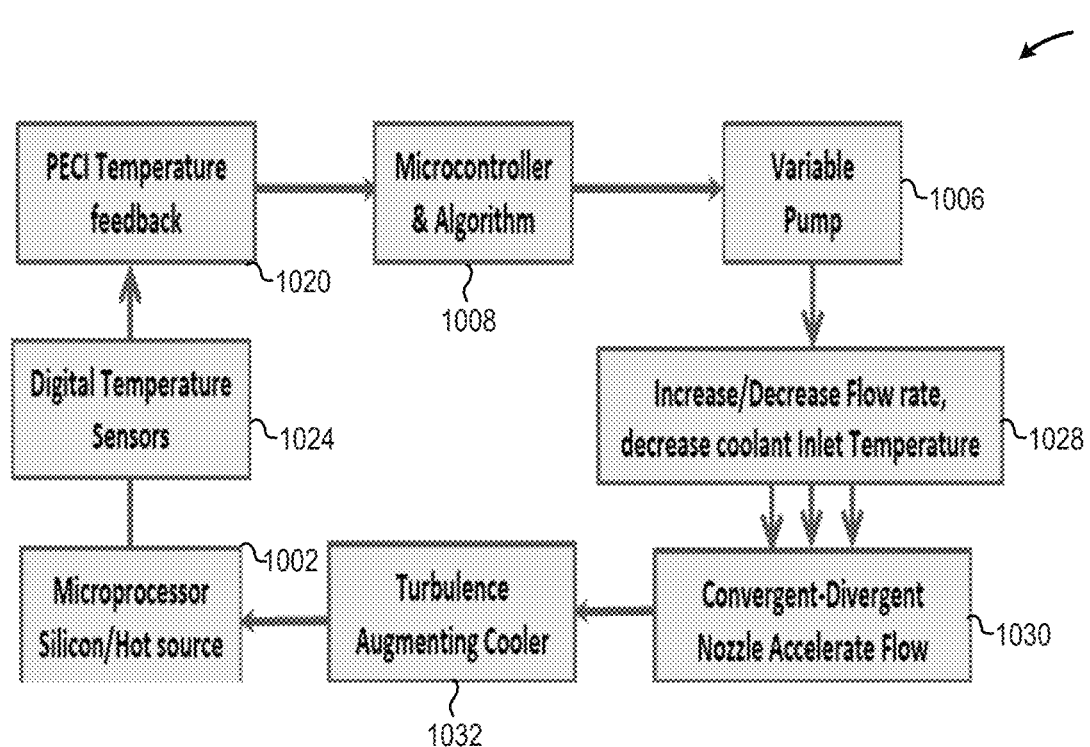
FIG. 10B is a flow diagram of an illustrative method of cooling a heat producing device using a thermal solution such as described in detail in FIG. 10A, in accordance with at least one embodiment described herein.

FIG. 10B is a flow diagram of an illustrative method 1000B of cooling a heat producing device 1002 using a thermal solution 1000 such as described in detail in FIG. 10A, in accordance with at least one embodiment described herein. As depicted in FIG. 10B, the heat-producing device 1002 generates a thermal output. In embodiments, the thermal output of the heat-producing device 1002 may be based upon and/or proportionate to a computational load or demand placed upon the heat-producing device 1002. One or more thermal sensors 1024, such as one or more thermocouples, resistive thermal devices, or thermistors may be used to measure or otherwise sense one or more parameters indicative of the heat generated or otherwise emitted by the heat-producing device 1002. In embodiment, the one or more thermal sensors 1024 may generate an output signal 1026 that includes a digital representation of the temperature of the heat-producing device 1002. In other embodiments, the one or more thermal sensors 1024 may generate an analog output signal 1026 representative of the temperature of the heat-producing device 1002. In such embodiments, one or more analog to digital (A/D) converters may convert the analog output signal may be converted to a signal containing a digital representation of the temperature of the heat-producing device 1002.

The control circuitry 1008 receives, as an input, the one or more output signals 1026 generated by the one or more sensors 1024. The control circuitry 1008 applies one or more control algorithms and, using the one or more output signals 1026 generated by the one or more sensors 1024, generates a control output signal that is used to control the flow of coolant provided by the variable flow device 1006 through the coolant chamber 1004. The flow of coolant provided by the variable flow device 1006 may be controlled 1028 to maintain the temperature of the heat-producing device 1002 at a desired temperature or within a desired temperature range. The variable flow device 1006 discharges coolant to the distribution header 1016A disposed in the thermal solution 1000. The coolant exits the distribution header 1030 via one or more convergent/divergent nozzles 1030 that fluidly couple the distribution header 1030 to the internal space of the coolant chamber 1004. The turbulence elements 1014 disposed about and/or coupled to at least a portion of the thermal members 1012 cause the coolant to flow through the coolant chamber 1004 in a turbulent flow regime, thereby beneficially improving the heat transfer between the heat-producing device 1002 and the coolant.

Figure 10C:
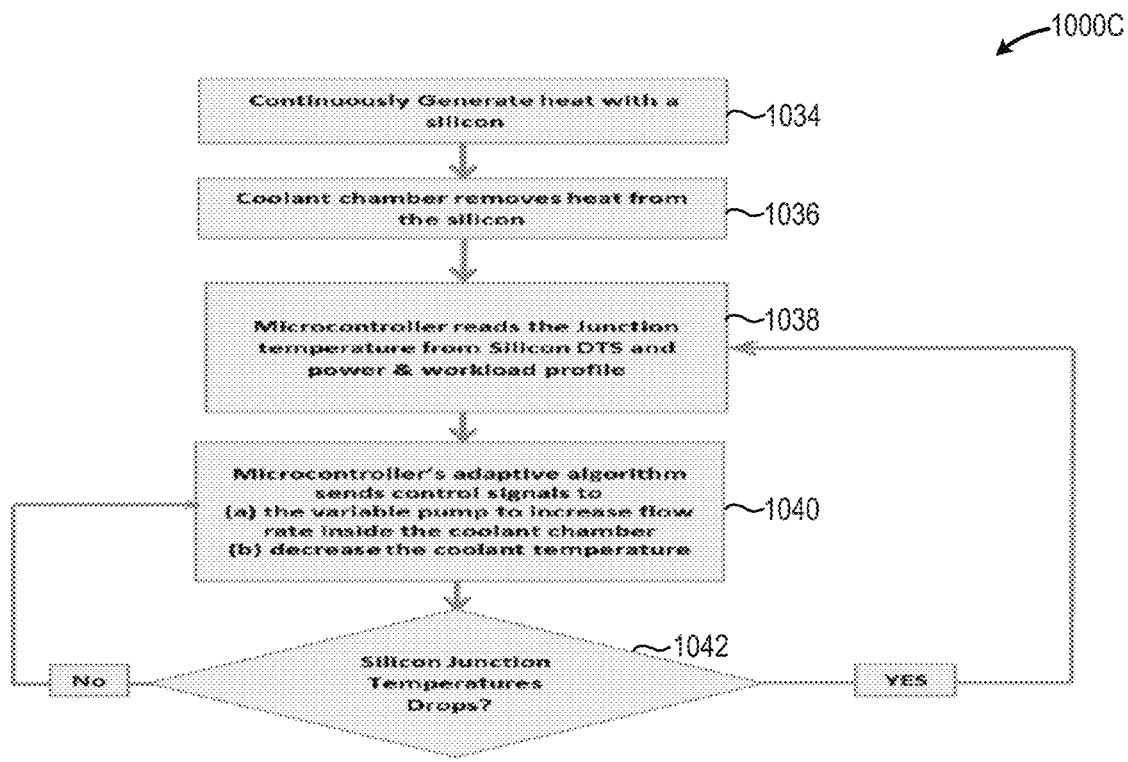
FIG. 10C is a flow diagram of an illustrative method of cooling a heat-producing device with a thermally coupled thermal solution such as described in FIG. 10A, in accordance with at least one embodiment described herein.

FIG. 10C is a flow diagram of an illustrative method 1000C of cooling a heat-producing device 1002 with a thermally coupled thermal solution 1000 such as described in FIG. 10A, in accordance with at least one embodiment described herein. As depicted in FIG. 10C, at 1034, a heat-producing device 1002 generates heat when in operation. At 1036, the thermal solution 1000 removes at least a portion of the thermal energy/heat emitted, generated, or otherwise produced by the heat-producing device 1002. At 1038, the control circuitry 1008 receives one or more signals that include data and/or information indicative of the temperature of the heat-producing device 1002. In embodiments, the control circuitry 1008 receives information and/or data representative of a projected or forecasted duty (e.g., work load) placed upon the heat-producing device 1002.

At 1040, using the measured temperature and the forecasted or projected duty placed upon the heat-producing device 1002, the control circuitry 1008 applies one or more control algorithms to generate one or more output signals used to control the flow of coolant provided by the variable flow device 1006 to the coolant chamber 1004. In embodiments, the control circuitry 1008 may alter or adjust the temperature of the coolant flowing to the coolant chamber 1004, for example by controlling one or more coolers or chillers capable of reducing the temperature of the coolant.

At 1042 the control circuitry 1008 determines whether the temperature of the heat-producing device 1002 is at a defined temperature or within a defined temperature range. If the temperature is at the defined temperature or within the defined temperature range, the control circuitry 1008 continues monitoring the temperature of the heat-producing device at 1038. If the temperature is not at the defined temperature or within the defined temperature range, the control circuitry 1008 alters and/or adjusts the at least one of: the flow of coolant provided to the cooling chamber 1004 by the variable flow device 1006 and/or the temperature of the coolant at 1040.

Figure 10D:
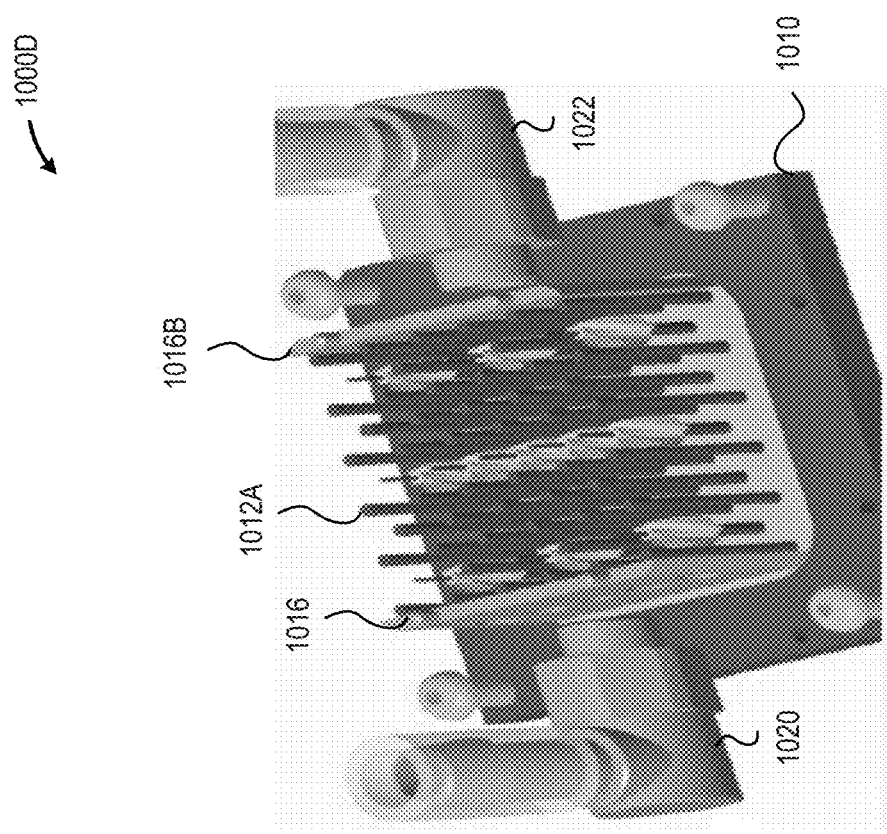
FIG. 10D is a perspective view of an illustrative turbulence element and an illustrative thermal solution, in accordance with at least one embodiment described herein.
Figure 10D:
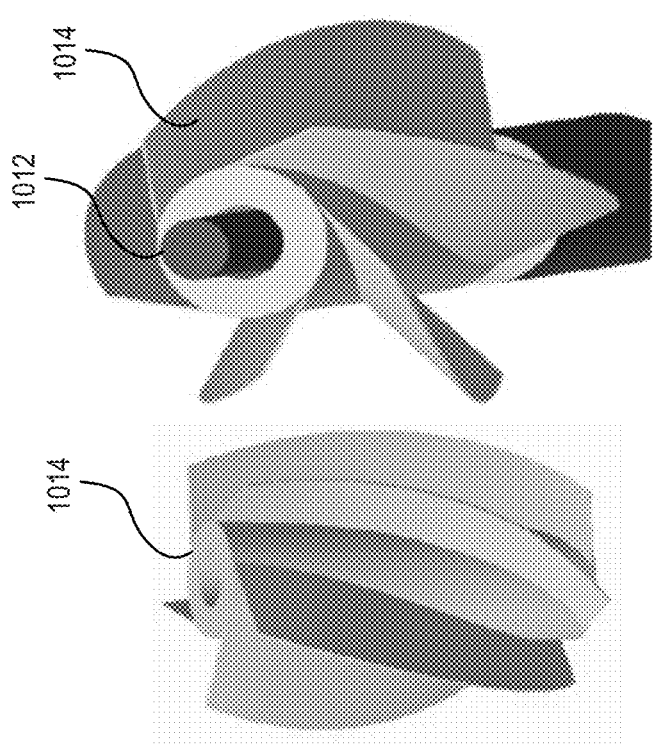

FIG. 10D is a perspective view of an illustrative turbulence element 1014 and an illustrative thermal solution 1000D, in accordance with at least one embodiment described herein. As depicted in FIG. 10D, the turbulence element 1014 may include a rotatable element, such as an impeller having any number of fins, airfoils, blades or similar static or dynamic elements sufficient to impart turbulence that are affixed to a hub and capable of causing or otherwise creating turbulence in a liquid or gaseous coolant flowing past the turbulence element 1014. Also as depicted in FIG. 10D, the hub of each of the turbulence elements 1014 may include an aperture or similar void space to accommodate the passage of at least a portion of the shaft of the thermal member 1012 extending from the base member 1010.

Figure 10E:
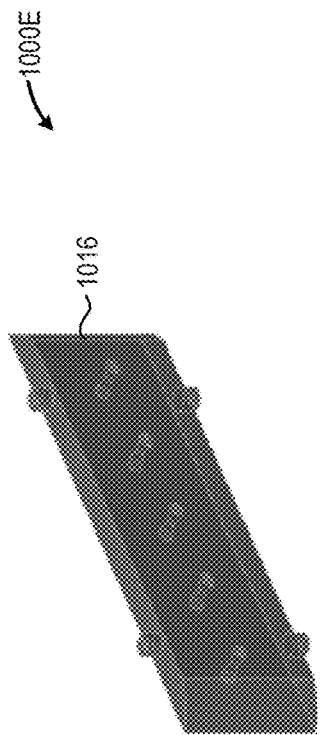
FIG. 10E is a perspective view of an illustrative distribution header and/or collection header, in accordance with at least one embodiment described herein.

FIG. 10E is a perspective view of an illustrative distribution header 1016A and/or collection header 1016B (collectively, "headers 1016"), in accordance with at least one embodiment described herein. As depicted in FIG. 10E, each of the headers 1016 includes a vessel or housing that encloses a plenum portion 1044. In embodiments, the distribution header 1016A and the collection header 1016B are structurally identical and, thus, coolant flow through the thermal solution 1000 is reversible (i.e., the coolant inlet 1020 may serve as the coolant outlet 1022 and vice versa). Each of the headers 1016 includes a plurality of nozzles 1046A-1046n (collectively, "nozzles 1046") that fluidly couple the plenum 1044 to the interior space of the coolant chamber 1004. In embodiments, the nozzles 1046 may include one or more convergent/divergent fluid nozzles having an intermediate tapered portion that is smaller in diameter than the inlet and outlet portions of the respective nozzle 1046. In some embodiments, the nozzles 1046A-1046n may be the same size and/or fluid capacity. In other embodiments, one or more of the nozzles 1046A-1046n may be of different sizes or fluid capacities. For example, in some embodiments, fluid nozzles 1046 positioned in the middle of the plenum 1044 may have a smaller fluid capacity than the fluid nozzles positioned proximate the "ends" of the plenum 1044. Such a nozzle arrangement beneficially assists in evening the flow of coolant across the width of the base member 1010.

In embodiments, the thermal solution 1000 may be selected based upon the expected maximum thermal load presented by the heat-producing device 1002. The fluid nozzles 1046 may then be selected to achieve a desired liquid or gaseous coolant flow rate through the thermal solution 1000 to maintain the heat-producing device 1002 at a desired and/or stable temperature.

Figure 10G:
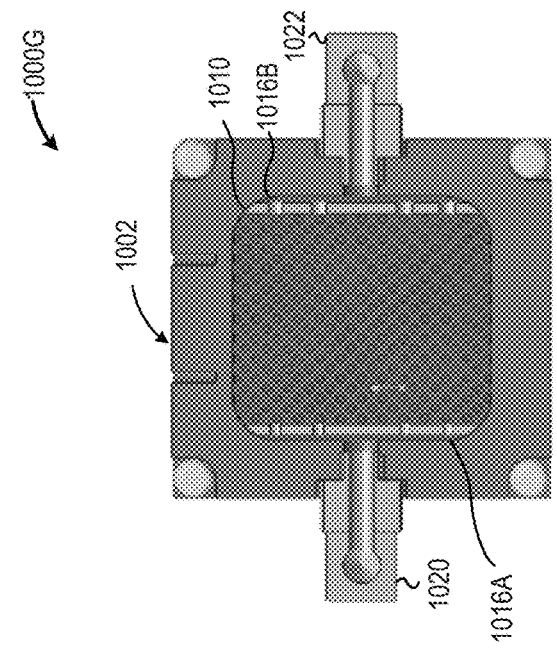
FIG. 10G is a plan view of an illustrative thermal solution that includes a base member, a plurality of thermal members physically and thermally coupled to the base member, turbulence elements disposed about at least a portion of the thermal members, in accordance with at least one embodiment described herein.
Figure 10F:
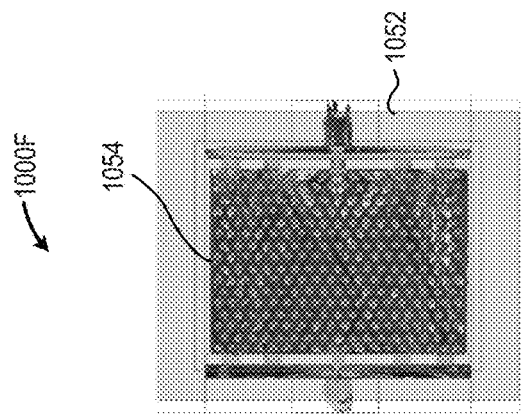
FIG. 10F is a hypothetical model depicting a comparison of coolant flow through a thermal solution without distribution and collection headers and coolant flow through a thermal solution equipped with distribution and collection headers, in accordance with at least one embodiment described herein.
Figure 10F:
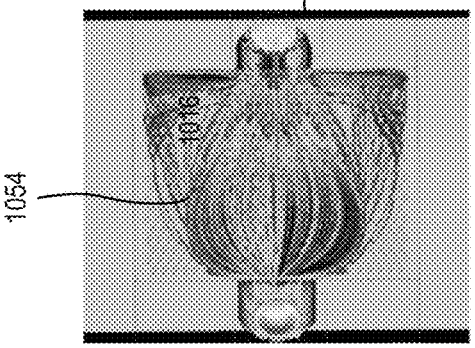

FIG. 10F is a hypothetical model depicting a comparison of coolant flow 1054 through a thermal solution 1050 without distribution and collection headers 1016 and coolant flow 1054 through a thermal solution 1052 equipped with distribution and collection headers 1016, in accordance with at least one embodiment described herein. Coolant flow 1054 through a thermal solution 1052 without distribution and collection headers 1016 preferentially flows through the portion of the coolant chamber 1004 proximate the fluid inlet 1020 to the coolant chamber 1004, limiting the effectiveness or at least a portion of the base member 1010 and thermal members 1012A-1012n, compromising the efficiency of the thermal solution 1050. In contrast, turbulence elements 1014 are selected or controlled to redefine the flow through the coolant chamber such that coolant flow 1054 through a thermal solution 1052 with distribution and collection headers 1016 results in a generally more even or uniform distribution of coolant across the base member 1010 and thermal members 1012A-1012n, improving the efficiency of the thermal solution 1052.

FIG. 10G is a plan view of an illustrative thermal solution 1000G that includes a base member 1010, a plurality of thermal members 1012A-1012n physically and thermally coupled to the base member 1010, turbulence elements 1014A-1014n disposed about at least a portion of the thermal members 1012A-1012n, in accordance with at least one embodiment described herein. As depicted in FIG. 10G, coolant enters the fluid inlet connection 1020 and flows into the coolant distribution header 1016A. Coolant exits from the plenum 1044 of the distribution header 1016A via each of the plurality of nozzles 1046. Coolant flows across the base member 1010 and about the thermal members 1012 physically and thermally coupled to the base member 1010. Turbulence elements 1014 on some or all of the thermal members 1012 cause the coolant to flow through the coolant chamber 1004 in a turbulent flow regime, beneficially improving the heat transfer between the heat-producing device 1002 and the coolant flowing through the coolant chamber 1004. Coolant flows into plenum 1044 the collection header 1016B via each of the plurality of nozzles 1046 and exits the plenum 1044 of the collection header 1016B via the fluid outlet 1022.

Figure 10H:
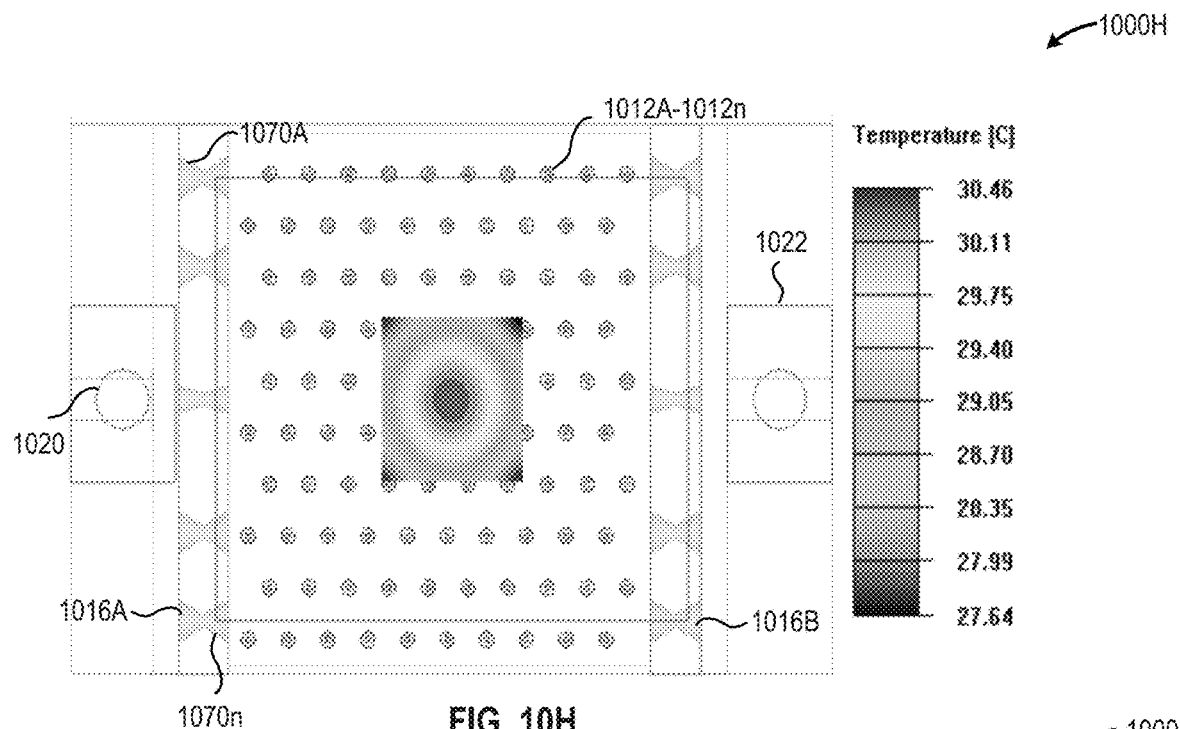
FIG. 10H is a plan view of an illustrative thermal solution that illustrates the thermal distribution of a heat-producing device disposed proximate the base member of the thermal solution and also depicts the relative sizes and/or locations of a plurality of convergent/divergent nozzles disposed in the distribution header and the collection header, in accordance with at least one embodiment described herein.

FIG. 10H is a plan view of an illustrative thermal solution 1000H that illustrates the thermal distribution of a heat-producing device disposed proximate the base member 1010 of the thermal solution 1000H and also depicts the relative sizes and/or locations of a plurality of convergent/divergent nozzles 1070A-1070n disposed in the distribution header 1016A and the collection header 1016B, in accordance with at least one embodiment described herein. As depicted in FIG. 10G, the convergent/divergent nozzles may be configured such that the one or more convergent/divergent nozzles 1070 disposed in the center of the distribution header 1016A and the one or more convergent/divergent nozzles 1070 disposed in the center portion of the collection header 1016B may be sized to pass a lesser volume of coolant than those convergent/divergent nozzles positioned toward the periphery of the distribution header 1016A and the collection header 1016B.

Also as depicted in FIG. 10H, at least a portion of the side surface and the upper surface of each of the distribution header 1016A and the collection header 1016B are disposed proximate the inner surface of the housing 1018 when the housing is affixed to the base member 1010. Thus, the coolant flowing into the housing 1018 flows into a distribution plenum portion 1072A formed by the inner surfaces of the housing 1018 and the distribution header 1016A. Coolant exits the distribution plenum portion via the convergent/divergent nozzles 1070A-1070n disposed in the distribution header 1016A. Similarly, coolant exits the thermal solution 1000I by first flowing across, about, and around the thermal members 1012A-1012n and turbulence elements 1014A-1014n and enters a collection plenum portion 1072B formed by the inner surfaces of the housing 1018 and the collection header 1016B via the convergent/divergent nozzles 1070A-1070n disposed in the collection header 1016B.

Figure 10I:
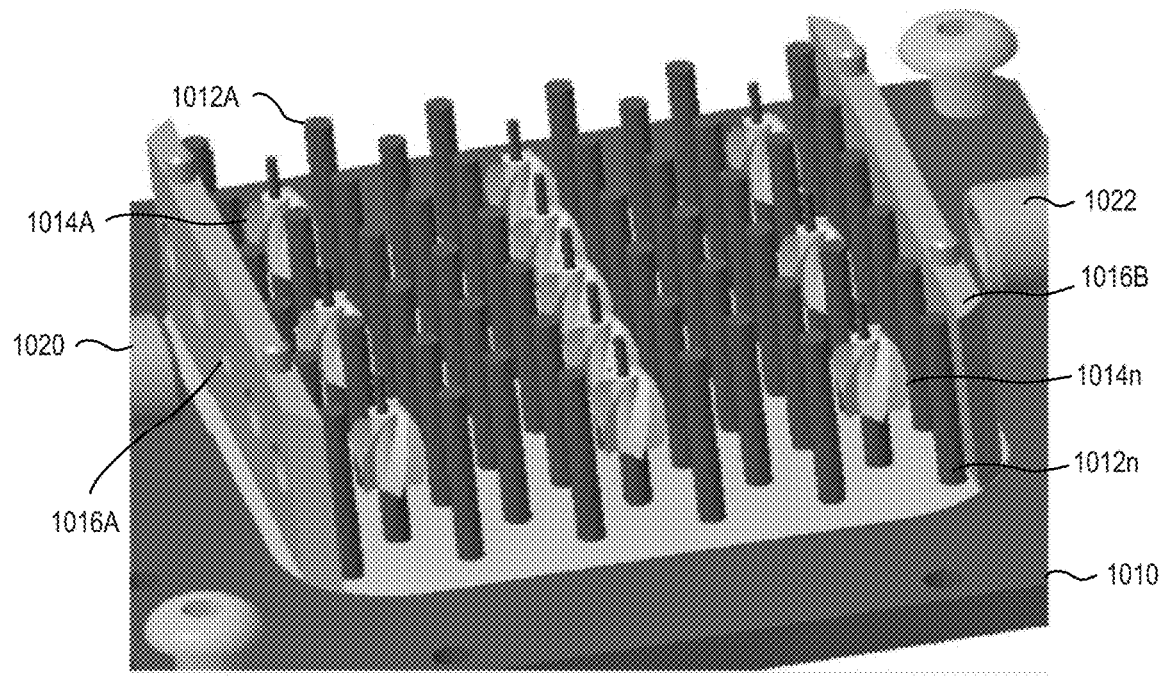
FIG. 10I is a perspective view of an illustrative thermal solution that include a plurality of turbulence elements disposed on at least a portion of the thermal members, in accordance with at least one embodiment described herein.

FIG. 10I is a perspective view of another illustrative thermal solution 1000I that include a plurality of turbulence elements 1014A-1014n disposed on at least a portion of the thermal members 1012A-1012n, in accordance with at least one embodiment described herein. Here the turbulence elements are selected different from previous figures according to another optimal configuration that creates the desired coolant flow through the coolant chamber. As depicted in FIG. 10I, coolant flows into the distribution plenum portion 1072A, flows through the convergent/divergent nozzles 1070A-1070n disposed in the distribution header 1016A and into the portion of the housing 1018 disposed about the thermal members 1012A-1012n and turbulence elements 1014A-1014n. Coolant exits the portion of the housing 1018 disposed about the thermal members 1012A-1012n and turbulence elements 1014A-1014n by flowing through the plurality of nozzles 1070A-1070n disposed in the collection header 1016B and into the collection plenum portion 1072B.

As used in this application and in the claims, a list of items joined by the term "and/or" can mean any combination of the listed items. For example, the phrase "A, B and/or C" can mean A; B; C; A and B; A and C; B and C; or A, B and C.

As used in this application and in the claims, a list of items joined by the term "at least one of" can mean any combination of the listed terms. For example, the phrases "at least one of A, B or C" can mean A; B; C; A and B; A and C; B and C; or A, B and C.

As used herein processor-based devices, such as data servers, may include a network interface that can use embodiments or be used by embodiments. For example, data received from a network that is encoded, network interface can use a decoder that speculatively decodes one or more groups of tokens. Network interface can include transceiver, processors, transmit queue, receive queue, memory, and bus interface, and DMA engine. Transceiver can be capable of receiving and transmitting packets in conformance with the applicable protocols such as Ethernet as described in IEEE 802.3, although other protocols may be used. Transceiver can receive and transmit packets from and to a network via a network medium (not depicted). Transceiver can include physical layer (PHY) circuitry and media access control (MAC) circuitry. PHY circuitry can include encoding and decoding circuitry (not shown) to encode and decode data packets according to applicable physical layer specifications or standards. MAC circuitry can be configured to assemble data to be transmitted into packets, that include destination and source addresses along with network control information and error detection hash values. MAC circuitry can be configured to process MAC headers of received packets by verifying data integrity, removing preambles and padding, and providing packet content for processing by higher layers.

Processors can be any a combination of a: processor, core, graphics processing unit (GPU), field programmable gate array (FPGA), application specific integrated circuit (ASIC), or other programmable hardware device that allow programming of network interface. For example, processors can provide for allocation or deallocation of intermediate queues. For example, a "smart network interface" can provide packet processing capabilities in the network interface using processors.

Packet allocator can provide distribution of received packets for processing by multiple CPUs or cores using timeslot allocation described herein or RSS. When packet allocator uses RSS, packet allocator can calculate a hash or make another determination based on contents of a received packet to determine which CPU or core is to process a packet.

Interrupt coalesce can perform interrupt moderation whereby network interface interrupt coalesce waits for multiple packets to arrive, or for a time-out to expire, before generating an interrupt to host system to process received packet(s). Receive Segment Coalescing (RSC) can be performed by network interface whereby portions of incoming packets are combined into segments of a packet. Network interface provides this coalesced packet to an application.

Direct memory access (DMA) engine can copy a packet header, packet payload, and/or descriptor directly from host memory to the network interface or vice versa, instead of copying the packet to an intermediate buffer at the host and then using another copy operation from the intermediate buffer to the destination buffer.

Memory can be any type of volatile or non-volatile memory device and can store any queue or instructions used to program network interface. Transmit queue can include data or references to data for transmission by network interface. Receive queue can include data or references to data that was received by network interface from a network. Descriptor queues can include descriptors that reference data or packets in transmit queue or receive queue. Bus interface can provide an interface with host device (not depicted). For example, bus interface can be compatible with peripheral connect Peripheral Component Interconnect (PCI), PCI Express, PCI-x, Serial ATA (SATA), and/or Universal Serial Bus (USB) compatible interface (although other interconnection standards may be used).

Decoding engine can apply in-order or sequential decoding of data received by network interface as well as speculative decoding of data received by network interface where an applied discard window is selected based on a chosen offset between a token position decoded by in-order or sequential decoding and a token position decoded by speculative decoding. The chosen offset can be selected to fill a speculative decoded buffer but not overfill the buffer.

Processor-based systems, such as servers, can use embodiments described herein to provide data to or from the system to another device through a mesh or fabric. System includes processor, which provides processing, operation management, and execution of instructions for system. Processor can include any type of microprocessor, central processing unit (CPU), graphics processing unit (GPU), processing core, or other processing hardware to provide processing for system, or a combination of processors. Processor controls the overall operation of system, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system includes interface coupled to processor, which can represent a higher speed interface or a high throughput interface for system components that needs higher bandwidth connections, such as memory subsystem or graphics interface components, or accelerators. Interface represents an interface circuit, which can be a standalone component or integrated onto a processor die. Where present, graphics interface interfaces to graphics components for providing a visual display to a user of system. In one example, graphics interface can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface generates a display based on data stored in memory 1030 or based on operations executed by processor or both. In one example, graphics interface generates a display based on data stored in memory or based on operations executed by processor or both.

Accelerators can be a fixed function offload engine that can be accessed or used by a processor. For example, an accelerator among accelerators can provide sequential and speculative decoding operations in a manner described herein, compression (DC) capability, cryptography services such as public key encryption (PKE), cipher, hash/authentication capabilities, decryption, or other capabilities or services. In some embodiments, in addition or alternatively, an accelerator among accelerators provides field select controller capabilities as described herein. In some cases, accelerators can be integrated into a CPU socket (e.g., a connector to a motherboard or circuit board that includes a CPU and provides an electrical interface with the CPU). For example, accelerators can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem represents the main memory of system and provides storage for code to be executed by processor, or data values to be used in executing a routine. Memory subsystem can include one or more memory devices such as read-only memory (ROM), flash memory, one or more varieties of random access memory (RAM) such as DRAM, or other memory devices, or a combination of such devices. Memory stores and hosts, among other things, operating system (OS) to provide a software platform for execution of instructions in system. Additionally, applications can execute on the software platform of OS from memory. Applications represent programs that have their own operational logic to perform execution of one or more functions. Processes represent agents or routines that provide auxiliary functions to OS or one or more applications or a combination. OS, applications, and processes provide software logic to provide functions for system. In one example, memory subsystem includes memory controller, which is a memory controller to generate and issue commands to memory. It will be understood that memory controller could be a physical part of processor or a physical part of interface. For example, memory controller can be an integrated memory controller, integrated onto a circuit with processor.

While not specifically illustrated, it will be understood that system can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system includes interface, which can be coupled to interface. In one example, interface represents an interface circuit, which can include standalone components and integrated circuitry. In one example, multiple user interface components or peripheral components, or both, couple to interface. Network interface provides system the ability to communicate with remote devices (e.g., servers or other computing devices) over one or more networks. Network interface can include an Ethernet adapter, wireless interconnection components, cellular network interconnection components, USB (universal serial bus), or other wired or wireless standards-based or proprietary interfaces. Network interface can transmit data to a device that is in the same data center or rack or a remote device, which can include sending data stored in memory. Network interface can receive data from a remote device, which can include storing received data into memory. Various embodiments can be used in connection with network interface, processor, and memory subsystem.

In one example, system includes one or more input/output (I/O) interface(s). I/O interface can include one or more interface components through which a user interacts with system (e.g., audio, alphanumeric, tactile/touch, or other interfacing). Peripheral interface can include any hardware interface not specifically mentioned above. Peripherals refer generally to devices that connect dependently to system. A dependent connection is one where system provides the software platform or hardware platform or both on which operation executes, and with which a user interacts.

In one example, system includes storage subsystem to store data in a nonvolatile manner In one example, in certain system implementations, at least certain components of storage can overlap with components of memory subsystem. Storage subsystem includes storage device(s), which can be or include any conventional medium for storing large amounts of data in a nonvolatile manner, such as one or more magnetic, solid state, or optical based disks, or a combination. Storage holds code or instructions and data in a persistent state (i.e., the value is retained despite interruption of power to the processor-based system). Storage can be generically considered to be a "memory," although memory is typically the executing or operating memory to provide instructions to processor. Whereas storage is nonvolatile, memory can include volatile memory (i.e., the value or state of the data is indeterminate if power is interrupted to the processor-based system). In one example, storage subsystem includes controller to interface with storage. In one example controller is a physical part of interface or processor or can include circuits or logic in both processor and interface.

A volatile memory is memory whose state (and therefore the data stored in it) is indeterminate if power is interrupted to the device. Dynamic volatile memory can involve refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of the processor-based system. More specifically, power source typically interfaces to one or multiple power supplies in processor-based system to provide power to the components of processor-based system. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, processor-based system can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade includes components common to conventional servers, including a main printed circuit board (main board) providing internal wiring (i.g., buses) for coupling appropriate integrated circuits (ICs) and other components mounted to the board.

A processor-based environment includes multiple computing racks, some including a Top of Rack (ToR) switch, a pod manager, and a plurality of pooled system drawers. Various embodiments can be used in a switch. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer, and Intel® ATOMTM pooled compute drawer, a pooled storage drawer, a pooled memory drawer, and a pooled I/O drawer. Some of the pooled system drawers is connected to ToR switch via a high-speed link, such as a 40 Gigabit/second (Gb/s) or 100 Gb/s Ethernet link or a 100+ Gb/s Silicon Photonics (SiPh) optical link. In one embodiment high-speed link comprises an 800 Gb/s SiPh optical link.

Multiple of the computing racks may be interconnected via their ToR switches (e.g., to a pod-level switch or data center switch), as illustrated by connections to a network. In some embodiments, groups of computing racks are managed as separate pods via pod manager(s). In one embodiment, a single pod manager is used to manage racks in the pod. Alternatively, distributed pod managers may be used for pod management operations.

Environment further includes a management interface that is used to manage various aspects of the environment. This includes managing rack configuration, with corresponding parameters stored as rack configuration data. As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices.

As used in any embodiment herein, the term "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of improving the thermal performance of processor-based devices. Such thermal performance improvement may include limiting the degree of tilt experienced by a semiconductor device as a thermal solution coupled to the semiconductor device is tightened to the substrate. Such thermal performance improvements may include increasing the available heat transfer area associated with a particular heat producing semiconductor device. Such thermal performance improvements may include thermally coupling one or more cool blocks thermally coupled to one or more remote heat-producing devices to a central cool block that may be cooled using a cooling medium or coupled to a central heat-producing semiconductor device.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for cooling one or more heat-producing components in a processor-based device.

According to example 1, there is provided an electronic device cooling system. The cooling system may include: a cold plate thermally and physically couplable to a first heat-producing semiconductor device; a thermal retention block member thermally and physically couplable to the cold plate; a remote device cooler block thermally and physically couplable to a second heat-producing device, the second heat-producing device disposed remote from the first heat-producing semiconductor device; and one or more thermal channels, each of the one or more thermal channels having a first end and a second end, the first end of each of the one or more thermal channels thermally coupled to the remote device cooler block and the second end of each of the one or more thermal channels thermally coupled to the thermal retention block member.

Example 2 may include elements of example 1 where the cold plate may include a liquid cooled cold plate having at least one fluid inlet and at least one fluid outlet.

Example 3 may include elements of any of examples 1 or 2 and the electronic device cooling system may further include: comprising one or more cold plate bracket members to physically couple the cold plate to a substrate that includes the first heat-producing semiconductor device.

Example 4 may include elements of any of examples 1 through 3 where the one or more cold plate bracket members may include at least one of: one or more aluminum cold plate bracket members; one or stainless steel cold plate bracket members.

Example 5 may include elements of any of examples 1 through 4 where the cold plate may include a copper cold plate having a plurality of microchannels to provide fluid flow across an upper surface of the copper cold plate.

Example 6 may include elements of any of examples 1 through 5 where the thermal retention block member is disposed proximate the upper surface of the cold plate; and where the first heat-producing semiconductor device is disposed proximate a lower surface of the cold plate.

Example 7 may include elements of any of examples 1 through 6 where the thermal retention block member forms at least a portion of one or more of the plurality of microchannels.

Example 8 may include elements of any of examples 1 through 7 where the one or more thermal channels may include one or more sealed heat pipes.

Example 9 may include elements of any of examples 1 through 8 where the cold plate is integrally formed with the thermal retention block member.

Example 10 may include elements of any of examples 1 through 9 and the electronic device cooling system may further include: a second remote device cooler block thermally and physically couplable to a third heat-producing device, the third heat-producing device disposed remote from the first heat-producing semiconductor device and the second heat-producing device; and one or more second thermal channels, each of the one or more second thermal channels having a first end and a second end, the first end of each of the one or more second thermal channels thermally coupled to the second remote device cooler block and the second end of each of the one or more thermal channels thermally coupled to the thermal retention block member.

According to example 11, there is provided a semiconductor device carrier apparatus. The apparatus may include: a frame member having an upper surface couplable to a thermal solution and a lower surface couplable to a heat-producing semiconductor device; where the frame member includes a plurality of apertures, each of the plurality of apertures to accommodate the passage of at least one fastener to couple the frame member to a substrate that includes the heat-producing semiconductor device; a plurality of short stopper members disposed on the lower surface of the frame member and about the periphery of the frame member; where each of the plurality of short stopper members includes a first material having a first durometer value; and a plurality of long stopper members disposed on the lower surface of the frame member and about the periphery of the frame member; wherein each of the plurality of long stopper members includes a second material having a second durometer value, the second durometer value less than the first durometer value.

Example 12 may include elements of example 11 where the frame member comprises a frame member having an upper surface couplable to a thermal solution that includes an extended surface heat sink.

Example 13 may include elements of any of examples 11 or 12 where the frame member further includes a plurality of thermal solution attachment features.

According to example 14, there is provided a thermal solution spring cell. The spring cell may include: a fastener head; a fastener body coupled to the fastener head that includes: an upper portion coupled to the fastener head, the upper portion including a cylindrical member having a first diameter; a lower portion coupled to the upper portion, the lower portion including: a cylindrical portion having a second diameter greater than the first diameter, to form a shoulder between the upper portion and the lower portion; and a groove to receive a clip member, the groove formed at least partially about the periphery of the lower cylindrical portion, the groove disposed proximate an end of the lower portion of the fastener body distal from the upper portion of the fastener body; a compressible element disposed proximate at least a portion of the upper portion of the fastener body; and a retaining ring to at least partially compress the compressible element about the upper portion of the fastener body and physically engage the shoulder between the upper portion of the fastener body and the lower portion of the fastener body.

Example 15 may include elements of example 14 and the spring cell may further include:
a spacer element disposed about at least a portion of the lower portion of the fastener body; and a clip member disposed at least partially within the groove to retain the spacer element between the retaining ring and the clip member.

Example 16 may include elements of any of examples 14 or 15 where the clip member may include at least one of: a E-Ring or a C-Clip.

Example 17 may include elements of any of examples 14 through 16 where the compressible element comprises a helical coil spring disposed about a periphery of at least a portion of the upper portion of the fastener body.

According to example 18, there is provided a central processing unit (CPU) backplate apparatus. The apparatus may include: a backplate to couple to a first surface of a printed circuit board opposite a CPU disposed on a second surface of the printed circuit board, the first surface transversely opposed across a thickness of the printed circuit board from the second surface; an extended heat transfer surface physically and thermally coupled to a first surface of the backplate, the first surface of the backplate transversely opposed across a thickness of the backplate from a second surface of the backplate, the second surface of the backplate proximate the first surface of the printed circuit board.

Example 19 may include elements of example 18 where the backplate comprises at least one of: a copper backplate, a copper containing alloy backplate, an aluminum backplate, or an aluminum containing backplate.

Example 20 may include elements of any of examples 18 or 19 where the extended heat transfer surface may include at least one of: a copper extended heat transfer surface, a copper containing alloy extended heat transfer surface, an aluminum extended heat transfer surface, or an aluminum alloy extended heat transfer surface.

Example 21 may include elements of any of examples 18 through 20 where the second surface of the backplate includes a recess to accommodate a voltage regulator disposed on the first surface of the printed circuit board.

According to example 22, there is provided a semiconductor device extended surface heat transfer apparatus. The heat transfer apparatus may include: a first extended surface heat transfer device that includes a baseplate having an upper surface and a lower surface and a plurality of fins physically and thermally coupled to the upper surface of the baseplate, the first extended surface heat transfer device having a first longitudinal axis; a thermally conductive rotatable mount having a first end and a second end, wherein the first end of the thermally conductive rotatable mount attaches to the upper surface of the baseplate of the first extended surface heat transfer device; and a second extended surface heat transfer device that includes a baseplate having an upper surface and a lower surface and a plurality of fins physically and thermally coupled to the upper surface of the baseplate, the second extended surface heat transfer device having a second longitudinal axis; wherein the second end of the thermally conductive rotatable mount attaches to the lower surface of the baseplate of the second extended surface heat transfer device; and wherein the thermally conductive rotatable mount permits the second longitudinal axis of the second extended surface heat transfer device to rotate through an angle of at least 90 degrees with respect to the first longitudinal axis of the first extended surface heat transfer device.

Example 23 may include elements of example 22 and the heat transfer apparatus may additionally include: a fixed pin set physically coupled to the upper surface of the baseplate of the first extended surface heat transfer device, the fixed pin set reversible positionable between a first position and a second position: where, in the first position, the second extended surface heat transfer device is fixed with respect to the first extended surface heat transfer device; and where, in the second position the second extended surface heat transfer device is rotatable with respect to the first extended surface heat transfer device.

Example 24 may include elements of any of examples 22 or 23 where the thermally conductive rotatable mount may include: a thermally conductive roller member rotatable with respect to the baseplate of the first extended surface heat transfer device and affixed to the baseplate of the second extended surface heat transfer device; a biasing element disposed about at least a portion of the thermally conductive roller member; wherein the biasing element biases the thermally conductive roller member toward the baseplate of the first extended surface heat transfer device; and a support sleeve disposed about at least a portion of the biasing element, the support sleeve affixed to the baseplate of the first extended surface heat transfer device; wherein the thermally conductive roller member is displaceable with respect to the support sleeve.

Example 25 may include elements of any of examples 22 through 24 where the fixed pin set may include: a pin member that includes a ridge disposed about the periphery of the pin member; a biasing element disposed about the pin member; and a support member disposed about the biasing element such that the biasing element is trapped between the ridge disposed about the periphery of the pin member and the support member; wherein a vertical displacement of the pin member compresses the biasing element.

According to example 26, there is provided a two-part, detachable heat sink system. The system may include: a first extended surface heat transfer device having a first heat transfer area, an upper surface, and a lower surface, the lower surface disposed proximate a heat-producing device coupled to a substrate; a thermal interface member thermally coupled to the upper surface of the first extended surface heat transfer device; a second extended surface heat transfer device having a second heat transfer area, an upper surface, and a lower surface, the lower surface, the second extended surface heat transfer device disposed proximate and thermally coupled to the thermal interface member; and one or more fasteners to detachably attach the second extended surface heat transfer device to the thermal interface member and to the first extended surface heat transfer device.

Example 27 may include elements of example 26 where the second heat transfer area is greater than or equal to the first heat transfer area.

Example 28 may include elements of any of examples 26 or 27 where the one or more fasteners comprise a plurality of spring and shoulder threaded fasteners.

Example 29 may include elements of any of examples 26 through 28 where the one or more fasteners comprise one or more clamping systems, each of the one or more clamping systems may include: a clamp member having a first end and an opposed second end; a first attachment fixture disposed proximate the first end of the clamp member, the first attachment fixture to couple to the first extended surface heat transfer device; and a second attachment fixture disposed proximate the second end of the clamp member, the first attachment fixture to couple to the first extended surface heat transfer device.

Example 30 may include elements of any of examples 26 through 29 where the one or more fasteners comprise at least one spring clip.

According to example 31, there is provided a thermal transfer system. The thermal transfer system may include: a distribution block including at least one cooling medium inlet to receive a cooling medium and at least one cooling medium outlet; a cold block physically and thermally couplable to a first heat-producing, board-mounted device, the cold block including at least one cooling medium inlet fluidly coupled to the at least one cooling medium outlet of the distribution block to receive the cooling medium from the distribution block; at least one remote cold block physically and thermally couplable to at least one heat producing board mounted device; and at least one thermal conduit having a first end and a second end, the first end thermally couplable to the distribution block and the second end thermally couplable to the remote cold block.

Example 32 may include elements of example 31 where the distribution block may include a distribution block physically and thermally couplable to a second heat-producing, board-mounted device.

Example 33 may include elements of any of examples 31 or 32 where the at least one thermal conduit may include at least one heat pipe.

Example 34 may include elements of any of examples 31 through 33 where the cold block may include a cold block disposed between the first heat-producing, board-mounted device and the distribution block.

According to example 35, there is provided a semiconductor die insertion system. The system may include: a pedestal member having a thickness, an upper surface, and a lower surface; at least one pin array that includes a plurality of pin members extending from the lower surface of the pedestal member, the at least one pin array disposed across at least a portion of the lower surface of the pedestal member; wherein each of the plurality of pin members extend a first distance from the lower surface of the pedestal member; and a pusher member having a upper surface and a lower surface, the pusher member including at least one extension member that projects a second distance from the lower surface of the pusher member; wherein the second distance is greater than the sum of the pedestal member thickness and the first distance.

Example 36 may include elements of example 35 where the extension member projects from at least a portion of a periphery of the pusher member.

Example 37 may include elements of any of examples 35 or 36 where the at least one pin array may include a plurality of pin arrays.

According to example 38, there is provided a thermal solution fastener. The fastener may include: a fastener member having a head portion and a body portion; a fastener housing disposed about at least a portion of the body portion of the fastener member, the fastener slidably displaceable through an aperture formed in the fastener housing; and a rotatable member rotatably coupled to the fastener housing, the rotatable member including: an upper portion that in a first position is disposed proximate the head portion of the fastener member and in a second position is disposed remote from the head portion of the fastener member; and a lower portion that in the first position disengages from a surface feature coupled to an upper surface of a substrate and in the second position engages the surface feature coupled to the upper surface of the substrate.

Example 39 may include elements of example 38 where the fastener housing further includes a plurality of pockets to receive a hinge portion of the rotatable member.

According to example 40, there is provided a thermal solution. The thermal solution may include: an enclosed chamber that includes: a thermally conductive lower surface to dispose proximate at least a portion of a surface of a heat-producing electronic component; at least one coolant inlet to receive a coolant flow; and at least one coolant outlet to discharge the received coolant flow; and a plurality of turbulence elements to cause a coolant flowing through the enclosed chamber to flow in a turbulent flow regime across at least a portion of the thermally conductive lower surface.

Example 41 may include elements of example 40 where the thermally conductive lower surface further includes: a plurality of thermal members thermally coupled to the thermally conductive lower surface, wherein the plurality of turbulence elements physically couple to at least a portion of the plurality of thermal members.

Example 42 may include elements of any of examples 40 or 41 where the plurality of turbulence elements include a plurality of thermally conductive turbulence elements.

Example 43 may include elements of any of examples 40 through 42 and the thermal solution may additionally include: a distribution header fluidly coupled to the at least one coolant inlet, the distribution header including at least one convergent/divergent nozzle.

Example 44 may include elements of any of examples 40 through 43 and the thermal solution may additionally include: a distribution header fluidly coupled to the at least one coolant inlet, the distribution header including: at least one convergent/divergent nozzle.

According to example 45, there is provided a thermal solution system. The system may include: at least one sensor to measure a thermal output of at least one heat-producing electronic component; a variable flow output fluid mover to discharge a coolant; an enclosed chamber that includes: a thermally conductive lower surface to dispose proximate at least a portion of a surface of a heat-producing electronic component; at least one coolant inlet to receive a coolant flow; and at least one coolant outlet to discharge the received coolant flow; and a plurality of turbulence elements to cause a coolant flowing through the enclosed chamber to flow in a turbulent flow regime across at least a portion of the thermally conductive lower surface; and control circuitry communicatively coupled to the at least one sensor and the variable flow output fluid mover, the control circuitry to: adjust the coolant flow provided by the variable flow output fluid mover based on the thermal output of the at least one heat-producing electronic component.

Example 46 may include elements of example 45 and the control circuitry may further: receive data representative of a future expected computational load on the at least one heat-producing electronic component; and adjust the coolant flow provided by the variable flow output fluid mover based on the future expected computational load on the at least one heat-producing electronic component.

Example 47 may include elements of any of examples 45 or 46 where the thermally conductive lower surface further includes: a plurality of thermal members thermally coupled to the thermally conductive lower surface, wherein the plurality of turbulence elements physically couple to at least a portion of the plurality of thermal members.

Example 48 may include elements of any of examples 45 through 47 where the thermally conductive lower surface further includes: a plurality of thermally conductive turbulence elements.

Example 49 may include elements of any of examples 45 through 48 and the system may further include: a distribution header fluidly coupled to the at least one coolant inlet, the distribution header including: at least one convergent/divergent nozzle.

Example 50 may include elements of any of examples 45 through 49 and the system may further include: a distribution header fluidly coupled to the at least one coolant inlet, the distribution header including: at least one convergent/divergent nozzle.

According to example 51, there is provided a method for cooling a heat producing electronic device. The method may include: receiving, from at least one sensor by control circuitry, data representative of a thermal output of at least one heat-producing electronic component; distributing via one or more nozzles a coolant flow through an enclosed chamber thermally coupled to the heat-producing electronic device; adjusting, by control circuitry, a coolant flow rate through the enclosed chamber; and causing the coolant flow through the enclosed chamber to flow in a turbulent flow regime.

Example 52 may include elements of example 51 and the method may further include: receiving, by the control circuitry, data representative of a future expected computational load on the at least one heat-producing electronic component; and adjusting, by the control circuitry, the coolant flow provided by the variable flow output fluid mover based on the future expected computational load on the at least one heat-producing electronic component.

Example 53 may include elements of any of examples 51 or 52 where distributing via one or more nozzles a coolant flow through an enclosed chamber thermally coupled to the heat-producing electronic device further includes: distributing via one or more convergent/divergent nozzles the coolant flow through the enclosed chamber.

Example 54 may include elements of any of examples 51 through 53 where causing the coolant flow through the enclosed chamber to flow in a turbulent flow regime further includes: causing the coolant flow through the enclosed chamber to flow in a turbulent flow regime using a plurality of turbulence elements physically coupled to at least a portion of a plurality of thermal members disposed in the enclosed chamber.

Example 55 may include elements of any of examples 51 through 54 where causing the coolant flow through the enclosed chamber to flow in a turbulent flow regime using a plurality of turbulence elements physically coupled to at least a portion of a plurality of thermal members further includes: causing the coolant flow through the enclosed chamber to flow in a turbulent flow regime using a plurality of turbulence elements rotatably, physically coupled to at least a portion of a plurality of thermal members.

According to example 56, there is provided a controller. The controller may include: an input/output interface; and control circuitry to: receive, from at least one sensor, data representative of a thermal output of at least one heat-producing electronic component; receive, via the I/O interface, data representative of a future expected computational load on the at least one heat-producing electronic component; and adjust, using a variable output fluid mover, a turbulent coolant flow rate through an enclosed chamber thermally coupled to a heat-producing electronic device based at least in part the received data representative of a thermal output of at least one heat-producing electronic component and the received data representative of a future expected computational load on the at least one heat-producing electronic component.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. A two-part, separable, heat sink system, comprising:
   a first heat sink having a first surface and a second surface, the first surface opposite the second surface, the second surface of the first heat sink thermally couplable to a thermally emissive device coupled to a substrate, the first heat sink including a plurality of fins;
   a second heat sink having a third surface and a fourth surface, the third surface opposite the fourth surface; and
   a thermal interface member to thermally couple the first heat sink to the second heat sink, the thermal interface member to be disposed betweeen the plurality of fins and the second heat sink, the thermal interface member to be on an opposite of the first heat sink as the substrate.

2. The two-part, separable, heat sink system of claim 1, wherein the plurality of fins is a first plurality of parallel fins to provide a first heat transfer area; and wherein the second heat sink inludes a second plurality of parallel fins to provide a second heat transnfer area.

3. The two-part, separable, heat sink system of claim 2, wherein the first heat transfer area is less than the second heat transfer area.

4. The two-part heat sink system of claim 2, wherein the first plurality of parallel fins are to be disposed parallel to the second plurality of parallel fins.

5. The two-part, separable, heat sink system of claim 2, wherein the first plurality of parallel fins are to be disposed perpendicular to the second plurality of parallel fins.

6. The two-part, separable, heat sink system of claim 1, further including at least one attachment feature to facilitate detachable coupling of the thermal interface member between the first heat sink and the second heat sink, wherein the at least one attachment feature includes at least one spring and shoulder threaded fastener.

7. The two-part, separable, heat sink system of claim 1, further including at least one attachment feature to facilitate detachable coupling of the thermal interface member between the first heat sink and the second heat sink, wherein the at least one attachment feature includes at least one spring clip.

8. The two-part, separable, heat sink system of claim 1, wherein the thermal interface member comprises a member having a member having a thermal conductivity greater than 200 Watts/meter-Kelvin (W/m-K).

9. The two-part, separable, heat sink system of claim 1, further including a controller including:
   an input/output interface; and
   control circuitry to:
      receive, from at least one sensor, data representative of a thermal output of at least one thermally emissive device;
      receive, via the input/output interface, data representative of a future expected computational load on the at least one thermally emissive device; and
      adjust, using a variable output fluid mover, a turbulent coolant flow rate through an enclosed chamber thermally coupled to the at least one thermally emissive device based at least in part on the received data representative of a thermal output of the at least one thermally emissive device and the received data representative of a future expected computational load on the at least one thermally emissive device.

10. A two-part, separable, heat sink system comprising:
a first heat sink having a first surface and a second surface, the first surface opposite the second surface, the second surface of the first heat sink thermally couplable to a thermally emissive device coupled to a substrate;
a second heat sink having a third surface and a fourth surface, the third surface opposite the fourth surface;
a thermal interface member to thermally couple the first heat sink to the second heat sink, the thermal interface member to be disposed between the first surface and the fourth surface, the thermal interface member to be on an opposite side of the first heat sink as the substrate; and
at least one attachment feature, the at least one attachment feature to detachably physically couple the thermal interface member between the first heat sink and the second heat sink, wherein the at least one attachment feature includes:
a clamp member having a central member, a first end, and a second end opposite the first end;
a first coupling fixture to be disposed proximate the first end of the clamp member, the first coupling fixture to phisically couple to a first location on the first heat sink; and
a second coupling fixture to be disposed proximate the second end of the clamp member, the second coupling fixture to physically couple to a second location on the first heat sink;
wherein the central member is to extend transversely across at least a portion of the second heat sink.

11. The two-part, separable, heat sink system of claim 10, wherein the first coupling fixture includes a first threaded fastener; and
wherein the second coupling fixture includes a second threaded fastener.

12. An electronic device, comprising:
a substrate;
processor circuitry coupled to the substrate;
a two-part, separable, heat sink system including:
a first heat sink having a first surface and a second surface, the first surface opposite the second surface, the second surface of the first heat sink thermally couplable to the processor circuitry with the first surface facing away from the processor circuitry, the first heat sink inluding a plurality of fins;
a second heat sink, the first heat sink to be disposed between the processor circuitry and the second heat sink; and
a thermal interface member to thermally couple the first heat sink to the second heat sink, the thermal interface member disposed between the plurality of fins and the second heat sink.

13. The electronic device of claim 12, wherein the plurality of fins is a first plurality of parallel fins to provide a first heat transfer area; and
wherein the second heat sink include a sedond plurality of parallel fins to provide a second heat transfer area.

14. The electronic device of claim 13, wherein the first heat transfer area is less than the second heat transfer area.

15. The electronic device of claim 13, wherein the first heat sink physically couples to the second heat sink such that the first plurality of paralle fins are disposed parallel to the second plurality of parallel fins.

16. The electronic device of claim 13, wherein the first heat sink physically couples to the second heat sink such that the first plurality of paralle fins are disposed perpendicular to the second plurality of parallel fins.

17. The electronic device of claim 12, further including at least one attachment feature, the at least one attachment feature to detachably physically couple the thermal interface member between the first heat sink and the second heat sink, wherein the at least one attachment feature includes at least one spring and shoulder threaded fastener.

18. The electronic device of claim 12, further including at least one attachment feature, the at least one attachment feature to detachably physically couple the thermal interface member between the first heat sink and the second heat sink, wherein the at least one attachment feature includes at least one spring clip.

19. The electronic device of claim 12, wherein the thermal interface member includes a member having a thermal conductivity greater than 200 Watts/meter-Kelvin (W/m-K).

20. An electronic device comprising:
a substrate;
processor circuitry coupled to the substrate;
a two-part, separable, heat sink system including:
a first heat sink having a first surface and a second surface, the first surface opposite the second surface, the second surface of the first heat sink thermally couplable to the processor circuitry with the first surface facing away from the processor circuitry;
a second heat sink, the first heat sink to be displsed between the processor circuitry and the second heat sink;
a thermal interface member to thermally couple the first heat sink to the second heat sink, the thermal interface member disposed proximate the first heat sink and the second heat sink; and
at least one attachment feature, the at least one attachment feature to detachably physically couple the thermal interface member between the first heat sink and the second heat sink, wherein the at least one attachment feature includes:
a clamp member having a central member, a first end, and a second end disposed at an end of the central member opposite the first end;
a first coupling fixture disposed proximate the first end of the clamp member, the first coupling fixture to physically couple to a first location on the first heat sink; and
a second coupling fixture disposed proximate the second end of the clamp member, the second coupling fixture to physically couple to a second location on the first heat sink;
wherein the central member extends thransversely across at least a portion of the second heat sink.

21. The electronic device of claim 20, wherein the first coupling fixture includes a threaded fastener; and
wherein the second coupling fixture includes a threaded fastener.

22. A semiconductor package cooling method, comprising:
thermally coupling a two-part, separable, heat sink system, to a thermally emissive device coupled to a substrate, wherein the two-part, separable, heat sink system includes:
a first heat sink having a first surface and a second surface, the first surface opposite the second surface, the second surface of the first heat sink thermally coupleable to a thermally emissive device coupled to a substrate, the first heat sink including a plurality of fins;

a second heat sink having a third surface and a fourth surface, the third surface opposite the fourth surface; and a thermal interface member to thermally couple the first heat sink to the second heat sink, ther thermal interface member to be disposed between the plurality of fins and the second heat sink, the thermal interface member to be on an opposite side of the first heat sink as the substrate.

\* \* \* \* \*

UNITED STATES PATENT AND TRADEMARK OFFICE
CERTIFICATE OF CORRECTION

PATENT NO. : 11,917,790 B2
APPLICATION NO. : 16/859202
DATED : February 27, 2024
INVENTOR(S) : Subrahmanyam et al.

Page 1 of 1

It is certified that error appears in the above-identified patent and that said Letters Patent is hereby corrected as shown below:

In the Claims

In Column 42, Claim 4, Line 31, insert --"separable"-- before heat sink.
In Column 43, Claim 13, Line 60, delete "sedond" and insert --"second"--.
In Column 43, Claim 13, Line 60, delete "include" and insert --"includes"--.
In Column 43, Claim 15, Line 66, delete "paralle" and insert --"parallel"--.
In Column 44, Claim 16, Line 3, delete "paralle" and insert --"parallel"--.
In Column 44, Claim 20, Line 53, delete "thransversely" and insert --"transversely"--.
In Column 44, Claim 21, Line 56, delete "threaded fastener" and insert --"first threaded fastener"--.
In Column 44, Claim 21, Line 57, delete "threaded fastener" and insert --"second threaded fastener"--.
In Column 45, Claim 22, Line 1, delete "coupleable" and insert --"couplable"--.
In Column 45, Claim 22, Line 1, delete "a thermally" and insert --"the thermally"--.
In Column 45, Claim 22, Line 2, delete "a substrate" and insert --"the substrate"--.
In Column 45, Claim 22, Line 8, delete "ther" and insert --"the"--.

Signed and Sealed this
Eighteenth Day of June, 2024

Katherine Kelly Vidal
*Director of the United States Patent and Trademark Office*